US008043980B2

(12) United States Patent
Kouvetakis et al.

(10) Patent No.: US 8,043,980 B2
(45) Date of Patent: Oct. 25, 2011

(54) METHODS FOR MAKING AND USING HALOSILYLGERMANES

(75) Inventors: John Kouvetakis, Mesa, AZ (US); Jesse Tice, Tempe, AZ (US); Yan-Yan Fang, Pujiang (CN)

(73) Assignee: Arizona Board of Regents, A Body Corporate Acting for and on Behalf of Arizona State University, Scottsdale, AZ (US)

( * ) Notice: Subject to any disclaimer, the term of this patent is extended or adjusted under 35 U.S.C. 154(b) by 31 days.

(21) Appl. No.: 12/594,250

(22) PCT Filed: Apr. 2, 2008

(86) PCT No.: PCT/US2008/059095
§ 371 (c)(1),
(2), (4) Date: Feb. 26, 2010

(87) PCT Pub. No.: WO2009/005862
PCT Pub. Date: Jan. 8, 2009

(65) Prior Publication Data
US 2010/0151666 A1 Jun. 17, 2010

Related U.S. Application Data

(60) Provisional application No. 60/909,505, filed on Apr. 2, 2007.

(51) Int. Cl.
*H01L 21/31* (2006.01)
(52) U.S. Cl. ............... 438/786; 438/933; 257/E21.182; 257/E21.26; 257/E31.046; 117/939; 117/940
(58) Field of Classification Search .................. 438/786, 438/793; 257/E21.182, E21.26, E31.046; 117/939, 940
See application file for complete search history.

(56) References Cited

U.S. PATENT DOCUMENTS

| 2,988,427 | A | 6/1961 | Jenker et al. |
| 4,777,023 | A | 10/1988 | Fieselmann et al. |
| 4,910,153 | A | 3/1990 | Dicksen et al. |
| 7,645,339 | B2 | 1/2010 | Singh et al. |
| 2004/0040493 | A1 | 3/2004 | Vineis et al. |
| 2004/0194703 | A1 | 10/2004 | Shenai-Khatkhate et al. |

FOREIGN PATENT DOCUMENTS

| WO | 2006/031240 A2 | 3/2006 |
| WO | 2006/031257 A2 | 3/2006 |

OTHER PUBLICATIONS

Chizmeshya, et al., J. Am. Chem. Soc. 2006, 128 (21), 6919-6930.
Gersten, et al., The Physics and Chemistry of Materials , John Wiley & Sons; New York, 2001, pp. 96-100.
Dutton, et al., Inorganic Chemistry, 1968, 7(9), pp. 1735-1739.
Lobreyer, T., Chem Ber, 1991, 124(11), 2405-2410.
Mackay, K.M., et al, J. Chem Soc, 1969, A, 2938.
Mooney, P. M.; et al. Annu. Rev. Mater. Sci. 2000, 30, 335.
Tromp, R. M.; et al. Annu. Rev. Mater. Sci. 2000, 30, 431.
Brunner, K., et al., Rep. Prog. Phys. 2002, 65(1), 27-72.
Kuo, Y-H; et al. Nature 2005, 437, 1334.
Bean, J, C; et al. J. Vac Sci. Technol. 1984, A 2(2), 436-440.
Greve, D.W., Mat. Sci. Eng., 1993, B18(1), 22-51.
Konig, U., et al., IEEE Electron Device Lett, 1993, 14(4), 205-207.
M. L. Lee, J. Appl. Phys. 2003, 94, 2590-2596.
R. Hamond, Electron. Lett. 1999, 35(18), 1590-1591.
Y. J. Mii, Appl. Phys. Lett., 1991, 59(13), 1611-1613.
P. M. Mooney, Appl. Phys. Lett., 1995, 67(16), 2373-2375.
K. K. Linder, Appl. Phys Lett., 1997, 70(24), 3224-3226.
C. S. Peng, Appl. Phys. Lett., 1998, 72(24), 3160-3162.
Lee, M. L.; et al. J. Vac. Sci.Technol. 2004, B 22 (1), 158.
E. Kasper, et al., Appl Surf. Sci. 2004, 224, 3.
Currie, M. T.; et al. Appl. Phys. Lett. 1998, 72 (14), 1718.
G. Eres, et al., J. Vac. Sci. Technol., 1993, A11(5), 2463-2471.
T. R. Bramblett, et al. J. Appl. Phys., 1995, 77(4), 1504-1513.
J. Takahashi, et al., Appl. Phys. Lett., 1991, 58(24), 2776-2778.
Ritter, C.J.; et al. J. of the Am. Chem. Soc., 2005, 127(27), 9855-9864.
Hu, C.-W.; et al. Applied Physics Letters, 2005, 87(18), 181903/1-3.
Nijhawan, S.; et al. J. Aerosol Science 2003, 34, 691-711.
Soldner, M.; et al. J. Organometallic Chem. 1996, 521, 295.
Urban, J.; et al. J. Chem. Phys. Lett. 1997, 264, 441-448.
Albinsson, B.; et al. J. Phys. Chem. 1996, 100, 8681.
Jasinski, J. M.; et al. Chem. Rev. 1995, 95, 1203.
Cullis, A.G.; et al. J. Cryst. Growth 1992, 123, 333.
Van Dyke et al., "Preparation and Characterization of Silylgermylmethane and Some of its Inorganic Derivatives", Inorg. Chem., 1972, 11(2):408-412.
Vanderwielen et al., "Chlorination of silanes by silver chloride", Inorg. Chem., 1972, 11(2):246 (equation 1).
Fiorenza et al., "Fluoride ion induced reactions of organosilanes: the preparation of mono and dicarbonyl compounds from beta-ketosilanes", Tetrahedron Letters, 1985, 26(6):787-788.
Scudder, Paul, "Electron Flow in Organic Chemistry", 1992, John Wiley & Sons, p. 50.
Hu et al., "Low-temperature pathways to Ge-rich Si(1-x)Gex alloys via single-source hydride chemistry", Appl. Phy. Lett., 2005, 87:181903.
Monroy et al., Photoluminescence properties of SiNx/Si amorphous multilayer structures grown by plasma-enhanced chemical vapor deposition, J. Luminescence, 2006, 121(2):349-352.

*Primary Examiner* — Thanh V Pham
(74) *Attorney, Agent, or Firm* — McDonnell Boehnen Hulbert & Berghoff LLP

(57) ABSTRACT

The invention provides compounds of, and methods for the preparation of compounds of, the molecular formula, $Si_xGe_yH_{z-a}X_a$; wherein X is halogen, and x, y, z, and a are defined herein, and methods for the deposition of high-Ge content Si films on silicon substrates using compounds of the invention.

76 Claims, 10 Drawing Sheets

METHODS FOR MAKING AND USING HALOSILYLGERMANES

CROSS REFERENCE TO RELATED APPLICATIONS

This application claims the benefit of the filing date, under 35 USC §119(e), of U.S. Provisional Application Ser. No. 60/909,505, filed 2 Apr. 2007; which is hereby incorporated by reference in its entirety.

STATEMENT OF GOVERNMENT INTEREST

The invention described herein was made in part with government support under grant number FA9550-06-01-0442, awarded by the U.S. Air Force Office of Scientific Research and grant DMR-0526604 and IIP-0638253, awarded by the National Science Foundation. The United States Government has certain rights in the invention.

FIELD OF THE INVENTION

The present application relates generally to the fields of chemistry, optoelectronics, silicon-germanium alloys, semiconductor structures, and related methods and devices.

BACKGROUND OF THE INVENTION

Heteroepitaxial $Ge_{1-x}Si_x$ layers on Si(100) with high Ge contents are of interest due to many applications in key technologies such as solar cells, MEMS, quantum cascade lasers and Si-based photonics (see, Mooney, P. M.; Chu, J. O. *Annu. Rev. Mater. Sci.* 2000, 30, 335; and Tromp, R. M.; Ross, F. M. *Annu. Rev. Mater. Sci.* 2000, 30, 431), including high speed modulators and photodetectors (see, Kuo et al., *Nature* 2005, 437, 1334). However, these materials are much less developed in spite of this high impact potential in IR optical devices. In addition, they serve as virtual substrates for growth of high mobility, strained Si and Ge device channels, and are also considered as a potential pathway to monolithic integration of III-V based devices with Si technologies (Lee et al., *J. Vac. Sci. Technol.* 2004, B 22 (1), 158; and Kasper, E.; Heim, S. *Appl Surf. Sci.* 2004, 224, 3). The best current route to these materials is complicated and fraught with difficulties, requiring both high temperature growth of thick (>10 μm) compositionally graded films and a chemical-mechanical planarization step to relieve the misfit strain between the $Ge_{1-x}Si_x$ epilayer and Si substrate and produce a flat surface, respectively (see, Currie et al., *Appl. Phys. Lett.* 1998, 72 (14), 1718).

Chemical vapor deposition (CVD) methods that allow growth of Ge-rich (Ge≧50 atom %) device-quality alloys on Si that cannot be obtained by conventional routes have been recently developed (see, Ritter et al., *J. Am. Chem. Soc.* 2005, 127(27), 9855-9864; Hu et al., *J. Appl. Phys. Lett.* 2005, 87(18), 181903/1-3; and Chizmeshya, et al., *J. Am. Chem. Soc.* 2006, 128(21), 6919-6930). Ge-rich films can enable higher speeds in microprocessors, lower power consumption in cell phones, silicon-based photonics, and more efficient solar cells (see, Mooney and Chu, supra; and Tromp and Ross, supra). The technology utilizes previously unknown designer Si—Ge hydride precursors to precisely control the chemical composition, morphology, and microstructure of the corresponding films, circumventing the need for thick graded layers and lift off techniques (see, Currie et al., supra).

To prepare such semiconductor structures, $Si_dGe_{1-d}$ alloys can be deposited selectively in, for example, the source and drain regions of a transistor architecture. Conventional selective growth of $Si_dGe_{1-d}$ alloys is achieved using high temperature reactions of chlorosilanes, germane and elemental $Cl_2$ which typically do not yield films with suitable morphology and microstructure in the high Ge concentration range. For example, selective growth of $Si_dGe_{1-d}$ alloys has been achieved using high temperature reactions of chlorosilanes, germane and elemental $Cl_2$. However, the complexity of the associated multicomponent reactions and the presence of corrosive $Cl_2$ call for alternative approaches to selective growth. This need is particularly acute in the high Ge-concentration range, for which the chlorosilane route does not yield selectively deposited films with suitable morphology, microstructure or composition. Furthermore, for high Ge content the conventional processes lead to high dislocation densities, non-uniformities in strain, lack of compositional control, and reduced film thickness, all of which ultimately can degrade the quality and performance of the stressor material thereby limiting the practical usefulness of this approach.

Therefore, there exists a need in the art for methods for the deposition of $Si_dGe_{1-d}$ materials, methods for the selective deposition of $Si_dGe_{1-d}$ materials, and in particular, high Ge content $Si_dGe_{1-d}$ materials on substrates which avoid the issues described above.

SUMMARY OF THE INVENTION

The invention provides methods for the preparation of compounds of the molecular formula $Si_xGe_yH_{z-a}X_a$, wherein X is halogen, and x, y, z, and a are defined herein.

The invention further provides compounds of the molecular formula $Si_xGe_yH_{z-a}X_a$, wherein X is halogen, and x, y, z, and a are defined herein.

The invention provides the substantially pure compounds prepared according to the methods of the invention.

The invention also provides methods for the preparation of semiconductor structures through the deposition of high-Ge content $Si_dGe_{1-d}$ films on substrates using the compounds of the invention.

The invention also provides methods for the selective deposition of a $Si_dGe_{1-d}$ layer comprising contacting a substrate having a surface layer comprising at least two portions, wherein a first portion of the surface layer comprises a semiconductor surface layer and a second portion of the surface layer comprises an oxide, nitride, or oxynitride surface layer, wherein the $Si_dGe_{1-d}$ layer is formed only on the first portion of the substrate.

The key building blocks of the new technology are the entire halo(germyl)silane sequence of molecules $Si_xGe_yH_{z-a}X_a$, where X is a halogen and the remaining variables are defined herein, which are obtained in viable high-purity yields via synthetic methodologies described herein. The inherent incorporation of the $Si_xGe_y$ molecular core into the films provides unprecedented control of morphology, composition, and strain. Work in this area addresses a critical need for precursors and processes that deposit such films under low temperature CMOS compatible conditions with throughput rates that are significantly higher than those offered by existing processes.

Replacing some or all of the H atoms on the silicon atoms of a $Si_xGe_yH_z$ species with halogens, provide several desirable benefits, such as, built-in HX leaving groups that can function as cleaning agents for removal of impurities from the growth surface, in situ, during growth of the desired films. They can also promote selective growth of a variety of device structures (strained Si, SiGe and strained Ge) on patterned Si wafers. In general, selective growth of $Si_dGe_{1-d}$ films on Si surfaces with $SiO_2$ patterned features can be achieved during growth by generation of in situ etchants such as HCl, and promote selective growth of crystalline material on the unmasked areas around the patterned regions on the wafer. The larger mass of the halo(germyl)silanes provides an increased kinetic stability allowing growth to be conducted at even lower temperatures than with $Si_dGe_{1-d}$ hydrides, for example, $H_3SiGeH_3$.

DETAILED DESCRIPTION OF THE INVENTION

Figure 1:
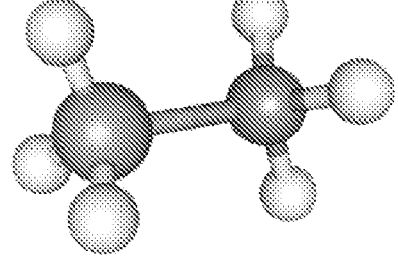
FIG. 1 is a ball and stick structural representations of the $H_3Si$—$GeH_3$, $ClH_2Si$—$GeH_3$, $Cl_2HSi$—$GeH_3$ and $Cl_3Si$—$GeH_3$ molecules.
Figure 1:
Figure 1:
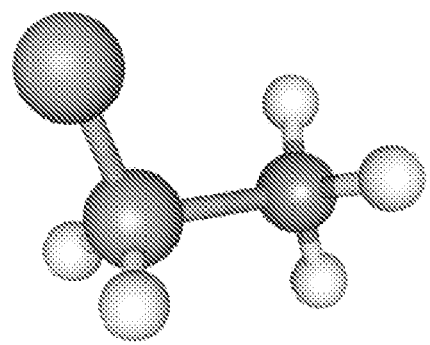
Figure 1:
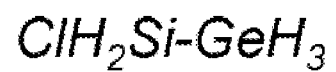
Figure 1:
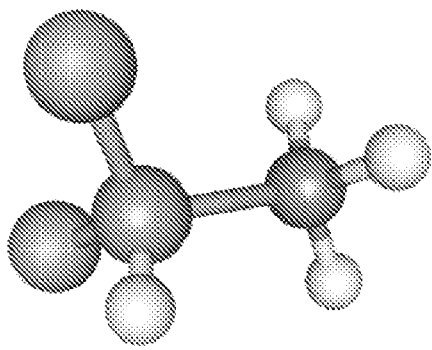
Figure 1:
Figure 1:
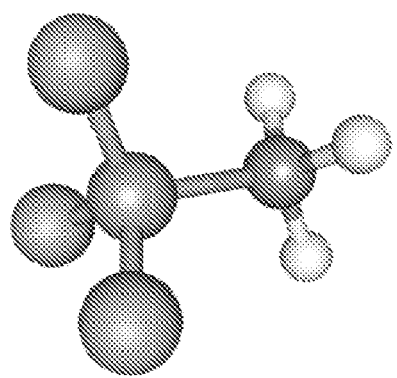
Figure 1:

In a first aspect, the invention provides a method for the preparation of compounds of the molecular Formula (I), $$Si_xGe_yH_{z-a}X_a \quad (I)$$

wherein x is 1, 2, 3, or 4; y is 1, 2, 3, or 4; z is 2(x+y+1); a is 1 to 3x; and X is halogen, provided that (i) each X is bonded only to Si; and (ii) the sum of x and y is less than or equal to 5, comprising the step of, treating a compound of the molecular Formula (II), $$Si_xGe_yH_z \quad (II)$$

with a compound of the formula $BX_3$, $AlX_3$, or a metal chlorinating agent, at a temperature of about −80° C. to about 25° C.; such a method is referred to hereafter as Method A.

As demonstrated herein, compounds according to Formula (I) can be used, for example, in controlled depositions to produce stoichiometric $Si_dGe_{1-d}$ films possessing desired properties for semiconductor applications including perfectly crystalline and epitaxial microstructures, smooth morphologies, and uniformly strain-relaxed states. The compounds of Formula (I) are herein demonstrated to be remarkably stable over extended periods of time, and thus represent viable molecular sources for potential industrial applications.

Compounds according to this aspect of the invention include any conformational form of the compound, including but not limited n, g, and iso-forms of the compounds, and combinations thereof.

Exemplary silicon-germanium hydrides starting materials of Formula (II) for the methods according to this aspect of the invention comprise or consist of those compounds listed in Table 1. All Si and Ge atoms in the compounds are tetravalent. In the isobutane- and isopentane-like isomers, the Si and Ge atoms inside the brackets are directly bound to the Si or Ge to the left of the brackets; the Si or Ge in parenthesis outside of the brackets at the far right in some of the compounds are directly bound to the last Si or Ge inside of the brackets.

TABLE 1

| 2 metals: | |
|---|---|
| $H_3Si$—$GeH_3$ | $Si_1Ge_1H_6$ |
| 3 and 4 metal variants: | |
| (a) Linear | |
| $SiH_3$—$GeH_2$—$GeH_3$ | $Si_1Ge_2H_8$ |
| $GeH_3$—$SiH_2$—$GeH_3$ | $Si_1Ge_2H_8$ |
| $SiH_3$—$SiH_2$—$GeH_3$ | $Si_2Ge_1H_8$ |
| $SiH_3$—$GeH_2$—$SiH_3$ | $Si_2Ge_1H_8$ |
| $GeH_3$—$SiH_2$—$GeH_2$—$GeH_3$ | $Si_1Ge_3H_{10}$ |
| $SiH_3$—$GeH_2$—$GeH_2$—$GeH_3$ | $Si_1Ge_3H_{10}$ |
| $SiH_3$—$SiH_2$—$GeH_2$—$GeH_3$ | $Si_2Ge_2H_{10}$ |
| $SiH_3$—$GeH_2$—$SiH_2$—$GeH_3$ | $Si_2Ge_2H_{10}$ |
| $SiH_3$—$GeH_2$—$GeH_2$—$SiH_3$ | $Si_2Ge_2H_{10}$ |
| $GeH_3$—$SiH_2$—$SiH_2$—$GeH_3$ | $Si_2Ge_2H_{10}$ |
| $SiH_3$—$SiH_2$—$GeH_2$—$SiH_3$ | $Si_3Ge_1H_{10}$ |
| $GeH_3$—$SiH_2$—$SiH_2$—$SiH_3$ | $Si_3Ge_1H_{10}$ |
| (b) iso-butane-like | |
| $SiH[(GeH_3)_3]$ | $Si_1Ge_3H_{10}$ |
| $GeH[(GeH_3)_2(SiH_3)]$ | $Si_1Ge_3H_{10}$ |
| $SiH[(SiH_3)(GeH_3)_2]$ | $Si_2Ge_2H_{10}$ |
| $GeH[(GeH_3)(SiH_3)_2]$ | $Si_2Ge_2H_{10}$ |
| $GeH[(SiH_3)_3]$ | $Si_3Ge_1H_{10}$ |
| $SiH[(SiH_3)_2(GeH_3)]$ | $Si_3Ge_1H_{10}$ |
| 5 metal atom variants: | |
| (a) Linear: | |
| $GeH_3$—$GeH_2$—$GeH_2$—$GeH_2$—$SiH_3$ | $Si_1Ge_4H_{12}$ |
| $GeH_3$—$GeH_2$—$GeH_2$—$SiH_2$—$GeH_3$ | $Si_1Ge_4H_{12}$ |
| $GeH_3$—$GeH_2$—$SiH_2$—$GeH_2$—$GeH_3$ | $Si_1Ge_4H_{12}$ |
| $SiH_3$—$SiH_2$—$GeH_2$—$GeH_2$—$GeH_3$ | $Si_2Ge_3H_{12}$ |
| $SiH_3$—$GeH_2$—$SiH_2$—$GeH_2$—$GeH_3$ | $Si_2Ge_3H_{12}$ |
| $GeH_3$—$SiH_2$—$SiH_2$—$GeH_2$—$GeH_3$ | $Si_2Ge_3H_{12}$ |
| $GeH_3$—$SiH_2$—$GeH_2$—$SiH_2$—$GeH_3$ | $Si_2Ge_3H_{12}$ |
| $SiH_3$—$GeH_2$—$GeH_2$—$GeH_2$—$SiH_3$ | $Si_2Ge_3H_{12}$ |
| $SiH_3$—$GeH_2$—$GeH_2$—$SiH_2$—$GeH_3$ | $Si_2Ge_3H_{12}$ |
| $SiH_3$—$SiH_2$—$SiH_2$—$GeH_2$—$GeH_3$ | $Si_3Ge_2H_{12}$ |

TABLE 1-continued

| | |
|---|---|
| SiH$_3$—SiH$_2$—GeH$_2$—SiH$_2$—GeH$_3$ | Si$_3$Ge$_2$H$_{12}$ |
| SiH$_3$—GeH$_2$—SiH$_2$—SiH$_2$—GeH$_3$ | Si$_3$Ge$_2$H$_{12}$ |
| GeH$_3$—SiH$_2$—SiH$_2$—SiH$_2$—GeH$_3$ | Si$_3$Ge$_2$H$_{12}$ |
| SiH$_3$—SiH$_2$—GeH$_2$—GeH$_2$—SiH$_3$ | Si$_3$Ge$_2$H$_{12}$ |
| SiH$_3$—GeH$_2$—SiH$_2$—GeH$_2$—SiH$_3$ | Si$_3$Ge$_2$H$_{12}$ |
| SiH$_3$—SiH$_2$—SiH$_2$—SiH$_2$—GeH$_3$ | Si$_4$Ge$_1$H$_{12}$ |
| SiH$_3$—SiH$_2$—SiH$_2$—GeH$_2$—SiH$_3$ | Si$_4$Ge$_1$H$_{12}$ |
| SiH$_3$—SiH$_2$—GeH$_2$—SiH$_2$—SiH$_3$ | Si$_4$Ge$_1$H$_{12}$ |
| (b) Iso-pentane-like | |
| GeH[(SiH$_3$)(GeH$_3$)(GeH$_2$)](GeH$_3$) | Si$_1$Ge$_4$H$_{12}$ |
| GeH[(GeH$_3$)$_2$(GeH$_2$)](SiH$_3$) | Si$_1$Ge$_4$H$_{12}$ |
| GeH[(GeH$_3$)$_2$(SiH$_2$)](GeH$_3$) | Si$_1$Ge$_4$H$_{12}$ |
| SiH[(GeH$_3$)$_2$(GeH$_2$)](GeH$_3$) | Si$_1$Ge$_4$H$_{12}$ |
| GeH[(SiH$_3$)$_2$(GeH$_2$)](GeH$_3$) | Si$_2$Ge$_3$H$_{12}$ |
| SiH[(SiH$_3$)(GeH$_3$)(GeH$_2$)](GeH$_3$) | Si$_2$Ge$_3$H$_{12}$ |
| GeH[(GeH$_3$)(SiH$_3$)(SiH$_2$)](GeH$_3$) | Si$_2$Ge$_3$H$_{12}$ |
| GeH[(GeH$_3$)(SiH$_3$)(GeH$_2$)](SiH$_3$) | Si$_2$Ge$_3$H$_{12}$ |
| SiH[(GeH$_3$)$_2$(SiH$_2$)](GeH$_3$) | Si$_2$Ge$_3$H$_{12}$ |
| SiH[(GeH$_3$)$_2$(GeH$_2$)](SiH$_3$) | Si$_2$Ge$_3$H$_{12}$ |
| GeH[(GeH$_3$)$_2$(SiH$_2$)](SiH$_3$) | Si$_2$Ge$_3$H$_{12}$ |
| SiH[(GeH$_3$)$_2$(SiH$_2$)]SiH$_3$ | Si$_3$Ge$_2$H$_{12}$ |
| GeH[(GeH$_3$)(SiH$_3$)(SiH$_2$)]SiH$_3$ | Si$_3$Ge$_2$H$_{12}$ |
| SiH[(GeH$_3$)(SiH$_3$)(GeH$_2$)](SiH$_3$) | Si$_3$Ge$_2$H$_{12}$ |
| SiH[(SiH$_3$)(GeH$_3$)(SiH$_2$)](GeH$_3$) | Si$_3$Ge$_2$H$_{12}$ |
| GeH[(SiH$_3$)$_2$(GeH$_2$)](SiH$_3$) | Si$_3$Ge$_2$H$_{12}$ |
| GeH[(SiH$_3$)$_2$(SiH$_2$)](GeH$_3$) | Si$_3$Ge$_2$H$_{12}$ |
| SiH[(SiH$_3$)$_2$(GeH$_2$)](GeH$_3$) | Si$_3$Ge$_2$H$_{12}$ |
| GeH[(SiH$_3$)$_2$(SiH$_2$)](SiH$_3$) | Si$_4$Ge$_1$H$_{12}$ |
| SiH[(GeH$_3$)(SiH$_3$)(SiH$_2$)](SiH$_3$) | Si$_4$Ge$_1$H$_{12}$ |
| SiH[(SiH$_3$)$_2$(SiH$_2$)](GeH$_3$) | Si$_4$Ge$_1$H$_{12}$ |
| SiH[(SiH$_3$)$_2$(GeH$_2$)](SiH$_3$) | Si$_4$Ge$_1$H$_{12}$ |
| Neopentane-like | |
| Ge[(GeH$_3$)$_3$(SiH$_3$)] | Si$_1$Ge$_4$H$_{12}$ |
| Si[(GeH$_3$)$_3$(SiH$_3$)] | Si$_2$Ge$_3$H$_{12}$ |
| Ge[(GeH$_3$)$_2$(SiH$_3$)$_2$] | Si$_2$Ge$_3$H$_{12}$ |
| Si[(SiH$_3$)$_2$(GeH$_3$)$_2$] | Si$_3$Ge$_2$H$_{12}$ |
| Ge[(SiH$_3$)$_3$(GeH$_3$)] | Si$_3$Ge$_2$H$_{12}$ |
| Si[(SiH$_3$)$_3$(GeH$_3$)] | Si$_4$Ge$_1$H$_{12}$ |
| Ge[(SiH$_3$)$_4$] | Si$_4$Ge$_1$H$_{12}$ |

In one embodiment, the invention provides the method of Method A, wherein for the compound of Formula (I), x, y, z, and a are according to one of the following (Table 2),

TABLE 2

| | |
|---|---|
| x = 1; y = 1; z = 6; a = 1 | Si$_1$Ge$_1$H$_5$X$_1$ |
| x = 1; y = 1; z = 6; a = 2 | Si$_1$Ge$_1$H$_4$X$_2$ |
| x = 1; y = 1; z = 6; a = 3 | Si$_1$Ge$_1$H$_3$X$_3$ |
| x = 1; y = 2; z = 8; a = 1 | Si$_1$Ge$_2$H$_7$X$_1$ |
| x = 1; y = 2; z = 8; a = 2 | Si$_1$Ge$_2$H$_6$X$_2$ |
| x = 1; y = 2; z = 8; a = 3 | Si$_1$Ge$_2$H$_5$X$_3$ |
| x = 1; y = 3; z = 10; a = 1 | Si$_1$Ge$_3$H$_9$X$_1$ |
| x = 1; y = 3; z = 10; a = 2 | Si$_1$Ge$_3$H$_8$X$_2$ |
| x = 1; y = 3; z = 10; a = 3 | Si$_1$Ge$_3$H$_7$X$_3$ |
| x = 1; y = 4; z = 12; a = 1 | Si$_1$Ge$_4$H$_{11}$X$_1$ |
| x = 1; y = 4; z = 12; a = 2 | Si$_1$Ge$_4$H$_{10}$X$_2$ |
| x = 1; y = 4; z = 12; a = 3 | Si$_1$Ge$_4$H$_9$X$_3$ |
| x = 2; y = 1; z = 8; a = 1 | Si$_2$Ge$_1$H$_7$X$_1$ |
| x = 2; y = 1; z = 8; a = 2 | Si$_2$Ge$_1$H$_6$X$_2$ |
| x = 2; y = 1; z = 8; a = 3 | Si$_2$Ge$_1$H$_5$X$_3$ |
| x = 2; y = 1; z = 8; a = 4 | Si$_2$Ge$_1$H$_4$X$_4$ |
| x = 2; y = 1; z = 8; a = 5 | Si$_2$Ge$_1$H$_3$X$_5$ |
| x = 2; y = 1; z = 8; a = 6 | Si$_2$Ge$_1$H$_2$X$_6$ |
| x = 2; y = 2; z = 10; a = 1 | Si$_2$Ge$_2$H$_9$X$_1$ |
| x = 2; y = 2; z = 10; a = 2 | Si$_2$Ge$_2$H$_8$X$_2$ |
| x = 2; y = 2; z = 10; a = 3 | Si$_2$Ge$_2$H$_7$X$_3$ |
| x = 2; y = 2; z = 10; a = 4 | Si$_2$Ge$_2$H$_6$X$_4$ |
| x = 2; y = 2; z = 10; a = 5 | Si$_2$Ge$_2$H$_5$X$_5$ |
| x = 2; y = 2; z = 10; a = 6 | Si$_2$Ge$_2$H$_4$X$_6$ |
| x = 2; y = 3; z = 12; a = 1 | Si$_2$Ge$_3$H$_{11}$X$_1$ |
| x = 2; y = 3; z = 12; a = 2 | Si$_2$Ge$_3$H$_{10}$X$_2$ |
| x = 2; y = 3; z = 12; a = 3 | Si$_2$Ge$_3$H$_9$X$_3$ |
| x = 2; y = 3; z = 12; a = 4 | Si$_2$Ge$_3$H$_8$X$_4$ |
| x = 2; y = 3; z = 12; a = 5 | Si$_2$Ge$_3$H$_7$X$_5$ |
| x = 2; y = 3; z = 12; a = 6 | Si$_2$Ge$_3$H$_6$X$_6$ |

TABLE 2-continued

| | |
|---|---|
| x = 3; y = 1; z = 10; a = 1 | Si$_3$Ge$_1$H$_9$X$_1$ |
| x = 3; y = 1; z = 10; a = 2 | Si$_3$Ge$_1$H$_8$X$_2$ |
| x = 3; y = 1; z = 10; a = 3 | Si$_3$Ge$_1$H$_7$X$_3$ |
| x = 3; y = 1; z = 10; a = 4 | Si$_3$Ge$_1$H$_6$X$_4$ |
| x = 3; y = 1; z = 10; a = 5 | Si$_3$Ge$_1$H$_5$X$_5$ |
| x = 3; y = 1; z = 10; a = 6 | Si$_3$Ge$_1$H$_4$X$_6$ |
| x = 3; y = 1; z = 10; a = 7 | Si$_3$Ge$_1$H$_3$X$_7$ |
| x = 3; y = 1; z = 10; a = 8 | Si$_3$Ge$_1$H$_2$X$_8$ |
| x = 3; y = 1; z = 10; a = 9 | Si$_3$Ge$_1$H$_1$X$_9$ |
| x = 3; y = 2; z = 12; a = 1 | Si$_3$Ge$_2$H$_{11}$X$_1$ |
| x = 3; y = 2; z = 12; a = 2 | Si$_3$Ge$_2$H$_{10}$X$_2$ |
| x = 3; y = 2; z = 12; a = 3 | Si$_3$Ge$_2$H$_9$X$_3$ |
| x = 3; y = 2; z = 12; a = 4 | Si$_3$Ge$_2$H$_8$X$_4$ |
| x = 3; y = 2; z = 12; a = 5 | Si$_3$Ge$_2$H$_7$X$_5$ |
| x = 3; y = 2; z = 12; a = 6 | Si$_3$Ge$_2$H$_6$X$_6$ |
| x = 3; y = 2; z = 12; a = 7 | Si$_3$Ge$_2$H$_5$X$_7$ |
| x = 3; y = 2; z = 12; a = 8 | Si$_3$Ge$_2$H$_4$X$_8$ |
| x = 3; y = 2; z = 12; a = 9 | Si$_3$Ge$_2$H$_3$X$_9$ |
| x = 4; y = 1; z = 12; a = 1 | Si$_4$Ge$_1$H$_{11}$X$_1$ |
| x = 4; y = 1; z = 12; a = 2 | Si$_4$Ge$_1$H$_{10}$X$_2$ |
| x = 4; y = 1; z = 12; a = 3 | Si$_4$Ge$_1$H$_9$X$_3$ |
| x = 4; y = 1; z = 12; a = 4 | Si$_4$Ge$_1$H$_8$X$_4$ |
| x = 4; y = 1; z = 12; a = 5 | Si$_4$Ge$_1$H$_7$X$_5$ |
| x = 4; y = 1; z = 12; a = 6 | Si$_4$Ge$_1$H$_6$X$_6$ |
| x = 4; y = 1; z = 12; a = 7 | Si$_4$Ge$_1$H$_5$X$_7$ |
| x = 4; y = 1; z = 12; a = 8 | Si$_4$Ge$_1$H$_4$X$_8$ |
| x = 4; y = 1; z = 12; a = 9 | Si$_4$Ge$_1$H$_3$X$_9$ |
| x = 4; y = 1; z = 12; a = 10 | Si$_4$Ge$_1$H$_2$X$_{10}$ |
| x = 4; y = 1; z = 12; a = 11 | Si$_4$Ge$_1$H$_1$X$_{11}$ |
| x = 4; y = 1; z = 12; a = 12 | Si$_4$Ge$_1$H$_0$X$_{12}$ |

In one embodiment of Method A, X is chloro or bromo. In a preferred embodiment, X is chloro.

In one embodiment of Method A, a is 1. In another embodiment of Method A, a is 3x.

In one embodiment of Method A, x is 1 and a is 3. In another embodiment of Method A, x is 1 and a is 1. In another embodiment of Method A, x is 1 and a is 2.

In another embodiment of Method A, x is 2 and a is 6. In another embodiment of Method A, x is 2 and a is 1.

In another embodiment of Method A, x is 3 and a is 9. In another embodiment of Method A, x is 3 and a is 1.

In another embodiment of Method A, x is 4 and a is 12. In another embodiment of Method A, x is 4 and a is 1.

In another embodiment of Method A, the sum of x and y is less than or equal to 4. In another embodiment of Method A, the sum of x and y is less than or equal to 3. In another embodiment of Method A, the sum of x and y is 2.

In a preferred embodiment of Method A, the compound of molecular Formula (I) is of formula (III), $$SiGe_yH_{z-a}X_a \qquad (III)$$

wherein y is 1, 2, 3, or 4; z is 2(y+2); a is 1 to 3; and X is halogen, provided that each X is bonded only to Si; such a method is referred to hereafter as Method B.

In one embodiment of Method B, X is chloro or bromo. In a preferred embodiment, X is chloro.

In one embodiment of Method B, y is 1. In another embodiment of Method B, y is 2. In another embodiment of Method B, y is 3. In another embodiment of Method B, y is 4.

In one embodiment of Method B, a is 1. In another embodiment of Method B, a is 2. In another embodiment of Method B, a is 3.

In a preferred embodiment of Method B, y is 1 and a is 1. In another preferred embodiment of Method B, y is 1 and a is 2. In another preferred embodiment of Method B, y is 1 and a is 3.

In a preferred embodiment of Method B, the compound of formula (II) is H$_3$SiGeH$_3$, H$_2$Si(GeH$_3$)$_2$, or HSi(GeH$_3$)$_3$. In another preferred embodiment of Method B, the compound of formula (II) is H$_3$GeSiH$_2$SiH$_2$GeH$_3$.

In a preferred embodiment of Method B, the compound of formula (II) is $H_3SiGeH_3$, $H_2Si(GeH_3)_2$, or $HSi(GeH_3)_3$ and a is 1. In a preferred embodiment of Method B, the compound of formula (II) is $H_3SiGeH_3$ or $H_2Si(GeH_3)_2$, and a is 2. In another preferred embodiment of Method B, the compound of formula (II) is $H_3GeSiH_2SiH_2GeH_3$ and a is 1 or 2.

In a preferred embodiment of Method B, the compound of molecular Formula (I) is of formula (IV), $$SiGe_yH_{z-a}Cl_a \qquad (IV)$$

wherein y is 1, 2, 3, or 4; z is 2(y+2); a is 1 to 3; and provided that each Cl is bonded only to Si; such a method is referred to hereafter as Method C.

In one embodiment of Method C, y is 1. In another embodiment of Method C, y is 2. In another embodiment of Method C, y is 3. In another embodiment of Method C, y is 4.

In one embodiment of Method C, a is 1. In another embodiment of Method C, a is 2. In another embodiment of Method C, a is 3.

In a preferred embodiment of Method C, y is 1 and a is 1. In another preferred embodiment of Method C, y is 1 and a is 2. In another preferred embodiment of Method C, y is 1 and a is 3.

In a preferred embodiment of Method C, the compound of formula (II) is $H_3SiGeH_3$, $H_2Si(GeH_3)_2$, or $HSi(GeH_3)_3$. In another preferred embodiment of Method C, the compound of formula (II) is $H_3GeSiH_2SiH_2GeH_3$.

In a preferred embodiment of Method C, the compound of formula (II) is $H_3SiGeH_3$, $H_2Si(GeH_3)_2$, or $HSi(GeH_3)_3$ and a is 1. In a preferred embodiment of Method C, the compound of formula (II) is $H_3SiGeH_3$ or $H_2Si(GeH_3)_2$, and a is 2. In another preferred embodiment of Method C, the compound of formula (II) is $H_3GeSiH_2SiH_2GeH_3$ and a is 1 or 2.

In a preferred embodiment of Method C, the compound of molecular Formula (I) is of formula (V), $$SiGeH_{6-a}Cl_a \qquad (V)$$

wherein a is 1 to 3, provided that each Cl is bonded only to Si; such a method is referred to hereafter as Method D.

In a preferred embodiment of Method A, the compound of molecular Formula (I) is of formula (VI), $$Si_xGeH_{z-a}X_a \qquad (VI)$$

wherein x is 1, 2, 3, or 4; z is 2(x+2); a is 1 to 3x; and X is halogen, provided that each X is bonded only to Si; such a method is referred to hereafter as Method E.

In one embodiment of Method E, X is chloro or bromo. In a preferred embodiment, X is chloro.

In one embodiment of Method E, x is 1. In another embodiment of Method E, x is 2. In another embodiment of Method E, x is 3. In another embodiment of Method E, x is 4.

In one embodiment of Method E, a is 1. In another embodiment of Method E, a is 2. In another embodiment of Method E, a is 3.

In a preferred embodiment of Method E, x is 2 and a is 1. In another preferred embodiment of Method E, x is 3 and a is 1. In another preferred embodiment of Method E, x is 4 and a is 1.

In another preferred embodiment of Method E, x is 2 and a is 2. In another preferred embodiment of Method E, x is 3 and a is 2. In another preferred embodiment of Method E, x is 4 and a is 2.

In a preferred embodiment of Method E, the compound of molecular Formula (I) is of formula (VII), $$Si_xGeH_{z-a}Cl_a \qquad (VII)$$

wherein x is 1, 2, 3, or 4; z is 2(x+2); a is 1 to 3x; and provided that each Cl is bonded only to Si; such a method is referred to hereafter as Method F.

In one embodiment of Method F, x is 1. In another embodiment of Method F, x is 2. In another embodiment of Method F, x is 3. In another embodiment of Method F, x is 4.

In one embodiment of Method F, a is 1. In another embodiment of Method F, a is 2. In another embodiment of Method F, a is 3.

In a preferred embodiment of Method F, x is 1 and a is 1. In another preferred embodiment of Method F, x is 2 and a is 1. In another preferred embodiment of Method F, x is 3 and a is 1. In another preferred embodiment of Method F, x is 4 and a is 1.

In a preferred embodiment of Method F, x is 1 and a is 2. In another preferred embodiment of Method F, x is 2 and a is 2. In another preferred embodiment of Method F, x is 3 and a is 2. In another preferred embodiment of Method F, x is 4 and a is 2.

In another embodiment of the first aspect, the invention provides the method of any one of Methods A-F, further comprising the step of (ii) fractionally distilling the product of step (i).

In another embodiment of the first aspect, the invention provides the method of any one of Methods A-F, the compound of molecular Formula (I) is treated with a compound of the formula $BX_3$. Preferably, the compound is $BCl_3$ or $BBr_3$. More preferably, the compound is $BCl_3$.

In another embodiment of the first aspect, the invention provides the method of any one of Methods A-F, wherein the reaction temperature is about −60° C. to about 10° C. In a preferred embodiment of the first aspect, the invention provides the method of any one of Methods A-F, wherein the reaction temperature is about −25° C. to about 5° C.

In another embodiment of the third aspect, the invention provides the method of any one of Methods A-F, wherein the compound of Formula (I) is $ClSiH_2GeH_3$ chloro(germyl)silane;
$Cl_2SiHGeH_3$ dichloro(germyl)silane;
$ClHSi(GeH_3)_2$ chloro(digermyl)silane;
$Cl_2Si(GeH_3)_2$ dichloro(digermyl)silane;
$ClSi(GeH_3)_3$ chloro(trigermyl)silane;
$ClHSiSiH_2(GeH_3)_2$ 1,2-digermyl-1-chlorodisilane;
$(ClHSi)_2(H_3Ge)_2$ 1,2-digermyl-1,2-dichlorodisilane;
$Cl_2SiSiH_2(GeH_3)_2$ 1,2-digermyl-1,1-dichlorodisilane;
or mixtures thereof.

In a second aspect, the invention provides a method for the preparation of compounds of the molecular formula (XII), $$Si_xGe_yH_{z-1}X \qquad (XII)$$

wherein x is 1, 2, 3, or 4; y is 1, 2, 3, or 4; z is 2(x+y+1); a is 1 to 3x; and X is halogen, provided that (i) X is bonded only to Si; and (ii) the sum of x and y is less than or equal to 5, comprising the steps of, (i) contacting a compound of the formula (XIII), $$Si_xGe_yH_{z-1}Y \qquad (XIII)$$

wherein Y is $-OSO_2R^1$, wherein $R^1$ is $C_1-C_6$ haloalkyl, $C_1-C_6$ alkyl, or phenyl, wherein the alkyl and phenyl are optionally substituted with 1 to 4 groups which are each independently halogen, $C_1-C_2$ haloalkyl, $C_1-C_3$ alkyl, cyano, nitro, $C_1-C_3$ alkoxy, $-C(O)C_1-C_3$ alkoxy, $-C(O)C_1-C_3$ alkyl, $-S(O)C_1-C_3$ alkyl, or $-S(O)_2C_1-C_3$ alkyl; provided that Y is bonded only to Si;

with a compound of the formula CsX at a temperature of about −50° C. to about 40° C., such a method is referred to hereafter as Method G.

In one embodiment of Method G, x is 1. In another embodiment of Method G, x is 1 and y is 1. In another embodiment of Method G, x is 1 and y is 2. In another embodiment of Method G, x is 1 and y is 3. In another embodiment of Method G, x is 1 and y is 4.

In a preferred embodiment of Method G, X is chloro.

In a preferred embodiment of the second aspect, the invention provides a method for the preparation of compounds of formula (XIV), $$SiGe_yH_{z-1}X \qquad (XIV)$$

wherein y is 1, 2, 3, or 4; z is 2(y+2); and X is halogen, provided that X is bonded only to Si; comprising the steps of,
(i) contacting a compound of the formula (XV), $$SiGe_yH_{z-1}Y \qquad (XV)$$

wherein Y is —OSO$_2$R$^1$, wherein R$^1$ is C$_1$-C$_6$ haloalkyl, C$_1$-C$_6$ alkyl, or phenyl, wherein the alkyl and phenyl are optionally substituted with 1 to 4 groups which are each independently halogen, C$_1$-C$_2$ haloalkyl, C$_1$-C$_3$ alkyl, cyano, nitro, C$_1$-C$_3$ alkoxy, —C(O)C$_1$-C$_3$ alkoxy, —C(O)C$_1$-C$_3$ alkyl, —S(O)C$_1$-C$_3$ alkyl, or —S(O)$_2$C$_1$-C$_3$ alkyl, provided that Y is bonded only to Si;
with a compound of the formula CsX at a temperature of about −50° C. to about 40° C.; such a method is referred to hereafter as Method H.

In one embodiment of Method H, y is 1. In another embodiment of Method H, y is 2. In another embodiment of Method H, y is 3. In another embodiment of Method H, y is 4.

In a preferred embodiment of Method H, X is chloro.

In a more preferred embodiment of the second aspect, the invention provides a method for the preparation of ClH$_2$SiGeH$_3$, comprising the steps of,
(i) contacting a compound of the formula YH$_2$SiGeH$_3$, wherein Y is —OSO$_2$R$^1$, wherein R$^1$ is C$_1$-C$_6$ haloalkyl, C$_1$-C$_6$ alkyl, or phenyl, wherein the alkyl and phenyl are optionally substituted with 1 to 4 groups which are each independently halogen, C$_1$-C$_2$ haloalkyl, C$_1$-C$_3$ alkyl, cyano, nitro, C$_1$-C$_3$ alkoxy, —C(O)C$_1$-C$_3$ alkoxy, —C(O)C$_1$-C$_3$ alkyl, —S(O)C$_1$-C$_3$ alkyl, or —S(O)$_2$C$_1$-C$_3$ alkyl, provided that Y is bonded only to Si;
with CsCl at a temperature of about −50° C. to about 40° C.; such a method is referred to hereafter as Method I.

In one embodiment of Method I, y is 1. In another embodiment of Method I, y is 2. In another embodiment of Method I, y is 3. In another embodiment of Method I, y is 4.

In a more preferred embodiment of the second aspect, the invention provides a method for the preparation of compounds of formula (XVI), $$SiGe_yH_{z-1}Cl \qquad (XVI)$$

wherein y is 1, 2, 3, or 4; z is 2(y+2); and provided that Cl is bonded only to Si; comprising the steps of,
(i) contacting a compound of the formula (XV), $$SiGe_yH_{z-1}Y \qquad (XV)$$

Y is —OSO$_2$R$^1$, wherein R$^1$ is C$_1$-C$_6$ haloalkyl, C$_1$-C$_6$ alkyl, or phenyl, wherein the alkyl and phenyl are optionally substituted with 1 to 4 groups which are each independently halogen, C$_1$-C$_2$ haloalkyl, C$_1$-C$_3$ alkyl, cyano, nitro, C$_1$-C$_3$ alkoxy, —C(O)C$_1$-C$_3$ alkoxy, —C(O)C$_1$-C$_3$ alkyl, —S(O)C$_1$-C$_3$ alkyl, or —S(O)$_2$C$_1$-C$_3$ alkyl, provided that Y is bonded only to Si;
with a compound of the formula CsCl at a temperature of about −50° C. to about 40° C., such a method is referred to hereafter as Method J.

In one embodiment of Method J, y is 1. In another embodiment of Method J, y is 2. In another embodiment of Method J, y is 3. In another embodiment of Method J, y is 4.

In a more preferred embodiment of the second aspect, the invention provides a method for the preparation of the compound, ClH$_2$SiGeH, comprising the steps of, (i) contacting a compound of the formula YH$_2$SiGeH$_3$, wherein Y is —OSO$_2$R$^1$, wherein R$^1$ is C$_1$-C$_6$ haloalkyl, C$_1$-C$_6$ alkyl, or phenyl, wherein the alkyl and phenyl are optionally substituted with 1 to 4 groups which are each independently halogen, C$_1$-C$_2$ haloalkyl, C$_1$-C$_3$ alkyl, cyano, nitro, C$_1$-C$_3$ alkoxy, —C(O)C$_1$-C$_3$ alkoxy, —C(O)C$_1$-C$_3$ alkyl, —S(O)C$_1$-C$_3$ alkyl, or —S(O)$_2$C$_1$-C$_3$ alkyl, provided that Y is bonded only to Si; with a compound of the formula CsCl at a temperature of about −50° C. to about 40° C., such a method is referred to hereafter as Method K.

In a preferred embodiment of any one of Methods G-K, R$^1$ is C$_1$-C$_6$ haloalkyl, C$_1$-C$_6$ alkyl, or phenyl, wherein phenyl are optionally substituted with halogen, C$_1$-C$_2$ haloalkyl, C$_1$-C$_3$ alkyl, cyano, nitro, C$_1$-C$_3$ alkoxy, —C(O)C$_1$-C$_3$ alkoxy, —C(O)C$_1$-C$_3$ alkyl, —S(O)C$_1$-C$_3$ alkyl, or —S(O)$_2$C$_1$-C$_3$ alkyl. In a more preferred embodiment of Method H, R$^1$ is C$_1$-C$_4$ haloalkyl, C$_1$-C$_4$ alkyl, or phenyl, wherein phenyl is optionally substituted with halogen, C$_1$-C$_2$ haloalkyl, or C$_1$-C$_3$ alkyl. In a even more preferred embodiment of Method G, R$^1$ is C$_1$-C$_4$ perfluoroalkyl, C$_1$-C$_4$ alkyl, or phenyl, wherein phenyl is optionally substituted with halogen, C$_1$-C$_2$ perfluoroalkyl, or C$_1$-C$_3$ alkyl.

In a preferred embodiment of the second aspect, the invention provides the method of any one of Methods G-K, wherein the reaction temperature is about −25° C. to about 25° C.

In an embodiment of the second aspect, the invention provides the method of any one of Methods G-K, further comprising the step of
(ii) fractionally distilling the product of step (i).

In a third aspect, the invention provides a method for the preparation of compounds of the molecular Formula (XVII), $$Si_xGe_yH_{z-a}X_a \qquad (XVII)$$

wherein x is 1, 2, 3, or 4; y is 1, 2, 3, or 4; z is 2(x+y+1); a is 1 to z; and X is halogen, provided that the sum of x and y is less than or equal to 5, comprising the step of, treating a compound of the molecular Formula (LX), $$Si_xGe_yH_z \qquad (LX)$$

with a compound of the formula BX$_3$ or AlX$_3$ at a temperature of about −80° C. to about 25° C.; such a method is referred to hereafter as Method A1.

As demonstrated herein, compounds according to Formula (XVII) can be used, for example, in controlled depositions to produce stoichiometric Si$_d$Ge$_{1-d}$ films possessing desired properties for semiconductor applications including perfectly crystalline and epitaxial microstructures, smooth morphologies, and uniformly strain-relaxed states. The compounds of Formula (XVII) are herein demonstrated to be remarkably stable over extended periods of time, and thus represent viable molecular sources for potential industrial applications.

Compounds according to this aspect of the invention include any conformational form of the compound, including but not limited n, g, and iso-forms of the compounds, and combinations thereof.

Exemplary silicon-germanium hydrides starting materials of Formula (LX) for the methods according to this aspect of the invention comprise or consist of those compounds listed in Table 1.

In one embodiment, the invention provides the method of Method A1, wherein for the compound of Formula (I), x, y, z, and a are according to listed in Table 2 or one of the following (Table 3),

TABLE 3

| | |
|---|---|
| x = 1; y = 1; z = 6; a = 4 | $Si_1Ge_1H_2X_4$ |
| x = 1; y = 1; z = 6; a = 5 | $Si_1Ge_1H_1X_5$ |
| x = 1; y = 1; z = 6; a = 6 | $Si_1Ge_1H_0X_6$ |
| x = 1; y = 2; z = 8; a = 4 | $Si_1Ge_2H_4X_4$ |
| x = 1; y = 2; z = 8; a = 5 | $Si_1Ge_2H_3X_5$ |
| x = 1; y = 2; z = 8; a = 6 | $Si_1Ge_2H_2X_6$ |
| x = 1; y = 2; z = 8; a = 7 | $Si_1Ge_2H_1X_7$ |
| x = 1; y = 2; z = 8; a = 8 | $Si_1Ge_2H_0X_8$ |
| x = 1; y = 3; z = 10; a = 4 | $Si_1Ge_3H_6X_4$ |
| x = 1; y = 3; z = 10; a = 5 | $Si_1Ge_3H_5X_5$ |
| x = 1; y = 3; z = 10; a = 6 | $Si_1Ge_3H_4X_6$ |
| x = 1; y = 3; z = 10; a = 7 | $Si_1Ge_3H_3X_7$ |
| x = 1; y = 3; z = 10; a = 8 | $Si_1Ge_3H_2X_8$ |
| x = 1; y = 3; z = 10; a = 9 | $Si_1Ge_3H_1X_9$ |
| x = 1; y = 3; z = 10; a = 10 | $Si_1Ge_3H_0X_{10}$ |
| x = 1; y = 4; z = 12; a = 4 | $Si_1Ge_4H_8X_4$ |
| x = 1; y = 4; z = 12; a = 5 | $Si_1Ge_4H_7X_5$ |
| x = 1; y = 4; z = 12; a = 6 | $Si_1Ge_4H_6X_6$ |
| x = 1; y = 4; z = 12; a = 7 | $Si_1Ge_4H_5X_7$ |
| x = 1; y = 4; z = 12; a = 8 | $Si_1Ge_4H_4X_8$ |
| x = 1; y = 4; z = 12; a = 9 | $Si_1Ge_4H_3X_9$ |
| x = 1; y = 4; z = 12; a = 10 | $Si_1Ge_4H_2X_{10}$ |
| x = 1; y = 4; z = 12; a = 11 | $Si_1Ge_4H_1X_{11}$ |
| x = 1; y = 4; z = 12; a = 12 | $Si_1Ge_4H_0X_{12}$ |
| x = 2; y = 1; z = 8; a = 7 | $Si_2Ge_1H_1X_7$ |
| x = 2; y = 1; z = 8; a = 8 | $Si_2Ge_1H_0X_8$ |
| x = 2; y = 2; z = 10; a = 7 | $Si_2Ge_2H_3X_7$ |
| x = 2; y = 2; z = 10; a = 8 | $Si_2Ge_2H_2X_8$ |
| x = 2; y = 2; z = 10; a = 9 | $Si_2Ge_2H_1X_9$ |
| x = 2; y = 2; z = 10; a = 10 | $Si_2Ge_2H_0X_{10}$ |
| x = 2; y = 3; z = 12; a = 7 | $Si_2Ge_3H_5X_7$ |
| x = 2; y = 3; z = 12; a = 8 | $Si_2Ge_3H_4X_8$ |
| x = 2; y = 3; z = 12; a = 9 | $Si_2Ge_3H_3X_9$ |
| x = 2; y = 3; z = 12; a = 10 | $Si_2Ge_3H_2X_{10}$ |
| x = 2; y = 3; z = 12; a = 11 | $Si_2Ge_3H_1X_{11}$ |
| x = 2; y = 3; z = 12; a = 12 | $Si_2Ge_3H_0X_{12}$ |
| x = 3; y = 1; z = 10; a = 10 | $Si_3Ge_1H_0X_{10}$ |
| x = 3; y = 2; z = 12; a = 10 | $Si_3Ge_2H_2X_{10}$ |
| x = 3; y = 2; z = 12; a = 11 | $Si_3Ge_2H_1X_{11}$ |
| x = 3; y = 2; z = 12; a = 12 | $Si_3Ge_2H_0X_{12}$ |

In one embodiment of Method A1, X is chloro or bromo. In a preferred embodiment, X is chloro.

In one embodiment of Method A1, a is 1. In another embodiment of Method A1, a is 1 to 2(x+y). In another embodiment of Method A1, a is 2(x+y).

In another embodiment of Method A1, the sum of x and y is less than or equal to 4. In another embodiment of Method A1, the sum of x and y is less than or equal to 3. In another embodiment of Method A1, the sum of x and y is 2.

In another embodiment of Method A1, each Si and Ge atom has no more than two X bonded thereto.

In a preferred embodiment of Method A1, a is 1 to 2(x+y) and each Si and Ge atom has no more than two X bonded thereto.

In a preferred embodiment of Method A1, the compound of molecular Formula (XVII) is of formula (XVIII), $$SiGe_yH_{z-a}X_a \qquad (XVIII)$$

wherein y is 1, 2, 3, or 4; z is 2(y+2); a is 1 to z; and X is halogen, such a method is referred to hereafter as Method B1.

In one embodiment of Method B1, X is chloro or bromo. In a preferred embodiment, X is chloro.

In one embodiment of Method B1, a is 1. In another embodiment of Method B1, a is 1 to 2(1+y). In another embodiment of Method B1, a is 2(1+y).

In another embodiment of Method B1, y is 1, 2, or 3. In another embodiment of Method B1, y is 1 or 2. In another embodiment of Method B1, y is 1.

In another embodiment of Method B1, each Si and Ge atom has no more than two X bonded thereto.

In a preferred embodiment of Method B1, a is 1 to 2(1+y) and each Si and Ge atom has no more than two X bonded thereto.

In a preferred embodiment of Method B1, the compound of formula (LX) is $H_3SiGeH_3$, $H_2Si(GeH_3)_2$, or $HSi(GeH_3)_3$. In another preferred embodiment of Method B1, the compound of formula (LX) is $H_3GeSiH_2SiH_2GeH_3$.

In a preferred embodiment of Method B1, the compound of formula (LX) is $H_3SiGeH_3$, $H_2Si(GeH_3)_2$, or $HSi(GeH_3)_3$ and a is 1. In a preferred embodiment of Method B1, the compound of formula (LX) is $H_3SiGeH_3$, $H_2Si(GeH_3)_2$, or $HSi(GeH_3)_3$, and a is 2 or 3. In another preferred embodiment of Method B1, the compound of formula (LX) is $H_3GeSiH_2SiH_2GeH_3$ and a is 1 or 2.

In a preferred embodiment of Method B1, the compound of molecular Formula (XVII) is of formula (XIX), $$SiGe_yH_{z-a}Cl_a \qquad (XIX)$$

wherein y is 1, 2, 3, or 4; z is 2(y+2); a is 1 to z; such a method is referred to hereafter as Method C1.

In one embodiment of Method C1, a is 1. In another embodiment of Method C1, a is 1 to 2(1+y). In another embodiment of Method C1, a is 2(1+y).

In another embodiment of Method C1, y is 1, 2, or 3. In another embodiment of Method C1, y is 1 or 2. In another embodiment of Method C1, y is 1.

In another embodiment of Method C1, each Si and Ge atom has no more than two X bonded thereto.

In a preferred embodiment of Method C1, a is 1 to 2(1+y) and each Si and Ge atom has no more than two X bonded thereto.

In a preferred embodiment of Method C1, the compound of formula (LX) is $H_3SiGeH_3$, $H_2Si(GeH_3)_2$, or $HSi(GeH_3)_3$. In another preferred embodiment of Method C1, the compound of formula (LX) is $H_3GeSiH_2SiH_2GeH_3$.

In a preferred embodiment of Method C1, the compound of formula (LX) is $H_3SiGeH_3$, $H_2Si(GeH_3)_2$, or $HSi(GeH_3)_3$ and a is 1. In a preferred embodiment of Method C1, the compound of formula (LX) is $H_3SiGeH_3$, $H_2Si(GeH_3)_2$, or $HSi(GeH_3)_3$, and a is 2, 3, or 4. In another preferred embodiment of Method C1, the compound of formula (LX) is $H_3GeSiH_2SiH_2GeH_3$ and a is 1, 2, 3, or 4.

In a preferred embodiment of Method C1, the compound of molecular Formula (XVII) is of formula (XX), $$SiGeH_{6-a}Cl_a \qquad (XX)$$

wherein a is 1 to z; such a method is referred to hereafter as Method D1.

In one embodiment of Method D1, a is 1 to 4. In another embodiment of Method D1, a is 2. In another embodiment of Method D1, a is 1. In another embodiment of Method D1, a is 4.

In another embodiment of Method D1, each Si and Ge atom has no more than two X bonded thereto.

In a preferred embodiment of Method D1, a is 1 to 4 and each Si and Ge atom has no more than two X bonded thereto.

In a preferred embodiment of Method A1, the compound of molecular Formula (XVII) is of formula (XXI), $$Si_xGeH_{z-a}X_a \qquad (XXI)$$

wherein x is 1, 2, 3, or 4; z is 2(x+2); a is 1 to z; and X is halogen; such a method is referred to hereafter as Method E1.

In one embodiment of Method E1, X is chloro or bromo. In a preferred embodiment, X is chloro.

In one embodiment of Method E1, a is 1. In another embodiment of Method E1, a is 1 to 2(x+1). In another embodiment of Method E1, a is 2(x+1).

In another embodiment of Method E1, x is 1, 2, or 3. In another embodiment of Method E1, x is 1 or 2. In another embodiment of Method E1, x is 1.

In another embodiment of Method E1, each Si and Ge atom has no more than two X bonded thereto.

In a preferred embodiment of Method E1, a is 1 to 2(x+1) and each Si and Ge atom has no more than two X bonded thereto.

In a preferred embodiment of Method E1, the compound of molecular Formula (XVII) is of formula (XXII), $$Si_xGeH_{z-a}Cl_a \quad (XXII)$$

wherein x is 1, 2, 3, or 4; z is 2(x+2); a is 1 to 3x; and provided that each Cl is bonded only to Si; such a method is referred to hereafter as Method F1.

In one embodiment of Method F1, a is 1. In another embodiment of Method F1, a is 1 to 2(x+1). In another embodiment of Method F1, a is 2(x+1).

In another embodiment of Method F1, x is 1, 2, or 3. In another embodiment of Method F1, x is 1 or 2. In another embodiment of Method F1, x is 1.

In another embodiment of Method F1, each Si and Ge atom has no more than two X bonded thereto.

In a preferred embodiment of Method F1, a is 1 to 2(x+1) and each Si and Ge atom has no more than two X bonded thereto.

In another embodiment of the third aspect, the invention provides the method of any one of Methods A1-F1, further comprising the step of (ii) fractionally distilling the product of step (i).

In another embodiment of the third aspect, the invention provides the method of any one of Methods A1-F1, the compound of any of molecular Formulas (XVII)-(XXII) is treated with a compound of the formula $BX_3$. Preferably, the compound is $BCl_3$ or $BBr_3$. More preferably, the compound is $BCl_3$.

In another embodiment of the third aspect, the invention provides the method of any one of Methods A1-F1, wherein the reaction temperature is about −60° C. to about 10° C. In a preferred embodiment of the third aspect, the invention provides the method of any one of Methods A1-F1, wherein the reaction temperature is about −25° C. to about 5° C.

In another embodiment of the third aspect, the invention provides the method of any one of Methods A1-F1, wherein the compound of Formula (XVII) is $ClSiH_2GeH_3$ chloro(germyl)silane;
$Cl_2SiHGeH_3$ dichloro(germyl)silane;
$ClHSi(GeH_3)_2$ chloro(digermyl)silane;
$Cl_2Si(GeH_3)_2$ dichloro(digermyl)silane;
$ClSi(GeH_3)_3$ chloro(trigermyl)silane;
$ClHSiSiH_2(GeH_3)_2$ 1,2-digermyl-1-chlorodisilane;
$(ClHSi)_2(H_3Ge)_2$ 1,2-digermyl-1,2-dichlorodisilane;
$Cl_2SiSiH_2(GeH_3)_2$ 1,2-digermyl-1,1-dichlorodisilane;
$ClSiH_2GeH_2Cl$ chloro(chlorogermyl)silane;
$Cl_2SiHGeH_2Cl$ dichloro(chlorogermyl)silane;
$ClSiH_2GeHCl_2$ chloro(dichlorogermyl)silane; or
$Cl_2SiHGeHCl_2$ dichloro(dichlorogermyl)silane.

In a fourth aspect, the invention provides the compounds of any of Formulas (I)-(XXII) prepared according to any of the preceding embodiments of the first, second, and third aspects. In a preferred embodiment, the invention provides the substantially pure compound of any of Formulas (I)-(XXII) prepared according to any embodiment of any of the preceding aspects of the invention. In a more preferred embodiment, the invention provides the substantially pure compound of formula (III) or (XVIII) prepared according to any of the preceding embodiments. In a more preferred embodiment, the invention provides the substantially pure compound of formula (XIV) prepared according to any of the preceding embodiments. In a more preferred embodiment, the invention provides the substantially pure compound of formula (IV) or (XIX) prepared according to any of the preceding embodiments. In a more preferred embodiment, the invention provides the substantially pure compound of formula (XVI) prepared according to any of the preceding embodiments In a more preferred embodiment, the invention provides the substantially pure compound of formula (V) or (XX) prepared according to any of the preceding embodiments. In a more preferred embodiment, the invention provides the substantially pure compound of formula (VI) or (XXI) prepared according to any of the preceding embodiments. In a more preferred embodiment, the invention provides the substantially pure compound of formula (VII) or (XXII) prepared according to any of the preceding embodiments.

In a even more preferred embodiment, the invention provides the substantially pure compound which is chloro(germyl)silane or dichloro(germyl)silane, prepared according to any of the preceding embodiments.

In a fifth aspect, the invention provides a method for preparing a layer of the formula, $Si_dGe_{1-d}$, wherein d is greater than 0 and less than 1, on a substrate, comprising:

contacting the substrate with a chemical vapor comprising a compound of the molecular formula, $$Si_xGe_yH_{z-a}X_a \quad (I)$$

wherein x is 1, 2, 3, or 4; y is 1, 2, 3, or 4; z is 2(x+y+1); a is 1to 3x; and X is halogen, provided that (i) each X is bonded only to Si; and (ii) the sum of x and y is less than or equal to 5; such method is referred to hereafter as Method L.

In one embodiment of Method L, X is chloro or bromo. In a preferred embodiment, X is chloro.

In one embodiment of Method L, a is 1. In another embodiment of Method L, a is 3x.

In one embodiment of Method L, x is 1 and a is 3. In another embodiment of Method L, x is 1 and a is 1. In another embodiment of Method L, x is 1 and a is 2.

In another embodiment of Method L, x is 2 and a is 6. In another embodiment of Method L, x is 2 and a is 1. In another embodiment of Method L, x is 2 and a is 2.

In another embodiment of Method L, In another embodiment of Method L, x is 2, y is 1, and a is 1. In another embodiment of Method L, x is 2, y is 1, and a is 2. In another embodiment of Method L, x is 2, y is 1, and a is 3. In another embodiment of Method L, x is 2, y is 1, and a is 4.

In another embodiment of Method L, In another embodiment of Method L, x is 2, y is 2, and a is 1. In another embodiment of Method L, x is 2, y is 2, and a is 2. In another embodiment of Method L, x is 2, y is 2, and a is 3. In another embodiment of Method L, x is 2, y is 2, and a is 4.

In another embodiment of Method L, x is 3 and a is 9. In another embodiment of Method L, x is 3 and a is 1. In another embodiment of Method L, x is 3 and a is 2. In another embodiment of Method L, x is 3 and a is 3.

In another embodiment of Method L, x is 3 and y is 2. In another embodiment of Method L, x is 3, y is 2, and a is 1. In another embodiment of Method L, x is 3, y is 2 and a is 2. In another embodiment of Method L, x is 3, y is 2, and a is 3, 4, 5, or 6.

In another embodiment of Method L, x is 4 and a is 12. In another embodiment of Method L, x is 4 and a is 1. In another embodiment of Method L, x is 4 and a is 2. In another embodiment of Method L, x is 4 and a is 3. In another embodiment of Method L, x is 4 and a is 4.

In another embodiment of Method L, the sum of x and y is less than or equal to 4. In another embodiment of Method L, the sum of x and y is less than or equal to 3. In another embodiment of Method L, the sum of x and y is 2.

In a more preferred embodiment of Method L, the chemical vapor comprises a compound of the formula (III), $$SiGe_yH_{z-a}X_a \quad (III)$$

wherein y is 1, 2, 3, or 4; z is 2(y+2); a is 1 to 3; and X is halogen, provided that each X is bonded only to Si; such method is referred to hereafter as Method M.

In one embodiment of Method M, X is chloro or bromo. In a preferred embodiment, X is chloro.

In one embodiment of Method M, y is 1. In another embodiment of Method M, y is 2. In another embodiment of Method M, y is 3. In another embodiment of Method M, y is 4.

In one embodiment of Method M, a is 1. In another embodiment of Method M, a is 2. In another embodiment of Method M, a is 3.

In a preferred embodiment of Method M, y is 1 and a is 1. In another preferred embodiment of Method M, y is 1 and a is 2. In another preferred embodiment of Method M, y is 1 and a is 3.

In a preferred embodiment of Method M, y is 2 and a is 1. In another preferred embodiment of Method M, y is 2 and a is 2.

In a preferred embodiment of Method M, y is 3 and a is 1.

In a preferred embodiment of Method M, the chemical vapor comprises a compound of formula (IV), $$SiGe_yH_{z-a}Cl_a \quad (IV)$$

wherein y is 1, 2, 3, or 4; z is 2(y+2); a is 1 to 3; and provided that each Cl is bonded only to Si, such a method is referred to hereafter as Method N.

In one embodiment of Method N, y is 1. In another embodiment of Method N, y is 2. In another embodiment of Method N, y is 3. In another embodiment of Method N, y is 4.

In one embodiment of Method N, a is 1. In another embodiment of Method N, a is 2. In another embodiment of Method N, a is 3.

In a preferred embodiment of Method N, y is 1 and a is 1. In another preferred embodiment of Method N, y is 1 and a is 2. In another preferred embodiment of Method N, y is 1 and a is 3.

In a preferred embodiment of Method N, y is 2 and a is 1. In another preferred embodiment of Method N, y is 2 and a is 2.

In a preferred embodiment of Method N, y is 3 and a is 1.

In a preferred embodiment of Method N, the chemical vapor comprises a compound of formula (V), $$SiGeH_{6-a}Cl_a \quad (V)$$

wherein a is 1 to 3; and provided that each Cl is bonded only to Si, such a method is referred to hereafter as Method O.

In a more preferred embodiment of Method L, the chemical vapor comprises a compound of the formula (VI), $$Si_xGeH_{z-a}X_a \quad (VI)$$

wherein x is 1, 2, 3, or 4; z is 2(x+2); a is 1 to 3x; and X is halogen, provided that each X is bonded only to Si; such method is referred to hereafter as Method P.

In one embodiment of Method P, X is chloro or bromo. In a preferred embodiment, X is chloro.

In one embodiment of Method P, x is 1. In another embodiment of Method P, x is 2. In another embodiment of Method P, x is 3. In another embodiment of Method P, x is 4.

In one embodiment of Method P, a is 1. In another embodiment of Method P, a is 2. In another embodiment of Method P, a is 3.

In a preferred embodiment of Method P, x is 2 and a is 1. In another preferred embodiment of Method P, x is 3 and a is 1. In another preferred embodiment of Method P, x is 4 and a is 1.

In a preferred embodiment of Method P, x is 2 and a is 2. In another preferred embodiment of Method P, x is 3 and a is 2. In another preferred embodiment of Method P, x is 4 and a is 2.

In a preferred embodiment of Method P, the chemical vapor comprises a compound of formula (VII), $$Si_xGeH_{z-a}Cl_a \quad (VII)$$

wherein x is 1, 2, 3, or 4; z is 2(x+2); a is 1 to 3x; and provided that each Cl is bonded only to Si, such a method is referred to hereafter as Method Q.

In one embodiment of Method Q, x is 1. In another embodiment of Method Q, x is 2. In another embodiment of Method Q, x is 3. In another embodiment of Method Q, x is 4.

In one embodiment of Method Q, a is 1. In another embodiment of Method Q, a is 2. In another embodiment of Method Q, a is 3.

In a preferred embodiment of Method Q, x is 1 and a is 1. In another preferred embodiment of Method Q, x is 2 and a is 1. In another preferred embodiment of Method Q, x is 3 and a is 1. In another preferred embodiment of Method Q, x is 4 and a is 1.

In a preferred embodiment of Method Q, x is 1 and a is 2. In another preferred embodiment of Method Q, x is 2 and a is 2. In another preferred embodiment of Method Q, x is 3 and a is 2. In another preferred embodiment of Method Q, x is 4 and a is 2.

In a more preferred embodiment of Methods L-Q, the chemical vapor comprises a compound which is
  ClSiH$_2$GeH$_3$ chloro(germyl)silane;
  Cl$_2$SiHGeH$_3$ dichloro(germyl)silane;
  ClHSi(GeH$_3$)$_2$ chloro(digermyl)silane;
  Cl$_2$Si(GeH$_3$)$_2$ dichloro(digermyl)silane;
  ClSi(GeH$_3$)$_3$ chloro(trigermyl)silane;
  ClHSiSiH$_2$(GeH$_3$)$_2$ 1,2-digermyl-1-chlorodisilane;
  (ClHSi)$_2$(H$_3$Ge)$_2$ 1,2-digermyl-1,2-dichlorodisilane;
  Cl$_2$SiSiH$_2$(GeH$_3$)$_2$ 1,2-digermyl-1,1-dichlorodisilane;
    or mixtures thereof.

In a sixth aspect, the invention provides a method for preparing a substantially crystalline layer of the formula, Si$_d$Ge$_{1-d}$, wherein d is greater than 0 and less than 1, on a substrate, comprising:
  contacting the substrate with a chemical vapor comprising a compound of the molecular formula, $$Si_xGe_yH_{z-a}X_a \quad (XVII)$$

wherein x is 1, 2, 3, or 4; y is 1, 2, 3, or 4; z is 2(x+y+1); a is 1 to z; and X is halogen, provided that the sum of x and y is less than or equal to 5; such method is referred to hereafter as Method L1.

In one embodiment of Method L1, X is chloro or bromo. In a preferred embodiment, X is chloro.

In one embodiment of Method L1, a is 1. In another embodiment of Method L1, a is 1 to 2(x+y). In another embodiment of Method L1, a is 2(x+y).

In another embodiment of Method L1, the sum of x and y is less than or equal to 4. In another embodiment of Method L1, the sum of x and y is less than or equal to 3. In another embodiment of Method L1, the sum of x and y is 2.

In another embodiment of Method L1, each Si and Ge atom has no more than two X bonded thereto.

In a preferred embodiment of Method L1, a is 1 to 2(x+y) and each Si and Ge atom has no more than two X bonded thereto.

In a more preferred embodiment of Method L1, the chemical vapor comprises a compound of the formula (XVIII), $$SiGe_yH_{z-a}X_a \qquad (XVIII)$$

wherein y is 1, 2, 3, or 4; z is 2(y+2); a is 1 to 3; and X is halogen, provided that each X is bonded only to Si; such method is referred to hereafter as Method M1.

In one embodiment of Method M1, X is chloro or bromo. In a preferred embodiment, X is chloro.

In one embodiment of Method M1, a is 1. In another embodiment of Method M1, a is 1 to 2(1+y). In another embodiment of Method M1, a is 2(1+y).

In another embodiment of Method M1, y is 1, 2, or 3. In another embodiment of Method M1, y is 1 or 2. In another embodiment of Method M1, y is 1. In another embodiment of Method M1, y is 2.

In another embodiment of Method M1, y is 1 and a is 1. In another embodiment of Method M1, y is 1 and a is 2. In another embodiment of Method M1, y is 2. In another embodiment of Method M1, y is 2 and a is 1. In another embodiment of Method M1, y is 2 and a is 2.

In another embodiment of Method M1, each Si and Ge atom has no more than two X bonded thereto.

In a preferred embodiment of Method M1, a is 1 to 2(1+y) and each Si and Ge atom has no more than two X bonded thereto.

In a preferred embodiment of Method M1, the chemical vapor comprises a compound of formula (XIX), $$SiGe_yH_{z-a}Cl_a \qquad (XIX)$$

wherein y is 1, 2, 3, or 4; z is 2(y+2); a is 1 to 3; and provided that each Cl is bonded only to Si, such a method is referred to hereafter as Method N1.

In one embodiment of Method N1, a is 1. In another embodiment of Method N1, a is 1 to 2(1+y). In another embodiment of Method N1, a is 2(1+y).

In another embodiment of Method N1, y is 1, 2, or 3. In another embodiment of Method N1, y is 1 or 2. In another embodiment of Method N1, y is 1. In another embodiment of Method N1, y is 2.

In another embodiment of Method N1, y is 1 and a is 1. In another embodiment of Method N1, y is 1 and a is 2. In another embodiment of Method N1, y is 2. In another embodiment of Method N1, y is 2 and a is 1. In another embodiment of Method N1, y is 2 and a is 2.

In another embodiment of Method N1, each Si and Ge atom has no more than two X bonded thereto.

In a preferred embodiment of Method N1, a is 1 to 2(1+y) and each Si and Ge atom has no more than two X bonded thereto.

In a preferred embodiment of Method N1, the chemical vapor comprises a compound of formula (XX), $$SiGeH_{6-a}Cl_a \qquad (XX)$$

wherein a is 1 to 3; and provided that each Cl is bonded only to Si, such a method is referred to hereafter as Method O1.

In one embodiment of Method O1, a is 1. In another embodiment of Method O1, a is 1 to 4. In another embodiment of Method O1, a is 4.

In another embodiment of Method O1, each Si and Ge atom has no more than two X bonded thereto.

In a preferred embodiment of Method O1, a is 1 to 4 and each Si and Ge atom has no more than two X bonded thereto.

In a more preferred embodiment of Method L1, the chemical vapor comprises a compound of the formula (XXI), $$Si_xGeH_{z-a}X_a \qquad (XXI)$$

wherein x is 1, 2, 3, or 4; z is 2(x+2); a is 1 to 3x; and X is halogen, provided that each X is bonded only to Si; such method is referred to hereafter as Method P1.

In one embodiment of Method P1, X is chloro or bromo. In a preferred embodiment, X is chloro.

In one embodiment of Method P1, a is 1. In another embodiment of Method P1, a is 1 to 2(x+1). In another embodiment of Method P1, a is 2(x+1).

In another embodiment of Method P1, x is 1, 2, or 3. In another embodiment of Method P1, x is 1 or 2. In another embodiment of Method P1, x is 1.

In another embodiment of Method P1, each Si and Ge atom has no more than two X bonded thereto.

In a preferred embodiment of Method P1, a is 1 to 2(x+1) and each Si and Ge atom has no more than two X bonded thereto.

In a preferred embodiment of Method P1, the chemical vapor comprises a compound of formula (XXII), $$Si_xGeH_{z-a}Cl_a \qquad (XXII)$$

wherein x is 1, 2, 3, or 4; z is 2(x+2); a is 1 to 3x; and provided that each Cl is bonded only to Si, such a method is referred to hereafter as Method Q1.

In one embodiment of Method Q1, a is 1. In another embodiment of Method Q1, a is 1 to 2(x+1). In another embodiment of Method Q1, a is 2(x+1).

In another embodiment of Method Q1, x is 1, 2, or 3. In another embodiment of Method Q1, x is 1 or 2. In another embodiment of Method Q1, x is 1.

In another embodiment of Method Q1, each Si and Ge atom has no more than two X bonded thereto.

In a preferred embodiment of Method Q1, a is 1 to 2(x+1) and each Si and Ge atom has no more than two X bonded thereto.

In an embodiment of any one of Methods L-N or L1-N1 and preferred embodiments thereof, d is about 0.2 to about 0.5. In a preferred embodiment of any one of Methods L-N or L1-N1 and preferred embodiments thereof, d is about 0.2. In a preferred embodiment of any one of Methods L-N or L1-N1 and preferred embodiments thereof, d is about 0.25. In a preferred embodiment any one of Methods L-N or L1-N1 and preferred embodiments thereof, d is about 0.33. In a preferred embodiment of Methods any one of Methods L-Q or L1-Q1 and preferred embodiments thereof, d is about 0.50.

In an embodiment of any one of Methods L-Q or L1-Q1 and preferred embodiments thereof, the deposited layer of the formula $Si_dGe_{1-d}$ has the same empirical formula for silicon and germanium as the compound of Formula (I) or (XVII), e.g. wherein the layer is deposited using a compound of Formula (I), $Si_xGe_yH_{z-a}X_a$, the deposited layer has an empirical formula of $Si_xGe_y$. In a preferred embodiment, when the layer is deposited using a compound of formula (III) or (XVIII), $SiGe_yH_{z-a}X_a$, the deposited layer has an empirical formula of $SiGe_y$. In a preferred embodiment, when the layer is deposited using a compound of formula (IV) or (XIX), $SiGe_yH_{z-a}Cl_a$, the deposited layer has an empirical formula of $SiGe_y$. In a preferred embodiment, when the layer is deposited using a compound of formula (V) or (XX), $SiGeH_{6-a}Cl_a$, the deposited layer has an empirical formula of SiGe. In a preferred embodiment, when the layer is deposited using a compound of formula (VI) or (XXI), $Si_xGeH_{z-a}X_a$, the deposited layer has an empirical formula of $Si_xGe$. In a preferred embodiment, when the layer is deposited using a compound of formula (VII) or (XXII), $Si_xGeH_{z-a}Cl_a$, the deposited layer has an empirical formula of $Si_xGe$.

In a more preferred embodiment of Methods L1-Q1, the chemical vapor comprises a compound which is
ClSiH$_2$GeH$_3$ chloro(germyl)silane;
Cl$_2$SiHGeH$_3$ dichloro(germyl)silane;
ClHSi(GeH$_3$)$_2$ chloro(digermyl)silane;
Cl$_2$Si(GeH$_3$)$_2$ dichloro(digermyl)silane;
ClSi(GeH$_3$)$_3$ chloro(trigermyl)silane;
ClHSiSiH$_2$(GeH$_3$)$_2$ 1,2-digermyl-1-chlorodisilane;
(ClHSi)$_2$(H$_3$Ge)$_2$ 1,2-digermyl-1,2-dichlorodisilane;
Cl$_2$SiSiH$_2$(GeH$_3$)$_2$ 1,2-digermyl-1,1-dichlorodisilane;
ClSiH$_2$GeH$_2$Cl chloro(chlorogermyl)silane;
Cl$_2$SiHGeH$_2$Cl dichloro(chlorogermyl)silane;
ClSiH$_2$GeHCl$_2$ chloro(dichlorogermyl)silane;
Cl$_2$SiHGeHCl$_2$ dichloro(dichlorogermyl)silane;
or mixtures thereof.

In another preferred embodiment, when x and y both have the same value, i.e. both are 1 or 2, then the deposited layer has an empirical formula of SiGe.

In a preferred embodiment of any one of Methods L-Q or L1-Q1 and preferred embodiments thereof, the temperature is from about 200° C. to about 600° C. More preferably, the temperature is about 350° C. to about 450° C. Even more preferably, the temperature is about 400° C. to about 450° C.

In a preferred embodiment of any one of Methods L-Q or L1-Q1 and preferred embodiments thereof, the layer is substantially crystalline.

In a more preferred embodiment of any one of Methods L-Q or L1-Q1 and preferred embodiments thereof, the layer is substantially crystalline and the temperature is from about 200° C. to about 600° C. More preferably, the layer is substantially crystalline and the temperature is about 350° C. to about 450° C. Even more preferably, the layer is substantially crystalline and the temperature is about 400° C. to about 450° C.

Practical advantages associated with this low temperature/rapid growth process include (i) short deposition times compatible with preprocessed Si wafers, (ii) selective growth for application in high frequency devices, and (iii) negligible mass segregation of dopants, which is particularly critical for thin layers.

In a preferred embodiment of any one of Methods L-Q or L1-Q1 and preferred embodiments thereof, the substrate comprises any substrate suitable for semiconductor or flat panel display use, including but not limited to silicon, germanium, silicon on insulator, Ge:Sn alloys, SiO$_2$, sapphire, quartz, Si:Ge alloys, Si:C alloys, stainless steel, polyimide or other polymer films such as those used in the fabrication of flexible displays. In a more preferred embodiment of Methods any one of Methods L-Q or L1-Q1 and preferred embodiments thereof, the substrate comprises silicon. In a even more preferred embodiment, the substrate comprises Si(100).

In any one of Methods L-Q or L1-Q1 and preferred embodiments thereof, the compound of any one of Formulas (I)-(XXII) can be deposited by any suitable technique, including but not limited to gas source molecular beam epitaxy, chemical vapor deposition, plasma enhanced chemical vapor deposition, laser assisted chemical vapor deposition, and atomic layer deposition.

In any one of Methods L-Q or L1-Q1 and preferred embodiments thereof, the compound of any one of Formulas (I)-(XXII) is introduced at a partial pressure between about $10^{-8}$ Torr and 760 Torr. In one preferred embodiment, the chemical vapor is introduced at between $10^{-8}$ Torr and $10^{-5}$ Torr (corresponding to UHV vertical furnace technology). In another preferred embodiment, the chemical vapor is introduced at between $10^{-8}$ Torr and 100 Torr, corresponding to LPCVD conditions. In yet another preferred embodiment, the chemical vapor is introduced at between $10^{-3}$ Torr and 760 Torr.

In any one of Methods L-Q or L1-Q1 and preferred embodiments thereof, the compound of any one of Formulas (I)-(XXII) can be deposited under plasma-enhanced chemical vapor deposition (PECVD) conditions.

PECVD is a process to deposit thin films from a gas state (vapor) to a solid state on a substrate. The reactive chemical species involved in the process are generated by the creation of a plasma from the reacting gases. The plasma is generally created by RF (AC) frequency or DC discharge between two electrodes.

PECVD process parameters include flow rate, F, in standard cubic centimeters per minute (sccm), applied power, W, in Watts (W), resonant frequency in kilohertz (kHz), pressure in milliTorr (mTorr), substrate temperature in Celsius degrees (° C.) and geometrical factors such as size of chamber, electrode size, electrode orientation and distance from substrate, etc. The composite parameter, W/FM, or energy per unit mass of monomer was also used in this study. This composite parameter, expressed in MJ/kg, is calculated from the following expression $$W/FM(MJ/kg) = \frac{W(\text{Watt})}{F(\text{sccm}) \times M(\text{g/mol})} \times 1340$$

whereby M is the molecular weight of the precursor in g/mol.

In various other preferred embodiments, when the compound of any one of Formulas (I)-(XXII) is deposited under PECVD conditions, the substrate temperature is about 20° C. to about 600° C. More preferably, the temperature is about 20° C. to about 300° C. Even more preferably, the temperature is about 20° C. to about 250° C.

In various other preferred embodiments, when the compound of any one of Formulas (I)-(XXII) is deposited under PECVD conditions, the composite plasma parameter W/FM is <about 200 MJ/kg; more preferably <100 MJ/kg, and even more preferably <30 MJ/kg.

In various other preferred embodiments, the Si—Ge material is formed on the substrate as a partially to fully strain-relaxed layer having a planar surface; the composition of the Si—Ge material is substantially uniform; and/or the entire Si and Ge framework of the chemical vapor is incorporated into the Si—Ge material or epitaxial Si—Ge.

In various other preferred embodiments, the Si—Ge material is formed on the substrate as fully strained layer having a planar surface; the composition of the Si—Ge material is substantially uniform; and/or the entire Si and Ge framework of the chemical vapor is incorporated into the Si—Ge material or epitaxial Si—Ge.

In other preferred embodiments, the substantially crystalline Si—Ge material is formed on the substrate has a substantially single crystalline domain.

In a seventh aspect, the invention provides a compound according to formula (XXIV),

$$Si_xGe_yH_{z-a}X_a \qquad (XXIV)$$

wherein x is 1, 2, 3, or 4; y is 1, 2, 3, or 4; z is 2(x+y+1); a is 1 to 2(x+y), and X is halogen, provided that (i) the sum of x and y is less than or equal to 5; (ii) each Si and Ge atom has no more than two X groups bonded thereto; and (iii) the compound is not
bromo(germyl)silane;
difluoro(germyl)silane;
1,1,2,2,3,3-hexafluoro-(1-germyl)trisilane;
(difluorogermyl)difluorosilane;
dichloro(germyl)silane;
1,1,2,2-tetrafluoro-(1-germyl)disilane;
fluoro(fluorogermyl)silane;
fluoro(germyl)silane;
1,1-dichloro-(3-germyl)trisilane;
1,1-dichloro-(4-germyl)tetrasilane; and
1,1-dichloro-(2-germyl)disilane.

In one embodiment of the seventh aspect, the invention provides the compound of formula (XXIV), wherein a is 1. In another embodiment the invention provides the compound of formula (XXIV), wherein a is 2(x+y).

In one embodiment the invention provides the compound of formula (XXIV), wherein X is chloro or bromo. In a preferred embodiment, X is chloro.

In another embodiment the invention provides the compound of formula (XXIV), wherein the sum of x and y is less than or equal to 4. In another embodiment the invention provides the compound of formula (XXIV), wherein the sum of x and y is less than or equal to 3. In another embodiment the invention provides the compound of formula (XXIV), wherein the sum of x and y is 2.

In a preferred embodiment, the compound of Formula (XXIV) is of molecular formula (XXV),

$$SiGe_yH_{z-a}X_a \quad (XXV)$$

wherein y is 1, 2, 3, or 4; z is 2(y+2); a is 1 to 2(1+y); and X is halogen.

In one embodiment of Formula (XXV), X is chloro or bromo. In a preferred embodiment, X is chloro.

In another embodiment of Formula (XXV), a is 1. In another embodiment of Formula (XXV), a is 2(1+y).

In another embodiment Formula (XXV), y is 1, 2, or 3. In another embodiment of Formula (XXV), y is 1 or 2. In another embodiment of Formula (XXV), y is 1.

In a preferred embodiment, the compound of molecular Formula (XXV) is of formula (XXVI), $$SiGe_yH_{z-a}Cl_a \quad (XXVI)$$

wherein y is 1, 2, 3, or 4; z is 2(y+2); a is 1to 2(1+y).

In one embodiment of formula (XXVI), a is 1. In another embodiment formula (XXVI), a is 2(1+y).

In another embodiment formula (XXVI), y is 1, 2, or 3. In another embodiment of formula (XXVI), y is 1 or 2. In another embodiment of formula (XXVI), y is 1.

In a preferred embodiment, the compound of molecular Formula (XXVI) is of formula (XXVII),

$$SiGeH_{6-a}Cl_a \quad (XXVII)$$

wherein a is 1 to 4.

In one embodiment of formula (XXVII), a is 1. In another embodiment of formula (XXVII), a is 4.

In an embodiment of formula (XXIV), the compound is of formula (XXVIII),

$$Si_xGeH_{z-a}X_a \quad (XXVIII)$$

wherein x is 1, 2, 3, or 4; z is 2(x+2); a is 1 to 2(x+1); and X is halogen.

In one embodiment of formula (XXVIII), X is chloro or bromo. In a preferred embodiment, X is chloro.

In one embodiment of formula (XXVIII), a is 1. In another embodiment of formula (XXVIII), a is 2(x+1).

In another embodiment of formula (XXVIII), x is 1, 2, or 3. In another embodiment of formula (XXVIII), x is 1 or 2. In another embodiment of formula (XXVIII), x is 1.

In a preferred embodiment, the compound of molecular Formula (XXVIII) is of formula (XXIX),

$$Si_xGeH_{z-a}Cl_a \quad (XXIX)$$

wherein x is 1, 2, 3, or 4; z is 2(x+2); a is Ito 2(x+1).

In one embodiment of formula (XXIX), a is 1. In another embodiment of formula (XXIX), a is 2(x+1).

In another embodiment of formula (XXIX), x is 1, 2, or 3. In another embodiment of formula (XXIX), x is 1 or 2. In another embodiment of formula (XXIX), x is 1.

In a even more preferred embodiment, the invention provides the compound according to formula (XXIV) which is,

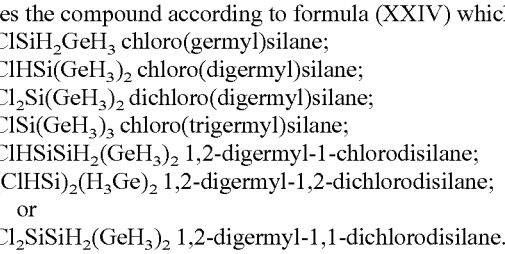

ClSiH$_2$GeH$_3$ chloro(germyl)silane;
ClHSi(GeH$_3$)$_2$ chloro(digermyl)silane;
Cl$_2$Si(GeH$_3$)$_2$ dichloro(digermyl)silane;
ClSi(GeH$_3$)$_3$ chloro(trigermyl)silane;
ClHSiSiH$_2$(GeH$_3$)$_2$ 1,2-digermyl-1-chlorodisilane;
(ClHSi)$_2$(H$_3$Ge)$_2$ 1,2-digermyl-1,2-dichlorodisilane; or
Cl$_2$SiSiH$_2$(GeH$_3$)$_2$ 1,2-digermyl-1,1-dichlorodisilane.

In a eighth aspect, the invention provides a substantially pure compound according to formula (XXIII),

$$SiGe_yH_{z-a}Cl_a \quad (XXIII)$$

wherein y is 1, 2, 3, or 4; z is 2(y+2); and a is 1 to 2(y+1), provided that each Si and Ge atom has no more than two X groups bonded thereto.

In a preferred embodiment, the invention provides the substantially pure compound of formula (XXIII), wherein a is 1. In a preferred embodiment, the invention provides the substantially pure compound of formula (XXIII), wherein a is 2.

In a preferred embodiment, the invention provides the substantially pure compound of formula (XXIII), wherein y is 1. In a preferred embodiment, the invention provides the substantially pure compound of formula (XXIII), wherein y is 2. In a preferred embodiment, the invention provides the substantially pure compound of formula (XXIII), wherein y is 3. In a preferred embodiment, the invention provides the substantially pure compound of formula (XXIII), wherein y is 4.

In a more preferred embodiment, the invention provides the substantially pure compound according to formula (XXIII), wherein y is 1 and a is 1. In a more preferred embodiment, the invention provides the substantially pure compound according to formula (XXIII), wherein y is 2 and a is 1. In a more preferred embodiment, the invention provides the substantially pure compound according to formula (XXIII), wherein y is 3 and a is 1. In a more preferred embodiment, the invention provides the substantially pure compound according to formula (XXIII), wherein y is 4 and a is 1.

In a more preferred embodiment, the invention provides the substantially pure compound according to formula (XXIII), wherein y is 1 and a is 2. In a more preferred embodiment, the invention provides the substantially pure compound according to formula (XXIII), wherein y is 2 and a is 2. In a more preferred embodiment, the invention provides the substantially pure compound according to formula (XXIII), wherein y is 3 and a is 2. In a more preferred embodiment, the invention provides the substantially pure compound according to formula (XXIII), wherein y is 4 and a is 2.

In a even more preferred embodiment, the invention provides the substantially pure compound according to formula (XXIII), which is chloro(germyl)silane or dichloro(germyl)silane.

As shown herein, the halosilylgermane compounds of any of Formulas (I)-(XXIV) are especially useful for fabricating $Si_dGe_{1-d}$ semiconductor alloys at unprecedented low temperatures that display homogeneous compositional and strain profiles, low threading dislocation densities and atomically planar surfaces. Controlled depositions have produced stoichiometric $Si_dGe_{1-d}$ films reflecting the Si/Ge content of the precursor, and possessing the desired properties for semiconductor applications including perfectly crystalline and epitaxial microstructures, smooth morphologies, and uniformly strain-relaxed states. Controlled depositions have also produced stoichiometric $Si_dGe_{1-d}$ films reflecting the Si/Ge content of the precursor, and possessing perfectly crystalline and epitaxial microstructures, smooth morphologies, and fully strained states.

In a preferred embodiment, the semiconductor substrates of this aspect of the invention have a deposited $Si_dGe_{1-d}$ layer which comprises a $Si_dGe_{1-d}$ film having a thickness of less than one micron, more preferably a thickness in a range from 50 nm to 500 nm. In a further preferred embodiment, the semiconductor substrates of this second aspect have an $Si_dGe_{1-d}$ layer comprising an $Si_dGe_{1-d}$ film having a density of threading defects of $10^6/cm^2$ or less. In a further preferred embodiment, the semiconductor substrates of this aspect of the invention comprise an $Si_dGe_{1-d}$ film having a substantially atomically planar surface morphology.

In various embodiments, the chemical vapor comprises or consists of one or more of the compounds listed in Table 2, each in n or g forms, and stereoisomers thereof.

The semiconductor structure may further comprise other features as desired, including but not limited to the inclusion of dopants, such as boron, phosphorous, arsenic, and antimony. These embodiments are especially preferred for semiconductor substrates used as active devices. Inclusion of such dopants into the semiconductor substrates can be carried out by standard methods in the art.

In a further embodiment, the semiconductor structure may further comprise varying quantities if carbon or tin, as desired for a given application. Inclusion of carbon or tin into the semiconductor substrates can be carried out by standard methods in the art. The carbon can be used to reduce the mobility of the dopants in the structure and more specifically boron. Incorporation of Sn can yield materials with novel optical properties such as direct emission and absorption leading to the formation of Si-based lasers and high sensitivity infrared photodetectors.

In a ninth aspect, the invention provides a chemical vapor, comprising one or more compounds according to any of Formulas (I)-(XXIV) and a second gas. Such second gases include, but are not limited to, $H_2$, He, $N_2$, argon, and mixtures thereof; preferably, the second gas comprises $H_2$. Preferred embodiments are as described above.

By using the compounds of any of Formulas (I)-(XXIV) as precursors for preparing semiconductor substrates, the semiconductor substrate will comprise an Si—Ge layer comprising or consisting of a backbone of the compounds of the invention. By using the compounds of the invention, as opposed to the separate use of Si and Ge sources for deposition, the resulting Si—Ge layer comprises highly defined and uniform bonding arrangements and strain compensated Si—Ge atomic patterns, as opposed to the random nature of prior Si—Ge films in which the Si and Ge atoms can exist as an intimate mixture of several (or multi) atom Si and Ge clusters leading to inhomogeneous bonding and locally stressed configurations. In mismatched heteroepitaxy applications these materials exhibit copious dislocations (at levels unacceptable for most device applications), strain non-uniformities and high surface roughness. A distinct and important advantage of our compounds, films, and methods over conventional ones is that the incorporation of the entire Si—Ge molecular core promotes the formation of exceptionally uniform bonding arrangements over the entire crystal, leading to relaxed (or uniformly stressed) films with planar surface morphology (no surface ripples). A crucial advantage is the unprecedented low growth temperatures which reduce surface mobility of the Si and Ge atoms and prevent mass segregation thereby resulting in highly uniform compositional and strain profiles at the atomic level.

The intact incorporation of the massive Si/Ge cores into the film also leads to low surface diffusion and high sticking coefficients compared to the conventional low mass compounds. The high reactivity promotes high growth rates which increase systematically with the mass of the precursors Furthermore, the incorporation of the entire Si/Ge framework of the chemical vapor into the lattice is particularly important in the formations of $Si_dGe_{1-d}$ nanoscale systems (quantum dots and wires) because it allows precise control of morphology, tunable composition, and structure that cannot be accomplished by vapor deposition of separate silanes and germanes, or by molecular beam epitaxy of solid Si and Ge sources. The precise control of composition and corresponding morphology, both of which ultimately determine the physical properties of these nanoscale materials is a crucial issue. Any compositional variations that exist within and among individual nanostructures will have a significant impact on the optical and electronic properties and on the performance of devices. In the MBE case an average concentration is assigned on the basis of the flux ratio utilized to grow the materials. In the CVD approach the local stoichiometry on the scale of the nanostructure size is even less certain because reactions of various molecular sources cannot be simultaneously controlled at every site throughout the sample. Thus neither technique can guarantee systematic growth of Si—Ge nanoscale structures with controllable composition, strain and size.

Such highly defined patterns can be determined using standard methods in the art, such as neutron diffraction.

In further aspect, the invention provides semiconductor structures, comprising a substrate and an Si—Ge layer comprising or consisting of a backbone of one or more compounds according to any one of the formulas (I)-(XXIV). Preferred embodiments are as described above.

In another aspect, the invention provides methods for the selective deposition of a $Si_dGe_{1-d}$ layer comprising contacting a substrate having a surface layer comprising at least two portions, wherein a first portion of the surface layer comprises a semiconductor surface layer and a second portion of the surface layer comprises an oxide, nitride, or oxynitride surface layer, with a chemical vapor comprising or consisting of a compound of formula (I), as defined above, under conditions sufficient to selectively deposit a $Si_dGe_{1-d}$ layer, having a predetermined thickness and at a predetermined rate, over only the first portion of the surface.

According to the methods of the invention, the $Si_dGe_{1-d}$ layer can be selectively deposited by any method known to those skilled in the art utilizing a gas source comprising a compound of formula (I), as defined above. Preferably, the $Si_dGe_{1-d}$ layer is selectively deposited. More preferably, d is less than 0.55, for example, about 0.05-0.55. In certain embodiments, d is about 0.45-0.55. In certain other embodiments, d is about 0.20-0.30.

In one embodiment, present invention provides methods for selectively depositing a $Si_dGe_{1-d}$ material on a substrate in a reaction chamber, comprising introducing into the chamber a chemical vapor comprising or consisting of one or more compounds according to formula (I), under conditions whereby a layer comprising a $Si_dGe_{1-d}$ material is selectively formed on the substrate.

In another embodiment, the present invention provides methods for selectively depositing an epitaxial $Si_dGe_{1-d}$ layer on a substrate, comprising introducing near a surface of the substrate a chemical vapor comprising or consisting of one or more compounds according to formula (I), and dehydrogenating and/or dehalogenating the precursor under conditions whereby epitaxial $Si_dGe_{1-d}$ is selectively formed on only the first portion of the substrate surface.

In any embodiment, the substrate can be any substrate suitable for semiconductor or flat panel display use, having a surface layer comprising at least two portions, wherein at least a first portion of the surface layer comprises a semiconductor surface layer and a second portion of the surface layer comprises an oxide, nitride, or oxynitride surface layer. It has been unexpectedly been discovered that upon exposure of such substrates to a chemical vapor comprising a compound of formula (I), that the $Si_dGe_{1-d}$ layer formed thereon selectively deposits only on the first portion of the substrate, wherein the second portion of the substrate is essentially free of the $Si_dGe_{1-d}$ alloy. "Essentially free" as used herein means that the alloy is not detectable on the second portion of the substrate as measured by microraman spectroscopy at a resolution of 1 μm, according to methods known to those skilled in the art.

As used herein, a "semiconductor surface layer" means a layer of an elemental or alloy material having semiconducting properties that is part of or formed on top of a substrate. Examples of materials having semiconducting properties include, but are not limited to, Si, Ge, SiGe GeSn, SiGeSn, SiGeC, $Si_{1-x}C_x$, As used herein, an "oxide, nitride, or oxynitride surface layer" means a layer of an oxide, nitride, or oxynitride chemical compound (i.e., not a semiconductor surface layer as defined herein) that is part of or formed on top of a substrate. Such oxide, nitride, or oxynitride chemical compounds can be conducting, semiconducting, or insulating. Examples of oxide, nitride, or oxynitride chemical compounds include, but are not limited to, $SiO_2$, $GeO_2$, $Si_3N_4$, SiON, and GeON.

For example, the first portion of the substrate layer can comprise silicon, germanium, silicon on insulator, Ge:Sn alloys, Si:Ge alloys, Si:C alloys, elemental Si, or elemental Ge. The second portion of the substrate surface can comprise oxide, nitride, or oxynitride surface layer, for example, $SiO_2$, sapphire, quartz, $GeO_2$, $Si_3N_4$, SiON, $Ge_3N_4$, GeON, $Ta_2O_5$, $ZrO_2$, and $TiO_2$. In a preferred embodiment, the first portion of the substrate comprises Si(100) or Si(111). More preferably, the first portion of the substrate comprises Si(100), such as, but not limited to, n-doped or p-doped Si(100).

Embodiments of the chemical vapors are as described above for previous aspects of the invention. For example, the methods may further comprise adding a dopant on the substrate, including but not limited to the inclusion of dopants, such as boron, phosphorous, arsenic, and antimony. These embodiments are especially preferred for semiconductor substrates used as active devices. Inclusion of such dopants into the semiconductor substrates can be carried out by standard methods in the art. For example, dopants can be included according to the methods described in U.S. Pat. No. 7,238,596, which is hereby incorporated by reference.

"Doping" as used herein refers to the process of intentionally introducing impurities into an intrinsic semiconductors in order to change its electrical properties. Low doping levels are typically on the order of 1 dopant atom for about every $10^{8-9}$ atoms; high doping levels are typically on the order of 1 dopant atom in $10^4$ atoms.

In another embodiment, the methods comprise adding varying quantities if carbon or tin to the semiconductor substrate or semiconductor surface layer. Inclusion of carbon or tin into the semiconductor substrates can be carried out by standard methods in the art. The carbon can be used to reduce the mobility of the dopants in the structure and more specifically boron. Incorporation of Sn can yield materials with novel optical properties such as direct emission and absorption leading to the formation of Si-based lasers and high sensitivity infrared photodetectors.

As demonstrated herein, the halosilylgermanes can be used to deposit device quality layers on substrates that display homogeneous compositional and strain profiles, low threading dislocation densities and atomically planar (i.e., flat) surfaces.

In a preferred embodiment, the chemical vapor can be introduced in substantially pure form. In a further preferred embodiment, the chemical vapor can be introduced as a single gas source.

In another embodiment, the chemical vapor can be introduced intermixed with an inert carrier gas. In this embodiment, the inert gas can be, for example, $H_2$, He, $N_2$, argon, or mixtures thereof. Preferably, the inert gas is $H_2$ or $N_2$.

In these aspects, the chemical vapor can be deposited by any suitable technique, including but not limited to gas source molecular beam epitaxy, chemical vapor deposition, plasma enhanced chemical vapor deposition, laser assisted chemical vapor deposition, and atomic layer deposition.

In various further embodiments, the selective depositing is performed at a predetermined rate of greater than about 2.0 nm/min. Preferably, the predetermined rate is about 2.0-10.0 nm/min. Such layers preferably have a predetermined thickness is about 25-300 nm.

Halosilylgermanes that are useful according to the invention include any conformational form of the compound, including but not limited to n, g, and iso-forms of the compounds, and combinations thereof, as described previously with respect to the previous aspects of the invention.

In one embodiment, the invention provides the method wherein the chemical vapor comprises a compound of the molecular formula,

$$Si_xGe_yH_{z-a}X_a \qquad (I)$$

wherein x is 1, 2, 3, or 4; y is 1, 2, 3, or 4; z is 2(x+y+1); a is 1 to 3x; and X is halogen, provided that (i) each X is bonded only to Si; and (ii) the sum of x and y is less than or equal to 5; such method is referred to hereafter as Method L2.

In one embodiment of Method L2, X is chloro or bromo. In a preferred embodiment, X is chloro.

In one embodiment of Method L2, a is 1. In another embodiment of Method L2, a is 3x.

In one embodiment of Method L2, x is 1 and a is 3. In another embodiment of Method L2, x is 1 and a is 1. In another embodiment of Method L2, x is 1 and a is 2.

In another embodiment of Method L2, x is 2 and a is 6. In another embodiment of Method L2, x is 2 and a is 1. In another embodiment of Method L2, x is 2 and a is 2.

In another embodiment of Method L2, x is 2, y is 1, and a is 1. In another embodiment of Method L2, x is 2, y is 1, and a is 2. In another embodiment of Method L2, x is 2, y is 1, and a is 3. In another embodiment of Method L2, x is 2, y is 1, and a is 4.

In another embodiment of Method L2, x is 2, y is 2, and a is 1. In another embodiment of Method L2, x is 2, y is 2, and a is 2. In another embodiment of Method L2, x is 2, y is 2, and a is 3. In another embodiment of Method L2, x is 2, y is 2, and a is 4.

In another embodiment of Method L2, x is 3 and a is 9. In another embodiment of Method L2, x is 3 and a is 1. In another embodiment of Method L2, x is 3 and a is 2. In another embodiment of Method L2, x is 3 and a is 3.

In another embodiment of Method L2, x is 3 and y is 2. In another embodiment of Method L2, x is 3, y is 2, and a is 1. In another embodiment of Method L2, x is 3, y is 2 and a is 2. In another embodiment of Method L2, x is 3, y is 2, and a is 3, 4, 5, or 6.

In another embodiment of Method L2, x is 4 and a is 12. In another embodiment of Method L2, x is 4 and a is 1. In another embodiment of Method L2, x is 4 and a is 2. In another embodiment of Method L2, x is 4 and a is 3. In another embodiment of Method L2, x is 4 and a is 4.

In another embodiment of Method L2, the sum of x and y is less than or equal to 4. In another embodiment of Method L2, the sum of x and y is less than or equal to 3. In another embodiment of Method L2, the sum of x and y is 2.

In a more preferred embodiment of Method L2, the chemical vapor comprises a compound of the formula (III),

wherein y is 1, 2, 3, or 4; z is 2(y+2); a is I to 3; and X is halogen, provided that each X is bonded only to Si; such method is referred to hereafter as Method M2.

In one embodiment of Method M2, X is chloro or bromo. In a preferred embodiment, X is chloro.

In one embodiment of Method M2, y is 1. In another embodiment of Method M2, y is 2. In another embodiment of Method M2, y is 3. In another embodiment of Method M2, y is 4.

In one embodiment of Method M2, a is 1. In another embodiment of Method M2, a is 2. In another embodiment of Method M2, a is 3.

In a preferred embodiment of Method M2, y is 1 and a is 1. In another preferred embodiment of Method M2, y is 1 and a is 2. In another preferred embodiment of Method M2, y is 1 and a is 3.

In a preferred embodiment of Method M2, y is 2 and a is 1. In another preferred embodiment of Method M2, y is 2 and a is 2.

In a preferred embodiment of Method M2, y is 3 and a is 1.

In a preferred embodiment of Method M2, the chemical vapor comprises a compound of formula (IV),

wherein y is 1, 2, 3, or 4; z is 2(y+2); a is 1 to 3; and provided that each Cl is bonded only to Si, such a method is referred to hereafter as Method N2.

In one embodiment of Method N2, y is 1. In another embodiment of Method N2, y is 2. In another embodiment of Method N2, y is 3. In another embodiment of Method N2, y is 4.

In one embodiment of Method N2, a is 1. In another embodiment of Method N2, a is 2. In another embodiment of Method N2, a is 3.

In a preferred embodiment of Method N2, y is 1 and a is 1. In another preferred embodiment of Method N, y is 1 and a is 2. In another preferred embodiment of Method N2, y is 1 and a is 3.

In a preferred embodiment of Method N2, y is 2 and a is 1. In another preferred embodiment of Method N2, y is 2 and a is 2.

In a preferred embodiment of Method N2, y is 3 and a is 1.

In a preferred embodiment of Method N2, the chemical vapor comprises a compound of formula (V),

wherein a is 1 to 3; and provided that each Cl is bonded only to Si, such a method is referred to hereafter as Method O2.

In a more preferred embodiment of Method L2, the chemical vapor comprises a compound of the formula (VI),

wherein x is 1, 2, 3, or 4; z is 2(x+2); a is I to 3x; and X is halogen, provided that each X is bonded only to Si; such method is referred to hereafter as Method P2.

In one embodiment of Method P2, X is chloro or bromo. In a preferred embodiment, X is chloro.

In one embodiment of Method P2, x is 1. In another embodiment of Method P2, x is 2. In another embodiment of Method P2, x is 3. In another embodiment of Method P2, x is 4.

In one embodiment of Method P, a is 1. In another embodiment of Method P2, a is 2. In another embodiment of Method P2, a is 3.

In a preferred embodiment of Method P2, x is 2 and a is 1. In another preferred embodiment of Method P2, x is 3 and a is 1. In another preferred embodiment of Method P2, x is 4 and a is 1.

In a preferred embodiment of Method P2, x is 2 and a is 2. In another preferred embodiment of Method P2, x is 3 and a is 2. In another preferred embodiment of Method P2, x is 4 and a is 2.

In a preferred embodiment of Method P2, the chemical vapor comprises a compound of formula (VII),

wherein x is 1, 2, 3, or 4; z is 2(x+2); a is 1 to 3x; and provided that each Cl is bonded only to Si, such a method is referred to hereafter as Method Q2.

In one embodiment of Method Q2, x is 1. In another embodiment of Method Q2, x is 2. In another embodiment of Method Q2, x is 3. In another embodiment of Method Q2, x is 4.

In one embodiment of Method Q2, a is 1. In another embodiment of Method Q2, a is 2. In another embodiment of Method Q2, a is 3.

In a preferred embodiment of Method Q2, x is 1 and a is 1. In another preferred embodiment of Method Q2, x is 2 and a is 1. In another preferred embodiment of Method Q2, x is 3 and a is 1. In another preferred embodiment of Method Q, x is 4 and a is 1.

In a preferred embodiment of Method Q2, x is 1 and a is 2. In another preferred embodiment of Method Q2, x is 2 and a is 2. In another preferred embodiment of Method Q2, x is 3 and a is 2. In another preferred embodiment of Method Q2, x is 4 and a is 2.

In a more preferred embodiment of Methods L2-Q2, the chemical vapor comprises a compound which is ClSiH$_2$GeH$_3$ chloro(germyl)silane;
Cl$_2$SiHGeH$_3$ dichloro(germyl)silane;
ClHSi(GeH$_3$)$_2$ chloro(digermyl)silane;

Cl$_2$Si(GeH$_3$)$_2$ dichloro(digermyl)silane;
ClSi(GeH$_3$)$_3$ chloro(trigermyl)silane;
ClHSiSiH$_2$(GeH$_3$)$_2$ 1,2-digermyl-1-chlorodisilane;
(ClHSi)$_2$(H$_3$Ge)$_2$ 1,2-digermyl-1,2-dichlorodisilane;
Cl$_2$SiSiH$_2$(GeH$_3$)$_2$ 1,2-digermyl-1,1-dichlorodisilane;
or mixtures thereof.

In another embodiment, the invention provides methods wherein the chemical vapor comprises a compound of the molecular formula, $$Si_xGe_yH_{z-a}X_a \qquad (XVII)$$

wherein x is 1, 2, 3, or 4; y is 1, 2, 3, or 4; z is 2(x+y+1); a is 1 to z; and X is halogen, provided that the sum of x and y is less than or equal to 5; such method is referred to hereafter as Method L3.

In one embodiment of Method L3, X is chloro or bromo. In a preferred embodiment, X is chloro.

In one embodiment of Method L3, a is 1. In another embodiment of Method L3, a is 1 to 2(x+y). In another embodiment of Method L3, a is 2(x+y).

In another embodiment of Method L3, the sum of x and y is less than or equal to 4. In another embodiment of Method L3, the sum of x and y is less than or equal to 3. In another embodiment of Method L3, the sum of x and y is 2.

In another embodiment of Method L3, each Si and Ge atom has no more than two X bonded thereto.

In a preferred embodiment of Method L3, a is 1 to 2(x+y) and each Si and Ge atom has no more than two X bonded thereto.

In a more preferred embodiment of Method L3, the chemical vapor comprises a compound of the formula (XVIII), $$SiGe_yH_{z-a}X_a \qquad (XVIII)$$

wherein y is 1, 2, 3, or 4; z is 2(y+2); a is 1 to 3; and X is halogen, provided that each X is bonded only to Si; such method is referred to hereafter as Method M3.

In one embodiment of Method M3, X is chloro or bromo. In a preferred embodiment, X is chloro.

In one embodiment of Method M3, a is 1. In another embodiment of Method M3, a is 1 to 2(1+y). In another embodiment of Method M3, a is 2(1+y).

In another embodiment of Method M3, y is 1, 2, or 3. In another embodiment of Method M3, y is 1 or 2. In another embodiment of Method M3, y is 1. In another embodiment of Method M3, y is 2.

In another embodiment of Method M3, y is 1 and a is 1. In another embodiment of Method M3, y is 1 and a is 2. In another embodiment of Method M3, y is 2. In another embodiment of Method M3, y is 2 and a is 1. In another embodiment of Method M3, y is 2 and a is 2.

In another embodiment of Method M3, each Si and Ge atom has no more than two X bonded thereto.

In a preferred embodiment of Method M3, a is 1 to 2(1+y) and each Si and Ge atom has no more than two X bonded thereto.

In a preferred embodiment of Method M3, the chemical vapor comprises a compound of formula (XIX), $$SiGe_yH_{z-a}Cl_a \qquad (XIX)$$

wherein y is 1, 2, 3, or 4; z is 2(y+2); a is 1 to 3; and provided that each Cl is bonded only to Si, such a method is referred to hereafter as Method N3.

In one embodiment of Method N1, a is 1. In another embodiment of Method N3, a is 1 to 2(1+y). In another embodiment of Method N3, a is 2(1+y).

In another embodiment of Method N3, y is 1, 2, or 3. In another embodiment of Method N3, y is 1 or 2. In another embodiment of Method N3, y is 1. In another embodiment of Method N3, y is 2.

In another embodiment of Method N3, y is 1 and a is 1. In another embodiment of Method N3, y is 1 and a is 2. In another embodiment of Method N3, y is 2. In another embodiment of Method N3, y is 2 and a is 1. In another embodiment of Method N3, y is 2 and a is 2.

In another embodiment of Method N3, each Si and Ge atom has no more than two X bonded thereto.

In a preferred embodiment of Method N3, a is 1 to 2(1+y) and each Si and Ge atom has no more than two X bonded thereto.

In a preferred embodiment of Method N3, the chemical vapor comprises a compound of formula (XX), $$SiGeH_{6-a}Cl_a \qquad (XX)$$

wherein a is 1 to 3; and provided that each Cl is bonded only to Si, such a method is referred to hereafter as Method O3.

In one embodiment of Method O3, a is 1. In another embodiment of Method O3, a is 1 to 4. In another embodiment of Method O3, a is 4.

In another embodiment of Method O3, each Si and Ge atom has no more than two X bonded thereto.

In a preferred embodiment of Method O3, a is 1 to 4 and each Si and Ge atom has no more than two X bonded thereto.

In a more preferred embodiment of Method L3, the chemical vapor comprises a compound of the formula (XXI), $$Si_xGeH_{z-a}X_a \qquad (XXI)$$

wherein x is 1, 2, 3, or 4; z is 2(x+2); a is 1 to 3x; and X is halogen, provided that each X is bonded only to Si; such method is referred to hereafter as Method P3.

In one embodiment of Method P3, X is chloro or bromo. In a preferred embodiment, X is chloro.

In one embodiment of Method P3, a is 1. In another embodiment of Method P3, a is 1 to 2(x+1). In another embodiment of Method P3, a is 2(x+1).

In another embodiment of Method P3, x is 1, 2, or 3. In another embodiment of Method P3, x is 1 or 2. In another embodiment of Method P3, x is 1.

In another embodiment of Method P3, each Si and Ge atom has no more than two X bonded thereto.

In a preferred embodiment of Method P3, a is 1 to 2(x+1) and each Si and Ge atom has no more than two X bonded thereto.

In a preferred embodiment of Method P3, the chemical vapor comprises a compound of formula (XXII), $$Si_xGeH_{z-a}Cl_a \qquad (XXII)$$

wherein x is 1, 2, 3, or 4; z is 2(x+2); a is 1 to 3x; and provided that each Cl is bonded only to Si, such a method is referred to hereafter as Method Q3.

In one embodiment of Method Q3, a is 1. In another embodiment of Method Q3, a is 1 to 2(x+1). In another embodiment of Method Q3, a is 2(x+1).

In another embodiment of Method Q3, x is 1, 2, or 3. In another embodiment of Method Q1, x is 1 or 2. In another embodiment of Method Q3, x is 1.

In another embodiment of Method Q3, each Si and Ge atom has no more than two X bonded thereto.

In a preferred embodiment of Method Q3, a is 1 to 2(x+1) and each Si and Ge atom has no more than two X bonded thereto.

In an embodiment of any one of Methods L2-N2 or L3-N3 and preferred embodiments thereof, d is about 0.2 to about 0.5. In a preferred embodiment of any one of Methods L2-N2 or L3-N3 and preferred embodiments thereof, d is about 0.2. In a preferred embodiment of any one of Methods L2-N2 or L3-N3 and preferred embodiments thereof, d is about 0.25. In a preferred embodiment any one of Methods L2-N2 or L3-N3 and preferred embodiments thereof, d is about 0.33. In a preferred embodiment of Methods any one of Methods L2-Q2 or L3-Q3 and preferred embodiments thereof, d is about 0.50.

In an embodiment of any one of Methods L2-Q2 or L3-Q3 and preferred embodiments thereof, the deposited layer of the formula $Si_dGe_{1-d}$ has the same empirical formula for silicon and germanium as the compound of Formula (I) or (XVII), e.g. wherein the layer is deposited using a compound of Formula (I), $Si_xGe_yH_{z-a}X_a$, the deposited layer has an empirical formula of $Si_xGe_y$. In a preferred embodiment, when the layer is deposited using a compound of formula (III) or (XVIII), $SiGe_yH_{z-a}X_a$, the deposited layer has an empirical formula of $SiGe_y$. In a preferred embodiment, when the layer is deposited using a compound of formula (IV) or (XIX), $SiGe_yH_{z-a}Cl_a$, the deposited layer has an empirical formula of $SiGe_y$. In a preferred embodiment, when the layer is deposited using a compound of formula (V) or (XX), $SiGeH_{6-a}Cl_a$, the deposited layer has an empirical formula of SiGe. In a preferred embodiment, when the layer is deposited using a compound of formula (VI) or (XXI), $Si_xGeH_{z-a}X_a$, the deposited layer has an empirical formula of $Si_xGe$. In a preferred embodiment, when the layer is deposited using a compound of formula (VII) or (XXII), $Si_xGeH_{z-a}Cl_a$, the deposited layer has an empirical formula of $Si_xGe$.

In a more preferred embodiment of Methods L3-Q3, the chemical vapor comprises a compound which is $ClSiH_2GeH_3$ chloro(germyl)silane;
$Cl_2SiHGeH_3$ dichloro(germyl)silane;
$ClHSi(GeH_3)_2$ chloro(digermyl)silane;
$Cl_2Si(GeH_3)_2$ dichloro(digermyl)silane;
$ClSi(GeH_3)_3$ chloro(trigermyl)silane;
$ClHSiSiH_2(GeH_3)_2$ 1,2-digermyl-1-chlorodisilane;
$(ClHSi)_2(H_3Ge)_2$ 1,2-digermyl-1,2-dichlorodisilane;
$Cl_2SiSiH_2(GeH_3)_2$ 1,2-digermyl-1,1-dichlorodisilane;
$ClSiH_2GeH_2Cl$ chloro(chlorogermyl)silane;
$Cl_2SiHGeH_2Cl$ dichloro(chlorogermyl)silane;
$ClSiH_2GeHCl_2$ chloro(dichlorogermyl)silane;
$Cl_2SiHGeHCl_2$ dichloro(dichlorogermyl)silane;
or mixtures thereof.

In another preferred embodiment, when x and y both have the same value, i.e. both are 1 or 2, then the deposited layer has an empirical formula of SiGe.

In a preferred embodiment of any one of Methods L2-Q2 or L3-Q3 and preferred embodiments thereof, the temperature is from about 200° C. to about 600° C. More preferably, the temperature is about 350° C. to about 450° C. Even more preferably, the temperature is about 400° C. to about 450° C.

In a preferred embodiment of any one of Methods L2-Q2 or L3-Q3 and preferred embodiments thereof, the layer is substantially crystalline.

In a more preferred embodiment of any one of Methods L2-Q2 or L3-Q3 and preferred embodiments thereof, the layer is substantially crystalline and the temperature is from about 200° C. to about 600° C. More preferably, the layer is substantially crystalline and the temperature is about 350° C. to about 450° C. Even more preferably, the layer is substantially crystalline and the temperature is about 400° C. to about 450° C.

Practical advantages associated with this low temperature/rapid growth process include (i) short deposition times compatible with preprocessed Si wafers, (ii) selective growth for application in high frequency devices, and (iii) negligible mass segregation of dopants, which is particularly critical for thin layers.

In a preferred embodiment of any one of Methods L2-Q2 or L3-Q3 and preferred embodiments thereof, the substrate comprises any substrate suitable for semiconductor or flat panel display use, including but not limited to silicon, germanium, silicon on insulator, Ge:Sn alloys, $SiO_2$, sapphire, quartz, Si:Ge alloys, Si:C alloys, stainless steel, polyimide or other polymer films such as those used in the fabrication of flexible displays. In a more preferred embodiment of Methods any one of Methods L2-Q2 or L3-Q3 and preferred embodiments thereof, the substrate comprises silicon. In a even more preferred embodiment, the substrate comprises Si(100).

In any one of Methods L2-Q2 or L3-Q3 and preferred embodiments thereof, the compound of any one of Formulas (I)-(XXII) can be deposited by any suitable technique, including but not limited to gas source molecular beam epitaxy, chemical vapor deposition, plasma enhanced chemical vapor deposition, laser assisted chemical vapor deposition, and atomic layer deposition.

In any one of Methods L2-Q2 or L3-Q3 and preferred embodiments thereof, the compound of any one of Formulas (I)-(XXII) is introduced at a partial pressure between about $10^{-8}$ Torr and 760 Torr. In one preferred embodiment, the chemical vapor is introduced at between $10^{-8}$ Torr and $10^{-5}$ Torr (corresponding to UHV vertical furnace technology). In another preferred embodiment, the chemical vapor is introduced at between $10^{-8}$ Torr and 100 Torr, corresponding to LPCVD conditions. In yet another preferred embodiment, the chemical vapor is introduced at between $10^{-3}$ Torr and 760 Torr.

In any one of Methods L2-Q2 or L3-Q3 and preferred embodiments thereof, the compound of any one of Formulas (I)-(XXII) can be deposited under plasma-enhanced chemical vapor deposition (PECVD) conditions.

In various other preferred embodiments, when the compound of any one of Formulas (I)-(XXII) is deposited under PECVD conditions, the substrate temperature is about 20° C. to about 600° C. More preferably, the temperature is about 20° C. to about 300° C. Even more preferably, the temperature is about 20° C. to about 250° C.

In various other preferred embodiments, when the compound of any one of Formulas (I)-(XXII) is deposited under PECVD conditions, the composite plasma parameter W/FM is <about 200 MJ/kg; more preferably <100 MJ/kg, and even more preferably <30 MJ/kg.

In various other preferred embodiments, the Si—Ge material is formed on the substrate as a partially to fully strain-relaxed layer having a planar surface; the composition of the Si—Ge material is substantially uniform; and/or the entire Si and Ge framework of the chemical vapor is incorporated into the Si—Ge material or epitaxial Si—Ge.

In various other preferred embodiments, the Si—Ge material is formed on the substrate as fully strained layer having a planar surface; the composition of the Si—Ge material is substantially uniform; and/or the entire Si and Ge framework of the chemical vapor is incorporated into the Si—Ge material or epitaxial Si—Ge.

In other preferred embodiments, the substantially crystalline Si—Ge material is formed on the substrate has a substantially single crystalline domain.

In a preferred embodiment of any one of Methods L2-Q2 or L3-Q3 and preferred embodiments thereof, the substrate comprises a surface layer comprising at least two portions, wherein at least a first portion of the surface layer comprises a semiconductor surface layer and a second portion of the surface layer comprises an oxide, nitride, or oxynitride surface layer. It has been unexpectedly been discovered that upon exposure of such substrates to a chemical vapor comprising a compound of formula (I), that the Si—Ge layer formed thereon selectively deposits only on the first portion of the substrate, wherein the second substrate is essentially free of the Si—Ge layer.

For example, the first portion of the substrate layer can comprise silicon, germanium, silicon on insulator, Ge:Sn alloys, Si:Ge alloys, Si:C alloys, elemental Si, or elemental Ge. The second portion of the substrate surface can comprise oxide, nitride, or oxynitride surface layer, for example, $SiO_2$, sapphire, quartz, $GeO_2$, $Si_3N_4$, SiON, $Ge_3N_4$, GeON, $Ta_2O_5$, $ZrO_2$, or $TiO_2$. In a preferred embodiment, the first portion of the substrate comprises Si(100) or Si(111). More preferably, the first portion of the substrate comprises Si(100), such as, but not limited to, n-doped or p-doped Si(100).

Applications

According to the preceding methods. pure and stoichiometric $Si_dGe_{1-d}$ alloys can be formed seamlessly, conformally and/or selectively, for example, in the source/drain regions of prototypical device structures. This type of growth is also likely to have additional applications in the integration of microelectronics with optical components (photodiodes) into a single chip.

In one example, the surface layer of a substrate for can comprise one or a plurality of transistor architectures, each comprising a gate region, a source region, and a drain region, wherein the first portion of the surface layer comprises the source regions and the drain regions and the second portion of the surface layer comprises the gate region. The transistor architecture can be of the CMOS, NMOS, PMOS, or MOSFET-type, as are familiar to those skilled in the art. Accordingly, the $Si_dGe_{1-d}$ layers of the invention could be selectively deposited in the source and drain regions while the gate regions are essentially free of the $Si_dGe_{1-d}$ alloy (at least on the surface thereof).

The gate regions on such substrates can comprise, for example, a metal gate layer formed over a gate dielectric layer. Examples of metal gate layers include, but are not limited to, polysilicon, polycrystalline SiGe, Ta, Ir, W, Mo, TiN, TiSiN, WN, TaN, TaSi, NiSi, or $IrO_2$. Examples of gate dielectric layers include, but are not limited to, $SiO_2$, SiON, $HfO_2$, $ZrO_2$, $La_2O_3$, $Al_2O_3$, or HfAlO. Generally, the gate region can comprise an oxide, nitride, or oxynitride hardmask and/or an oxide, nitride, or oxynitride spacers.

Definitions

The term "alkoxy" as used herein, means an alkyl group, as defined herein, appended to the parent molecular moiety through an oxygen atom. Representative examples of alkoxy include, but are not limited to, methoxy, ethoxy, propoxy, 2-propoxy, butoxy, tert-butoxy, pentyloxy, and hexyloxy.

The term "alkyl" as used herein, means a straight or branched chain hydrocarbon of 1 to 10 carbon atoms, unless otherwise specified. Representative examples of alkyl include, but are not limited to, methyl, ethyl, n-propyl, isopropyl, n-butyl, sec-butyl, iso-butyl, tert-butyl, n-pentyl, isopentyl, neopentyl, and n-hexyl.

The term "haloalkyl" as used herein, means at least one halogen, as defined herein, appended to the parent molecular moiety through an alkyl group, as defined herein. Representative examples of haloalkyl include, but are not limited to, chloromethyl, 2-fluoroethyl, trifluoromethyl, pentafluoroethyl, and 2-chloro-3-fluoropentyl.

The term "halogen" as used herein, means —Cl, —Br, —I or —F.

The term "amorphous" as used here in, means the material, while it may contain short-range atomic order, the material substantially lacks long-range order; see Gersten, et al. *The Physics and Chemistry of Materials*, John Wiley & Sons: New York, 2001, pp 96-100, which is hereby incorporated by reference.

The term "substantially crystalline" as used herein, means that a composition contains less than 10% amorphous regions, as defined herein, but it may be highly defective. Preferably, the composition contains less than 5% amorphous regions. More preferably, the composition contains less than 2% amorphous regions. Even more preferably, the composition contains essentially no amorphous regions.

The term "substantially pure" as used herein, means that a compound is greater than 90% pure. Preferably, the compound is greater than 95% pure. Even more preferably, the compound is greater than 97% pure or 99.5% pure.

The term "substantially single crystalline domain" as used herein, means that the composition contains greater than 90% of a single polymorph of the compound. Preferably, the compound is greater than 95% of a single polymorph of the compound. Even more preferably, the compound is greater than 97% of a single polymorph of the compound.

The term "metal chlorinating agent" as used herein means a compound known to those skilled in the art for replacing a metal-hydride group with a metal-halide group. Examples of metal chlorinating agents include, but are not limited to $Cl_2$, $Br_2$, $SOCl_2$, $COCl_2$, AgCl, and AgBr, Methods of Synthesis (a) Synthetic routes to $ClHSi(GeH_3)_2$ (1) and $Cl_2Si(GeH_3)_2$ (2): The monochlorinated species 1 was generated by direct combination of $BCl_3$ and $SiH_2(GeH_3)_2$ in a 1:3 molar proportion via evolution of diborane according to Eq 1.

$$BCl_3 + 3SiH_2(GeH_3)_2 \rightarrow \frac{1}{2}B_2H_6 + 3ClHSi(GeH_3)_2 \quad (1)$$

The target compound (1) was isolated by trap-to-trap fractionation as a colorless, pyrophoric liquid with a room temperature vapor pressure of ~14 Torr. A typical reaction was allowed to proceed at 0° C. for 2 hours and produced pure single phase material in significant yields (~40%) based on the amount of the starting hydride material used. The latter was recovered under these optimum conditions and was recycled in subsequent preparations. Attempts to increase the yield by extending the reaction time generated mixtures of monochloro compound 1 with minor amounts of the di-substituted derivative $Cl_2Si(GeH_3)_2$ (2). To enhance formation of (2), we increased the Cl activity in the reaction medium by using higher molar ratios of $BCl_3$ and $SiH_2(GeH_3)_2$. For a stoichiometric 2:3 combination of the reactants as described by Eq 2 we obtained a mixture of (1) and (2) in yields of 20% and 15%, respectively indicating a significant increase of the second chlorination at the Si center, as expected.

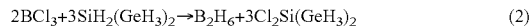

$$2BCl_3 + 3SiH_2(GeH_3)_2 \rightarrow B_2H_6 + 3Cl_2Si(GeH_3)_2 \quad (2)$$

When the chlorine activity was further increased by combining the reactants in ~1:1 molar ratio the $Cl_2Si(GeH_3)_2$ (2) species was predominately produced (20% yield) while the formation of $ClHSi(GeH_3)_2$ (1) was essentially suppressed (1% yield). In both cases copious amounts of diborane byproducts were evolved in addition to a polymeric solid which was present in quantities insufficient for a reliable characterization. Pure compound 2 was then isolated as a volatile (vapor pressure of 7 Torr at 22° C.) colorless liquid by trap-to-trap distillation.

(b) Synthetic routes to $ClSi(GeH_3)_3$ (3): The preparation of compound 3 was initially explored by stoichiometric 3:1 combinations of $SiH(GeH_3)_3$ and $BCl_3$. These typically produced mixtures of the ClSi(GeH$_3$)$_3$ and SiH(GeH$_3$)$_3$ compounds which were impossible to separate due to the similarity in their boiling points. Prolonged reaction times eventually led to the formation of nonvolatile polymeric solids which are likely derived from the decomposition of polychlorinated trisilylgermanes. This indicates that over time the chlorination occurs at the Ge sites in addition to Si eventually producing unstable products. However, the preparation of compound 3 was readily obtained in ~20% yield at 0° C. and a 10 minute reaction time using a 1:1 molar ratio of SiH (GeH$_3$)$_3$ and BCl$_3$. Pure compound 3 is a stable, colorless liquid with a room temperature vapor pressure of ~2 Torr.

(c) Chlorination of bridging Si sites in butane-like (GeH$_3$)$_2$(SiH$_2$)$_2$: The chlorination studies of (H$_3$Ge)$_x$SiH$_{4-x}$ have shown that the Si site is preferentially chlorinated to produce a range of new compounds. However, in the case of the simplest SiH$_3$GeH$_3$ species this prior work established that consecutive chlorinations of terminal Si—H bonds is difficult to achieve. On the other hand the chlorination of propane-like molecules containing bridging SiH$_2$ single centers such as SiH$_2$(GeH$_3$)$_2$ is much more straightforward. This is also found to be the case for the isostructural trisilane SiH$_2$(GeH$_3$)$_2$,[13] where its bridging SiH$_2$ is the most susceptible site to full chlorination while the terminal Si—H bonds are significantly less prone to this type of substitution. In view of this reaction behavior, we pursued a brief study to explore chlorination of related Si—Ge based macromolecules that offer a greater capacity for Si—H substitutions at bridging sites. These compounds are designed not to contain terminal Si—H bonds but rather incorporate highly reactive —SiH$_2$— SiH$_2$— based linkages, exclusively. The simplest candidate that fulfills these criteria is the butane-like (SiH$_2$)$_2$(GeH$_3$)$_2$ species which we have previously prepared and studied in detail from a fundamental and practical perspective. The availability of two equivalent reaction sites in this molecule makes the order and degree of chlorination of fundamental interest and represents a natural extension of our synthetic strategy to produce an entire genus of halogenated Si—Ge macromolecular hydride derivatives containing SiGe, GeSiGe, and GeSiSiGe cores. Finally in view of our success in reconciling simulated structural and spectroscopic properties with experiment for the simpler members of this family we undertook a systematic study of the entire sequence of Cl$_n$H$_{4-n}$Si$_2$(GeH$_3$)$_2$ (n=1-4) molecules and all possible conformations to explore the reaction trends in this more complex system.

f) Synthesis and characterizations of ClHSiSiH$_2$(GeH$_3$)$_2$ (4) and Cl$_2$H$_2$Si$_2$(GeH$_3$)$_2$: The mono substituted ClHSiSiH$_2$(GeH$_3$)$_2$ (4) species was readily obtained by reacting an excess of BCl$_3$ with (SiH$_2$)$_2$(GeH$_3$)$_2$ in a 2:3 ratio. A typical reaction time of one hour at an optimum temperature of 0° C. yielded diborane, but also a small amount of unreacted starting material was recovered under these conditions as confirmed by NMR. Efforts to achieved full conversion of (SiH$_2$)$_2$(GeH$_3$)$_2$ using longer reaction times and higher temperatures produced intractable polymeric solids that could not be fully characterized. Compound 4 was isolated by distillation as a colorless liquid with a nominal vapor pressure of ~2 Torr. Its $^{29}$Si spectrum showed two peaks due to the SiH$_2$ and SiHCl moieties at −97.0 and −15.0 ppm, respectively. These are down-shifted with respect to the SiH$_2$ resonance (−105.0) of the starting material and are consistent with a single chlorine substitution at the Si center. The $^1$H spectra revealed a triplet (3.05), a pentet (3.33) a sextet (5.02) and a doublet (3.26) corresponding to protons bonded in the sequence of GeH$_3$—SiH$_2$—SiHCl—GeH$_3$. The integrated intensities, the coupling patterns and the positions of the peaks collectively point to this atomic arrangement. The shift corresponding to the Ge—H furthest from the Cl site (3.05) is close to that of the starting material (3.11) while the shift of the Ge—H adjacent to the SiHCl is slightly downshifted (3.26). The SiH$_2$ peak (3.33) is remarkably close to that of the starting material (3.29) and to other bridging SiH$_2$ ligands in silygermane compounds. The sextet corresponding to the SiHCl (5.02) is significantly down shifted due to the presence of Cl and is close to the one observed in ClHSi(GeH$_3$)$_2$ (5.07). The molecular structure is further confirmed with 2-D $^1$H COSY which yielded the following correlations: (i) The 3.26 (doublet) and the 5.02 (sextet) are associated with —GeH$_3$—SiHCl—, (ii) the 5.02 (sextet) and 3.33 (pentet) are associated with —SiHCl—SiH$_2$— and (iii) the 3.33 (pentet) an 3.05 (triplet) are associated with —SiH$_2$—GeH$_3$—. The $^1$H-$^{29}$Si HMQC NMR corroborated the latter assignments and indicated direct couplings between the $^{29}$Si (−97) and the $^1$H (3.33, pentet), and between the $^{29}$Si (−15) and the $^1$H (5.02, sextet).

The dichlorinated Cl$_2$H$_2$Si$_2$(GeH$_3$)$_2$ species was obtained as a mixture of two substitutional isomers, Cl$_2$SiSiH$_2$(GeH$_3$)$_2$ and (ClHSi)$_2$(H$_3$Ge)$_2$. Liquid samples with vapor pressure of ~1 Torr were prepared by reactions of BCl$_3$ and (SiH$_2$)$_2$(GeH$_3$)$_2$ in a 1:1 ratio at 0° C. The reaction time in this case was considerably reduced to ~20 minutes compared to the mono-chlorination, to avoid formation, or mitigate decomposition, of unstable byproducts that were also produced under these conditions. The very close boiling points of the dichlorinated Cl$_2$SiSiH$_2$(GeH$_3$)$_2$ and (ClHSi)$_2$(H$_3$Ge)$_2$ derivatives precluded their individual separation by normal distillation or fractionation techniques. Accordingly their identity was established and their structures were primarily elucidated by $^1$H, and $^{29}$Si NMR including 2D $^1$H COSY and $^1$H-$^{29}$Si HMQC analyses. For the (ClHSi)$_2$(H$_3$Ge)$_2$ species the proton NMR spectra showed a doublet at 3.26 ppm due to the terminal GeH$_3$ protons and a pentet at 4.98 ppm corresponding to the bridging SiH protons. The integrated intensity ratio of the GeH$_3$ and SiH peaks were found to be 3:1 respectively, as expected. The $^1$H spectra also displayed three additional peaks at 3.43 (singlet), 3.42 (quartet) and 3.07 ppm (triplet) which were assigned to the GeH$_3$, SiH$_2$ and GeH$_3$ protons of the sequence contained in the H$_3$Ge—SiCl$_2$—SiH$_2$—GeH$_3$ species. The $^{29}$Si spectra of the samples exhibited three distinct resonances at 24.4, −88.7 and −17.0 ppm corresponding to the SiCl$_2$ and SiH$_2$ of H$_3$Ge—SiCl$_2$—SiH$_2$—GeH$_3$ and SiH of (ClHSi)$_2$(H$_3$Ge)$_2$, respectively. Note that the SiH$_2$ $^{29}$Si resonance of the Cl$_2$SiSiH$_2$(GeH$_3$)$_2$ is significantly shifted downfield (−88.7) with respect to the starting material (−105) due to the presence of the chlorine atoms bound to the adjacent silicon. The proposed structures of (ClHSi)$_2$(H$_3$Ge)$_2$ and Cl$_2$SiSiH$_2$(GeH$_3$)$_2$ are further confirmed by a 2D $^1$H COSY spectrum, which only show two sets of crosspeaks correlating to Ge—H and Si—H resonances at 3.26 and 4.98 ppm as well as 3.07 and 3.42 ppm, respectively. The $^1$H-$^{29}$Si HMQC spectrum revealed that the protons at 4.98 and 3.42 ppm are directly coupled to $^{29}$Si resonances at −17.0 and −88.7.

Simulation Studies of ClH$_n$H$_{6-n}$SiGe Molecules

A primary goal was to elucidate, on energetic and structural grounds, the chlorination trends of H$_3$SiGeH$_3$. The list of compounds presented in Table 3 is augmented to include the Cl$_3$SiGeH$_3$ species as well as the compounds H$_3$SiGeH$_2$Cl, H$_3$SiGeHCl$_2$ with Cl atoms bound exclusively to Ge. The latter have tentatively observed but not on a reproducible basis. This is presumably due to their relative instability with respect to decomposition or additional chlorinations at their Si sites to produce molecules containing at most four chlorine atoms combined, as observed.

We calculated standard reaction free energies, $\Delta G_{RX}$ at 298 K, following the generalized reaction given in Eq. (5), $$n BCL_3 + 3H_3SiGeH_3 \rightarrow \frac{n}{2} B_2H_6 + 3Cl_n H_{6-n} SiGe \quad (5)$$

using the thermally corrected free energies. The main results are provided in Table 3, which lists the reaction free energies in order of decreasing magnitude. As can be seen from this data the relative stability of the chlorinated products is directly related to the number of Si—Cl bonds, and not the total number of bound chlorine atoms. This is consistent with the experimentally observed order of chlorination in which the first and second chlorination reactions occur exclusively on the Si center, followed by progressive chlorination of the Ge site. Note that the experimentally elusive $H_3SiGeH_2Cl$ and $H_3SiGeHCl_2$ compounds are the least stable due to the absence of Si—Cl bonds. In contrast the most thermodynamically stable derivative $Cl_3SiGeH_3$ was never obtained despite systematic efforts to promote its formation. As we discuss below in detail this is likely due to slow reaction kinetics.

TABLE 3

Standard reaction free energies $\Delta G_{RX}$ (thermally corrected values at 298K) for chlorination reaction products, and reaction enthalpies $\Delta H_{RX}$ obtained from bond enthalpy calculations.

| $\Delta G_{RX}$ (kJ/mol) | $\Delta H_{RX}$ (kJ/mol) | PRODUCT |
|---|---|---|
| −50.6 | −79 | $Cl_3$—Si—Ge—$H_3$ |
| −34.1 | −53 | $Cl_2H$—Si—Ge—$H_3$ |
| −26.9 | −59 | $Cl_2H$—Si—Ge—$H_2Cl$ |
| −30.5 | −81 | $Cl_2H$—Si—Ge—$HCl_2$ |
| −14.9 | −27 | $ClH_2$—Si—Ge—$H_3$ |
| −14.7 | −32 | $ClH_2$—Si—Ge—$H_2Cl$ |
| −12.8 | −38 | $ClH_2$—Si—Ge—$HCl_2$ |
| −1.3 | −6 | $H_3$—Si—Ge—$H_2Cl$ |

TABLE 3-continued

Standard reaction free energies $\Delta G_{RX}$ (thermally corrected values at 298K) for chlorination reaction products, and reaction enthalpies $\Delta H_{RX}$ obtained from bond enthalpy calculations.

| $\Delta G_{RX}$ (kJ/mol) | $\Delta H_{RX}$ (kJ/mol) | PRODUCT |
|---|---|---|
| −5.5 | −11 | $H_3$—Si—Ge—$HCl_2$ |
| 0.0 | 0 | $H_3$—Si—Ge—$H_3$ |

Calculation of the Structural and Vibrational Properties of Compounds of the Invention To corroborate the molecular structures of $ClSiH_2GeH_3$ and $Cl_2SiHGeH_3$ derived from the NMR spectra, we conducted first principles calculation of the structural and vibrational properties of these compounds. We have successfully used this approach in previous investigations to identify isomeric mixtures of butane like $GeH_3SiH_2SiH_2GeH_3$ and $GeH_3GeH_2SiH_2GeH_3$ compounds on the basis of their vibrational signatures. Although the focus of the present study is on (1) and (2), here we seek to establish important trends in the bonding and vibrational properties for the general sequence of chloro(germyl)silanes $Cl_xH_{1-x}Si$—$GeH_3$ (x=0-3) for the sake of completeness. An additional benefit is to classify the frequency range and character of the various vibrational modes that are characteristic to these compounds for the elucidation of more complicated, higher orders chloro(germyl)silanes.

Density functional theory simulations of the $H_3Si$—$GeH_3$, $ClH_2Si$—$GeH_3$, $Cl_2HSi$—$GeH_3$ and $Cl_3Si$—$GeH_3$ molecules were performed using the B3LYP hybrid functional. In our prior work on Si—Ge based molecules we have successfully described key structural, thermochemical and spectroscopic properties using various basis sets in the 6-311++G family. Since molecules of interest here contain only one germanium atom, and up to three chlorine atoms, the total electron count ranges from 52 to 100 for which a treatment using the 6-311++G(3df,3pd) is tractable. All of the results presented here therefore employ the latter basis set in conjunction with the B3LYP hybrid density functional.

TABLE 4

Calculated structural and dynamical properties of $H_3Si$—$GeH_3$, $ClH_2Si$—$GeH_3$, $Cl_2HSi$—$GeH_3$ and $Cl_3Si$—$GeH_3$ molecules. Listed are the symmetry, dipole moments m (Debye), mass M (amu), rotational constants {A, B, C} (GHz), bond lengths (Å) and bond angles (degrees). Also included in the table are the electronic ground state energy (E0), and E0 corrected for zero point energy (ZPE), thermal energy ($\Delta E_{TH}$), enthalpy ($\Delta H$) and free-energy ($\Delta G$). The latter three thermochemical energies were evaluated at T = 300K. All energies are given in Hartree.

| | $H_3Si$—$GeH_3$ | $ClH_2Si$—$GeH_3$ | $Cl_2HSi$—$GeH_3$ | $Cl_3Si$—$GeH_3$ |
|---|---|---|---|---|
| No. of electrons | 52 | 68 | 84 | 100 |
| Structural Symmetry | $C_{3v}$ | $C_s$ | $C_s$ | $C_{3v}$ |
| Rotational Symmetry | Prolate Sym. top | Asymmetric top | Asymmetric top | Prolate Sym. top |
| μ (D) | 0.147 | 1.373 | 1.568 | 1.666 |
| M (amu) | 108.0 | 141.91 | 175.9 | 209.8 |
| A, B, C (GHz) | 41.77, 3.57, 3.57 | 10.18, 1.42, 1.29 | 2.29, 1.19, 0.83 | 1.28, 0.79, 0.79 |
| b(Si—Ge) (Å) | 2.393 | 2.392 | 2.391 | 2.388 |
| b(Ge—H) (Å) | 1.538 | 1.535, 1.535, 1.538 | 1.533, 1.535, 1.535 | 1.533 |
| b(Si—H) (Å) | 1.482 | 1.479 | 1.475 | — |
| b(Si—Cl) (Å) | — | 2.078 | 2.066 | 2.058 |
| ∠(H—Ge—Si) (deg) | 110.8 | 109.4 | 109.4, 109.5 | 108.8 |
| ∠(H—Si—Ge) (deg) | 110.2 | 111.3 | 114.2 | — |
| ∠(Cl—Si—Ge) (deg) | — | 110.0 | 110.0 | 110.9 |
| $E_0$ | −2370.14139 | −2829.82345 | −3289.50777 | −3749.19190 |
| $E_0$ + ZPE | −2370.09384 | −2829.78144 | −3289.47263 | −3749.16281 |
| $E_0$ + $\Delta E_{TH}$ (300K) | −2370.08864 | −2829.77545 | −3289.46611 | −3749.15432 |
| $E_0$ + $\Delta H$ (300K) | −2370.08769 | −2829.77451 | −3289.46517 | −3749.15338 |
| $E_0$ + $\Delta G$ (300K) | −2370.12082 | −2829.81224 | −3289.50532 | −3749.19740 |

All structural optimizations were performed using "tight" force convergence criteria using the Gaussian03 code (see, M. J. Frisch et al. Gaussian 03, Revision B.04, Gaussian Inc 2003). The vibrational spectra of all $Cl_xH_{1-x}Si$—$GeH_3$ molecules exhibit positive definite vibrational frequencies, indicating that the ground state structures are dynamically stable. It is noteworthy that a coarse structure optimization of the $Cl_2HSi$—$GeH_3$ molecule produces a soft mode corresponding to internal $GeH_3$ rotation. A summary of key molecular properties is presented in Table 4, which compares the dipole moments, rotational constants, bond lengths and bond angles across the sequence. The dipole moment increases significantly with the substitution of chlorine into the silyl unit of the molecules, ranging from ~0.15 D $H_3Si$—$GeH_3$ to 10-fold this value (1.67 D) in $Cl_3Si$—$GeH_3$. The structural bonding trends through the sequence are unremarkable, with principal bonds exhibiting little variation with respect to the inclusion of chlorine. For example, the Si—Ge, Ge—H and Si—H bonds change by less than a few parts per thousand throughout the molecular sequence while the largest variation is found in the Si—Cl bonds, which decrease by several % in going from $ClH_2Si$—$GeH_3$ to $Cl_3Si$—$GeH_3$. The bond-angle variations are also generally small, and the trend reveals an increase in both the H—Si—Ge and Cl—Si—Ge angles with chlorine content. The H—Ge—Si angles also exhibit a minor systematic decrease consistent with increased long range repulsion between the germyl protons and the chlorine atoms. Also listed in Table 3 is the ground state electronic energy ($E_0$) of all molecules together with the latter values corrected for zero point energy (ZPE), thermal energy ($\Delta E_{TH}$), enthalpy ($\Delta H$) and free energy ($\Delta G$) at 300 K.

Figure 2:
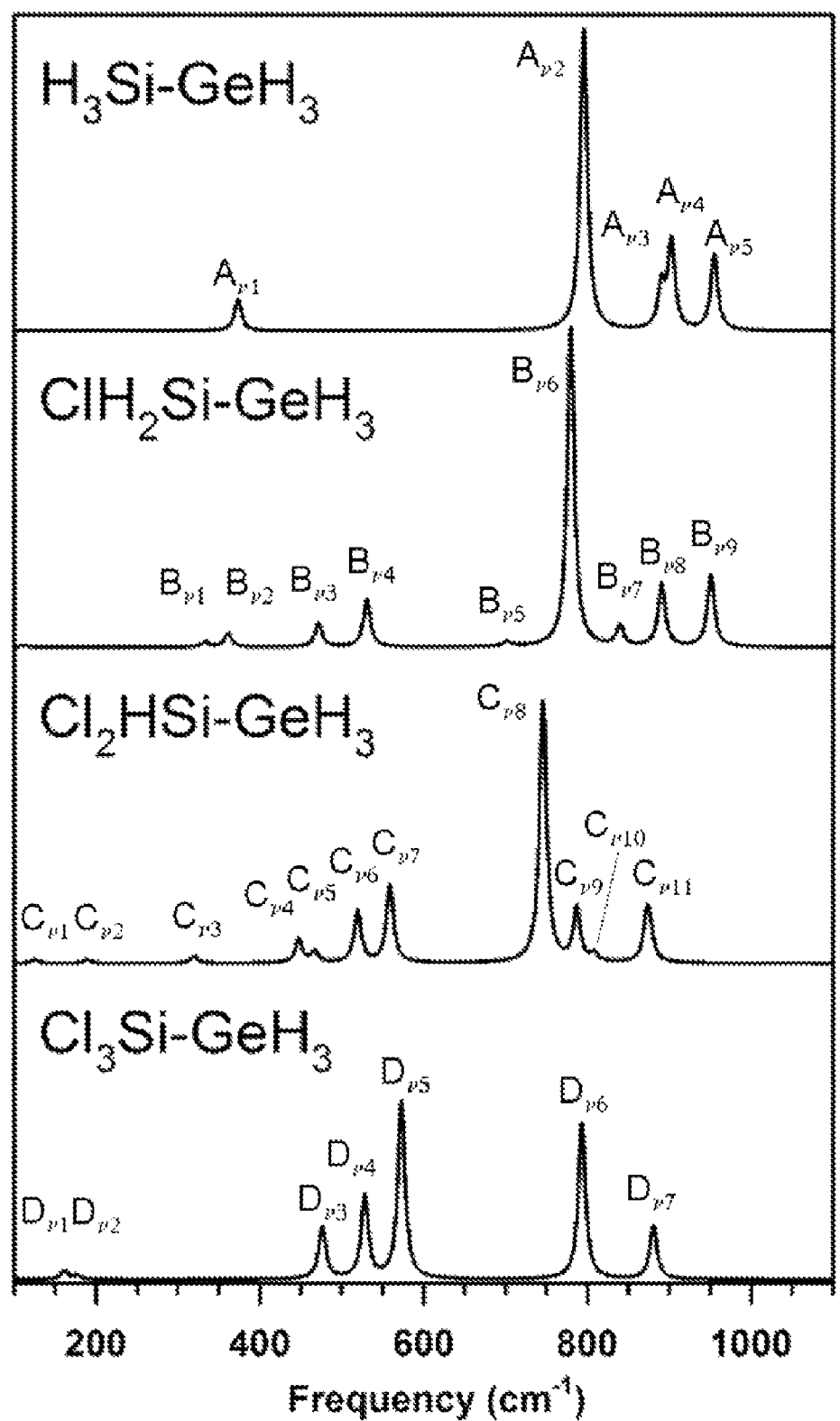
FIG. 2 is a calculated low frequency (100-1100 $cm^{-1}$) infrared spectra of the $H_3Si$—$GeH_3$, $ClH_2Si$—$GeH_3$, $Cl_2HSi$—$GeH_3$ and $Cl_3Si$—$GeH_3$ molecules.
Figure 3:
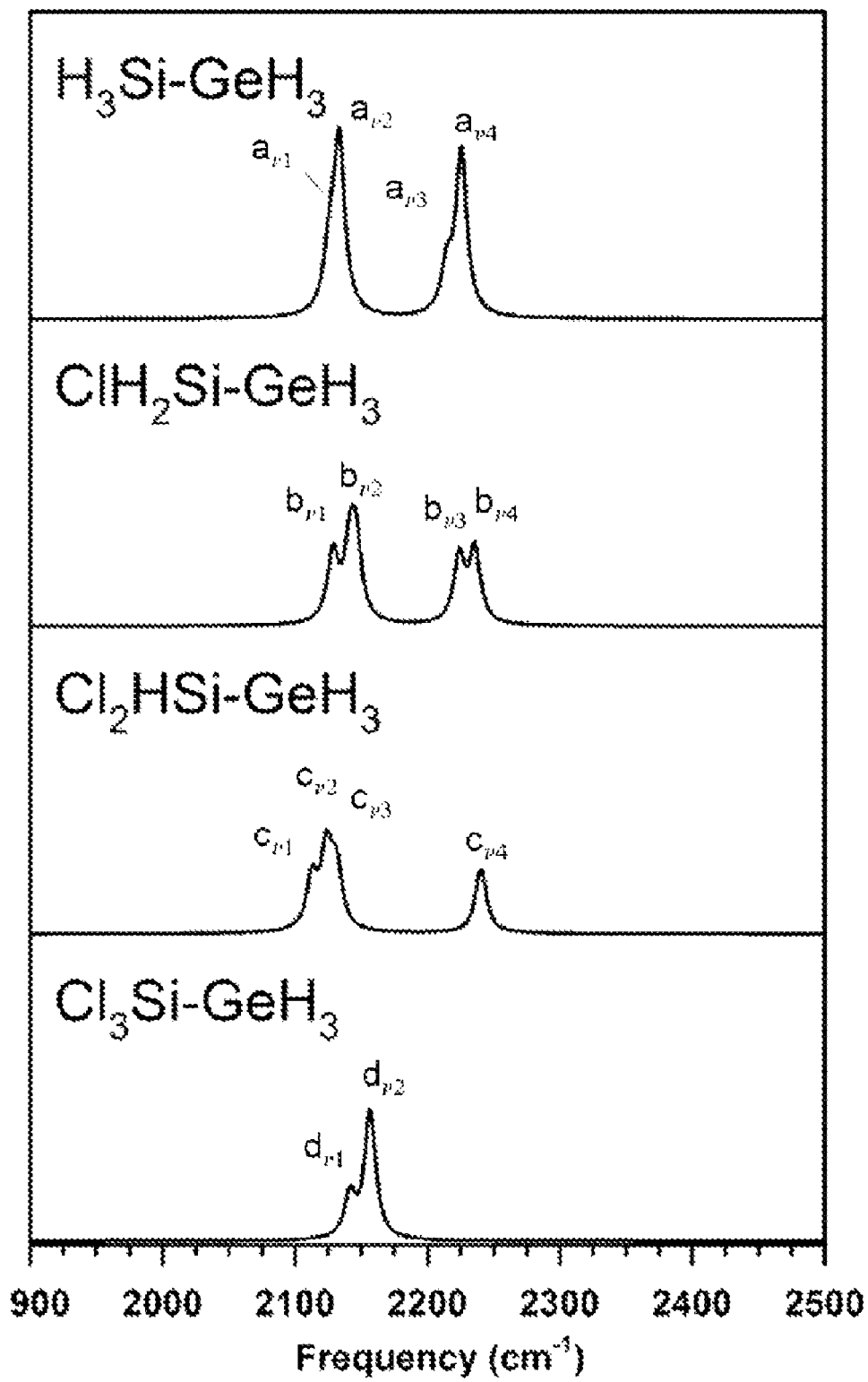
FIG. 3 is a calculated high frequency (900-2500 $cm^{-1}$) infrared spectra of the $H_3Si$—$GeH_3$, $ClH_2Si$—$GeH_3$, $Cl_2HSi$—$GeH_3$ and $Cl_3Si$—$GeH_3$ molecules.

Symmetry analysis of the optimized ground state structures indicates that the end member molecules, $H_3Si$—$GeH_3$ and $Cl_3Si$—$GeH_3$, are both prolate symmetric tops possessing $C_{3v}$ symmetry, while the mono- and di-chlorinated variants are asymmetric tops possessing a lower $C_S$ symmetry. The vibrational spectra of the end members are therefore less complex than those of the less symmetric (x=1, 2) molecules. This is evident from Table 5 which lists the calculated infrared active vibrational features throughout the molecular sequence. Corresponding low and high frequency plots of the calculated spectra are presented in FIGS. 2 and 3, respectively. No frequency scaling has been applied to these calculated spectra and mode assignments used in Table 5 follow the designations within these figures. In general, the high frequency spectra contain two primary features corresponding to asymmetric and symmetric Ge—H stretches (2120-2160 cm$^{-1}$) and their asymmetric and symmetric Si—H counterparts (2220-2240 cm$^{-1}$). The corresponding low frequency spectra (200-1200 cm$^{-1}$) are significantly more complex, and general assignments (by frequency range) are as follows: (i) 120-160 cm$^{-1}$: Si—Cl rocking modes, (ii) 320-350 cm$^{-1}$: Si—Ge stretching, (iii) 520-530 cm$^{-1}$: Si—Cl stretches, (iv) 380-480 cm$^{-1}$: asymmetrical $GeH_3/SiH_x$ rocking vibrations, (v) 740-800 cm$^{-1}$: symmetric $GeH_3/SiH_x$ rocking vibrations and (vi) 800-950 cm$^{-1}$: various $GeH_3$ and $SiH_x$ wagging vibrations. Among these modes the most intense infrared bands are those in group (v), designated as symmetric $GeH_3/SiH_x$ rocking modes. We note that the frequencies of these intense bands are essentially the same in the end member molecules, occurring at 796 cm$^{-1}$ in $H_3Si$—$GeH_3$ and 793 cm$^{-1}$ in $Cl_3Si$—$GeH_3$. These spectral features shift to lower frequencies 780 cm$^{-1}$ and 746 cm$^{-1}$ in the lower symmetry molecules, $ClH_2Si$—$GeH_3$ and $Cl_2HSi$—$GeH_3$, respectively.

Figure 4:
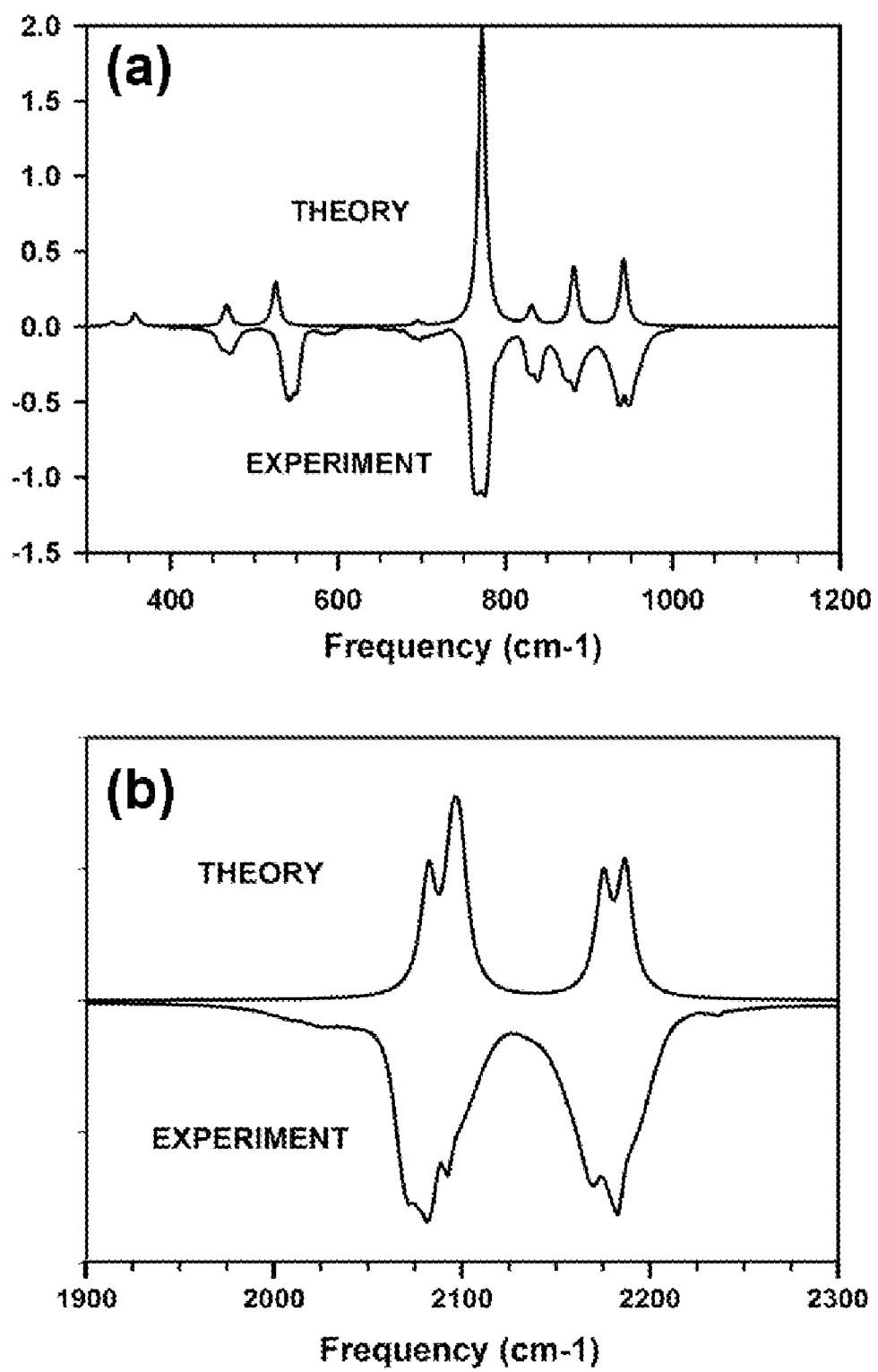
FIG. 4 shows comparative calculated and observed infrared spectra of the $ClH_2SiGeH_3$ molecule. Frequency scale factors of 0.989 and 0.979 were applied to the calculated low- and high-frequency spectra, shown in part (a) and (b), respectively.
Figure 5:
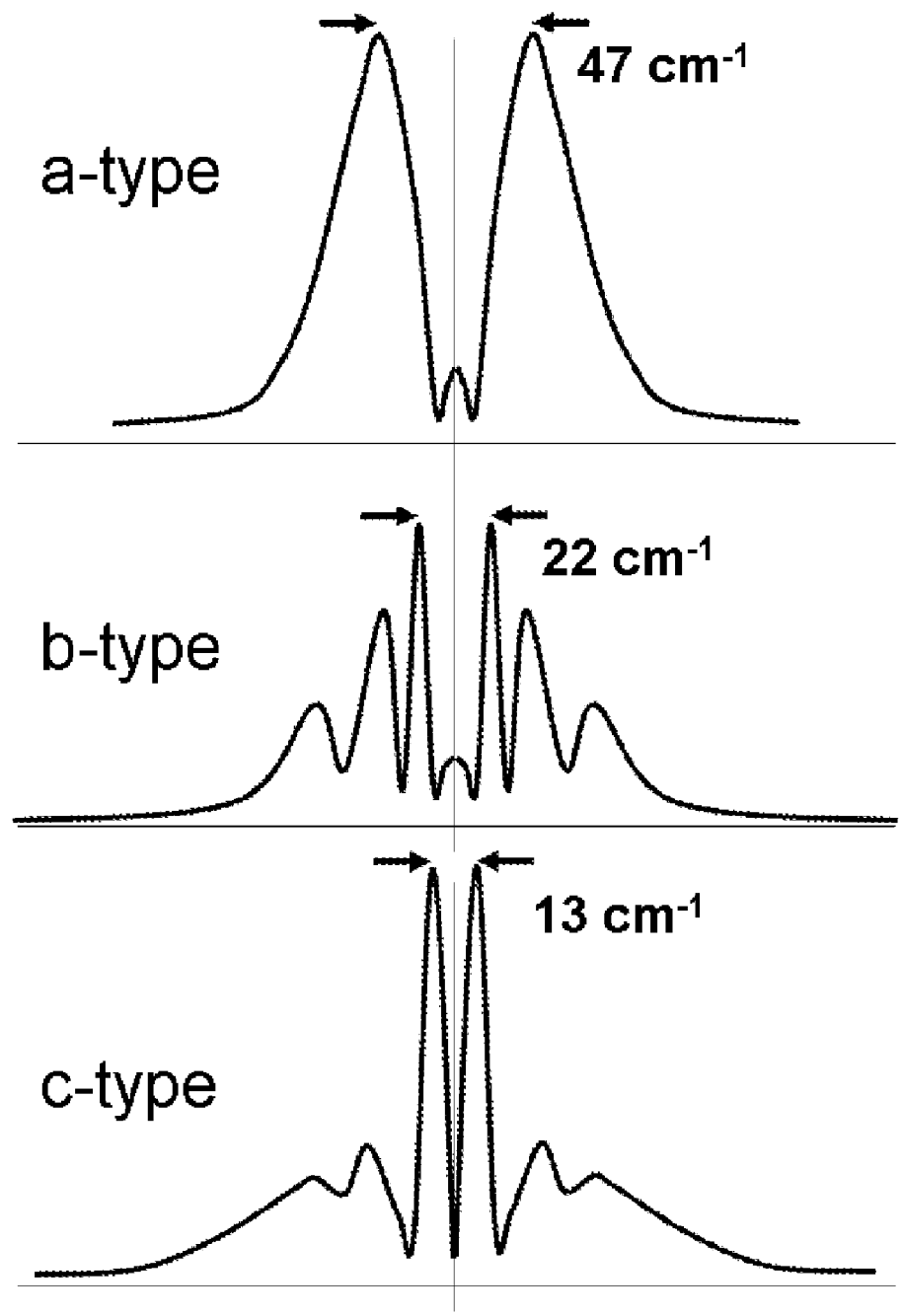
FIG. 5 shows simulated rotational band contours A-, B- and C-type bands obtained using the rotational constants for $ClH_2SiGeH_3$ given in Table 3.

A detailed comparison of the calculated and observed spectra of $ClH_2Si$—$GeH_3$ is presented in FIG. 4. Based on our prior simulation work using comparable basis sets and model chemistries (see, Chizmeshya et al., J. Am. Chem. Soc. 2006, 128(21), 6919-6930) we have applied scale factors of 0.989 and 0.979 frequency scale factors to the calculated low- and high-frequency spectra, respectively. As can be seen from the figure the calculated frequencies and intensities match their experimental counterparts very closely, suggesting that the vibrational assignments for $ClH_2Si$—$GeH_3$ presented in Table 4 are reliable. We note that a slight reduction in the scale factor used for the high frequency range (FIG. 4(b)) would improve the agreement further. Finally, the simple harmonic vibrational analysis presented here does not account for the splittings observed experimentally. We have investigated several possible origins for this splitting, including dimeric interactions and anharmonic effects. In the former case selective vibrational features are split when molecules are coupled depending upon their detailed relative configurations. The interaction strengths were calculated to be on the order of a tenth of a kcal/mol, and therefore, unlikely to be operative at room temperature. The most likely origin of the systematic ~12 cm$^{-1}$ splittings observed is coupling to rotations in the asymmetrical top molecules. It is noteworthy that the splittings occur in all bands, including the high-frequency Ge—H and Si—H modes. This can be explained by the relatively low symmetry of the $ClH_2Si$—$GeH_3$ molecule, which leads to A symmetries for all vibrational modes (e.g., no A' or A" symmetry vibrations). Using the rotational constants for the $ClH_2Si$—$GeH_3$ molecule listed in Table 4, we have calculated the room temperature rotational band profiles corresponding to A-, B- and C-type contours using an asymmetrical top computer program. These are compared in FIG. 5 which indicates that the profiles are distinct and that the C-type contour closely matches to the observed absorption band shapes, and in particular the apparent splitting of approximately 13 cm$^{-1}$.

TABLE 5

Unscaled harmonic vibrational frequencies of the $H_3Si$—$GeH_3$, $ClH_2Si$—$GeH_3$, $Cl_2HSi$—$GeH_3$ and $Cl_3Si$—$GeH_3$ molecules and their corresponding assignments. Silent modes with zero calculated intensity are designated by "Sil".

| $H_3Si$—$GeH_3$ | | $ClH_2Si$—$GeH_3$ | | $Cl_2HSi$—$GeH_3$ | | $Cl_3Si$—$GeH_3$ | |
|---|---|---|---|---|---|---|---|
| Sil. (346) | Si—Ge str. | Sil. (119) | SiCl rock. | | | $D_{v1}(162)$ | s. $SiCl_3$ rock. |
| $A_{v1}(374)$ | a.$GeH_3$ + $SiH_3$ rock. | $B_{v1}(333)$ | Si—Ge str. | $C_{v1}(125)$ | s. $SiCl_2$ rock. | $D_{v2}(177)$ | a. Si—Cl wag |
| $A_{v2}(796)$ | s. $GeH_3/SiH_2$ rock. | $B_{v2}(361)$ | s.$SiH_2/GeH_2$ wag. | $C_{v2}(189)$ | Si—$Cl_2$ scissor | Sil. (319) | Si—Ge str. |
| $A_{v3}(890)$ | s. $GeH_2$ wag. | $B_{v3}(471)$ | a.$GeH_3$ + $SiH_2$ rock. | $C_{v3}(320)$ | Si—Ge str. | $D_{v3}(476)$ | a. $GeH_3$ rock. |

TABLE 5-continued

Unscaled harmonic vibrational frequencies of the H$_3$Si—GeH$_3$, ClH$_2$Si—GeH$_3$, Cl$_2$HSi—GeH$_3$ and Cl$_3$Si—GeH$_3$ molecules and their corresponding assignments. Silent modes with zero calculated intensity are designated by "Sil".

| H$_3$Si—GeH$_3$ | | ClH$_2$Si—GeH$_3$ | | Cl$_2$HSi—GeH$_3$ | | Cl$_3$Si—GeH$_3$ | |
|---|---|---|---|---|---|---|---|
| A$_{v4}$(904) | s. SiH$_3$ rock. | B$_{v4}$(530) | Si—Cl str. | C$_{v4}$(448) | s. GeH$_2$ wag. | D$_{v4}$(528) | s. Si—Cl str. |
| A$_{v5}$(955) | s. SiH$_3$ wag. | B$_{v5}$(702) | a. SiH$_3$ rock. | C$_{v5}$(467) | a. GeH$_3$ rock. | D$_{v5}$(573) | a. Si—Cl str. |
| | | B$_{v6}$(780) | s. GeH$_3$/SiH$_2$ rock. | C$_{v6}$(520) | s. Si—Cl str. | D$_{v6}$(793) | s. GeH$_3$ rock |
| | | B$_{v7}$(840) | a. GeH$_3$/SiH$_2$ rock. | C$_{v7}$(559) | a. Si—Cl str. | D$_{v7}$(881) | a. GeH$_3$ wag. |
| | | B$_{v8}$(890) | a. GeH$_3$ wag. | C$_{v8}$(746) | s. GeH$_3$/SiH rock. | | |
| | | B$_{v9}$(950) | s. SiH$_2$ wag. | C$_{v9}$(787) | SiH wag. | | |
| | | | | C$_{v10}$(808) | a. GeH$_3$/SiH$_2$ rock. | | |
| | | | | C$_{v11}$(873) | a. GeH$_3$ wag. | | |
| a$_{v1}$(2127) | s. GeH$_3$ str. | b$_{v1}$(2142) | s. GeH$_3$ str. | c$_{v1}$(2113) | s. GeH$_3$ str. | d$_{v1}$(2142) | s. GeH str. |
| a$_{v2}$(2135) | a. GeH$_3$ str. | b$_{v2}$(2146) | a. GeH$_3$ str. | c$_{v2}$(2124) | a. GeH$_2$ str. | d$_{v2}$(2157) | a. GeH$_3$ str. |
| a$_{v3}$(2216) | s. SiH$_3$ str. | b$_{v3}$(2224) | s. SiH str. | c$_{v3}$(2132) | a. GeH str. | | |
| a$_{v4}$(2227) | a. SiH str. | b$_{v4}$(2236) | a. SiH str. | c$_{v4}$(2241) | SiH str. | | |

Comparison of the Method of the Invention with Previous Methods

We have previously utilized SiH$_3$GeH$_3$ and the butane like (GeH$_3$)$_2$(SiH$_2$)$_2$ compound to deposit Si$_{0.50}$Ge$_{0.50}$ films at low temperatures. In both cases, we have obtained materials with high quality morphological and microstructural properties. Nevertheless, the use of SiH$_3$GeH$_3$ for low-temperature CMOS selective growth of small size device features is not practical due to the dramatic drop in growth below 475° C. (in fact the growth rate is negligible below 450° C.). In contrast both ClH$_2$SiGeH$_3$ and (GeH$_3$)$_2$(SiH$_2$)$_2$ yield growth rates at least 10 times higher than those obtained from SiH$_3$GeH$_3$ in the 400-450° C. range, and these compounds even display significant film growth at temperatures below 400° C. It should also be noted that the film quality is comparable using either ClH$_2$SiGeH$_3$ or (GeH$_3$)$_2$(SiH$_2$)$_2$ to grow Si$_{0.50}$Ge$_{0.50}$.

However, albeit (GeH$_3$)$_2$(SiH$_2$)$_2$ shows promise from a technical perspective it represents a demonstration in principle rather than a true proof of concept from an industrial perspective. For instance, this compound is difficult to synthesize in quantities greater than a few grams and its thermal stability in relation to storage and transportation is not well understood.

Thus, the ClH$_2$SiGeH$_3$ counterpart appears to be a more practical candidate as a 50/50 SiGe source. Its synthesis is much easier to scale up and the starting materials are readily available and inexpensive. The single step reaction of BCl$_3$ with H$_3$SiGeH$_3$ is conducted in a solvent free environment ensuring facile isolation and purification to produce semiconductor grade material. Further, due to its high vapor pressure, the compound can be readily integrated with existing commercial processes involving single-wafer low pressure CVD furnaces.

EXAMPLES

All manipulations were carried out under inert conditions using standard high vacuum line and drybox techniques. Dry, air-free solvents were distilled from either anhydrous CaCl$_2$ or sodium benzophenone ketyl prior to use. All NMR spectra were collected on a Gemini 300 MHz spectrometer. Samples were dissolved in deuterated toluene, and all nuclei were referenced either directly or indirectly to the proton signal of TMS or the residual solvent peak as indicated. Gaseous Infrared spectra were obtained in 10-cm cells fitted with KBr windows. Mass spectrometry data were obtained using a Leybold-Inficon quadrupole mass spectrometer. Boron trichloride (Matheson gas products 99.95%) was distilled to remove residual HCl contaminants and its purity was confirmed by Infrared and mass spectra prior to use. Lithium tetrahydroaluminate (Aldrich), phenyl trichlorosilane (Aldrich), trifluoromethane sulfonic acid (Alfa Aesar), cesium chloride (Aldrich) and electronic grade germane gas (donated by Voltaix, Inc.) were used as received. The starting materials phenylsilane was prepared by reduction of phenyl trichlorosilane with LiAlH$_4$, and phenyl monochlorosilane was prepared by the reaction of phenylsilane with gaseous HCl. Phenylsilylgermane (Lobreyer et al., *Chem. Ber.* 1991, 124, 2405-2410), germylsilyl trifluoromethanesulfonate, and germylsilane (Hu et al., *J. Appl. Phys. Lett.* 2005, 87(18), 181903/1-3) were prepared according to literature procedures. All starting materials were checked by NMR spectroscopy to verify their purities. Potassium germyl (KGeH$_3$) was synthesized via a modified literature preparation in monoglyme by reaction of gaseous GeH$_4$ with a finely dispersed sodium-potassium (80% K) alloy. Note: the Teflon bar that was used to stir the GeH$_4$/Na—K/monoglyme solution was encapsulated in glass owing to the high reactivity of Teflon with Na—K alloys.

The growth studies were conducted on Si(100) substrates in ultra-high vacuum (UHV) deposition system. The substrates were prepared for growth by flashing at 1000° C. under UHV ($10^{-10}$ Torr) to remove the native oxide from the surface.

Example 1

Synthesis of ClSiH$_2$GeH$_3$ and Cl$_2$SiHGeH$_3$

Method A (Reaction of CsCl with (CF$_3$SO$_3$)SiH$_2$GeH$_3$)

A 50 mL Schlenk flask was charged with n-decane (15 mL) and (CF$_3$SO$_3$)SiH$_2$GeH$_3$ (0.60 g, 2.35 mmol). Cesium chloride (0.42 g, 2.49 mmol) was added slowly via a powder addition funnel at −25° C. to the flask and was allowed to stir under nitrogen for 12 hours at 22° C. The volatiles were fractionally distilled through U-traps held at −50, −110, and −196° C. under dynamic vacuum. The −50° C. trap contained solvent, and the −196° C. trap contained traces of GeH$_4$. The −110° C. trap retained pure, colorless ClSiH$_2$GeH$_3$ (0.186 g, 56% yield). Vapor pressure: ~147 Torr (23° C.). IR (gas, cm$^{-1}$): IR (gas, cm$^{-1}$) 2183 (vs), 2171 (s), 2156 (vw), 2092 (vw), 2082 (vs), 2070 (s), 1076 (vw), 948 (m), 936 (m), 896 (m), 839 (vw), 830 (vw), 790 (s), 774 (vs), 764 (vs), 549 (m), 540 (m), 470 (w), 360 (vw). $^1$H NMR (300 MHz, toluene-d$_8$): 4.63 (q, 2H, Si—H$_2$), 3.07 (t, 3H, Ge—H$_3$). Mass Spectrum: m/q isotopic envelopes centered at 141 (M$^+$), 106 (H$_3$GeSiH$_3^+$), 75 (GeH$_4^+$), 65 ClSiH$_2^+$, 36 (Cl$^+$), 31 (SiH$_4^+$).

Example 2

Synthesis of ClSiH$_2$GeH$_3$ and Cl$_2$SiHGeH$_3$

Method B (reaction of H$_3$SiGeH$_3$ with BCl$_3$)

Gaseous BCl$_3$ (0.35 g, 3 mmol), and H$_3$SiGeH$_3$ (0.96 g, 9 mmol) were condensed into 150 mL stainless steel cylinder at −196° C. equipped with a high vacuum valve. The cylinder and its contents were held at 0° C. for eight hours after which time the contents were distilled through U-traps held at −78 and −196° C. The latter contained predominately B$_2$H$_6$ and a small amount of H$_3$SiGeH$_3$ as evidenced by IR spectroscopy. A liquid was condensed in the −78° C. and was analyzed by $^1$H NMR (300 MHz, toluene-d$_8$). The spectra showed a mixture of ClSiH$_2$GeH$_3$ [δ4.63 (q, 2H, S$_1$—H$_2$), δ 3.07 (t, 3H, Ge—H$_3$)], and Cl$_2$SiHGeH$_3$ [δ5.51 (q, H, Si—H), δ 3.20 (d, 3H, Ge—H$_3$)]. The integrated $^1$H NMR peak intensities of the Ge—H$_3$ resonances indicated a ~4:1 ratio of ClSiH$_2$GeH$_3$ to Cl$_2$SiHGeH$_3$. This reaction yielded 5.70 mmol of ClH$_2$SiGeH$_3$ and 1.48 mmol of HCl$_2$SiGeH$_3$ indicating a ~80% molar conversion with respect to the starting H$_3$SiGeH$_3$ material. Most of the remaining unreacted H$_3$SiGeH$_3$ was recovered in the −196° C. trap. Combinations of BCl$_3$ and H$_3$SiGeH$_3$ at −20° C. using identical stoichiometries and reaction conditions as described above yielded a 12:1 ratio of ClH$_2$SiGeH$_3$ to Cl$_2$HSiGeH$_3$, indicating that the single substitution if favored with lowering of the temperature.

Example 3

Reaction of 1:3 BCl$_3$/SiH$_2$(GeH$_3$)$_2$

Gaseous BCl$_3$ (0.12 g, 1.05 mmol), and SiH$_2$(GeH$_3$)$_2$ (0.57 g, 3.14 mmol) were condensed into a 50 mL round bottom flask. The flask and its contents were held at 0° C. for 2 h after which time, the volatiles were passed through U-traps held at −40, −60, and −196° C. The latter contained B$_2$H$_6$ (0.5 mmol, 100% yield) and a minor amount of starting material as evidenced by gas IR spectroscopy. The −60° C. trap contained pure 1 as a clear, colorless liquid. The −40° C. trap contained a mixture of 1 and 2 as evidenced by $^1$H NMR. The yields for 1 and 2 were found to be 0.38 mmol (36%) and 0.03 mmol (3%), respectively. ClHSi(GeH$_3$)$_2$: IR (gas, cm$^{-1}$): 2153 (m), 2088 (s), 2075 (s), 880 (s), 793 (s), 767 (vs), 697 (vs), 573 (w), 549 (w), 469 (w), 411 (vw). $^1$H NMR (500 MHz, C$_6$D$_6$): δ 5.07 (septet, H, J=3.5 Hz, SiH), 3.28 (d, 6H, J=3.5 Hz, Ge—H$_3$). $^{29}$Si (500 MHz, C$_6$D$_6$): δ −14.71. Mass Spectrum: m/z isotopic envelopes centered at 207 (M$^+$), 172 (SiGe$_2$H$_x^+$), 144 (Ge$_2$H$_x^+$), 141 (ClSiGeH$_x^+$), 101 (SiGeH$_x^+$), 73 (GeH$_x^+$), 63 ClSiH$_x^+$, 36 (Cl$^+$), 29 (SiH$_x^+$).

Example 4

Reaction of 2:3 BCl$_3$:SiH$_2$(GeH$_3$)$_2$

BCl$_3$ (0.23 g, 1.97 mmol), and SiH$_2$(GeH$_3$)$_2$ (0.53 g, 2.95 mmol) were condensed into a 50 mL round bottom flask. The flask and its contents were held at 0° C. for 1 h after which time, the volatiles were passed through traps held at −40, −78, and −196° C. The −196 trap contained pure B$_2$H$_6$ as evidenced by IR spectroscopy. The −78 trap contained pure 1 as evidenced by IR spectroscopy. The −40 trap contained a mixture of 1 and 2. Integration of the Ge—H peaks in the $^1$H NMR spectrum showed a 3:2 ratio of ClHSi(GeH$_3$)$_2$:Cl$_2$Si(GeH$_3$)$_2$. Overall, 0.62 mmol (21% yield) of 1 and 0.38 mmol (13% yield) of 2 were obtained.

Example 5

Reaction of 1:1 BCl$_3$:SiH$_2$(GeH$_3$)$_2$

BCl$_3$ (0.086 g, 0.74 mmol), and SiH$_2$(GeH$_3$)$_2$ (0.13 g, 0.74 mmol) were condensed into a 50 mL round bottom flask. The flask and its contents were held at 0° C. for 30 minutes after which time, the volatiles were passed through traps held at −40, −78, and −196° C. The latter contained B$_2$H$_6$ as evidenced by IR spectroscopy. The −78° C. trap contained pure 1 (0.007 mmol, 1% yield). The −40° C. trap contained pure 2 as a clear, colorless liquid (0.15 mmol, 20% yield). Cl$_2$Si(GeH$_3$)$_2$: Vapor pressure 7 torr (23° C.). IR (gas, cm$^{-1}$): 2088 (vs), 2077 (s), 880 (m), 796 (s), 767 (vs), 572 (w), 551-(w), 472 (w). $^1$H NMR (500 MHz, C$_6$D$_6$): δ3.42 (s, 6H, Ge—H$_3$). $^{29}$Si (500 MHz, C$_6$D$_6$): δ 30.22. Mass Spectrum: m/z isotopic envelopes centered at 246 (M$^+$), 208 (ClSiGe$_2$H$_x^+$), 178 (Cl$_2$SiGeH$_x^+$), 171 (SiGe$_2$H$_x^+$), 145 (Ge$_2$H$_x^+$), 141 (ClSiGeH$_x^+$), 128 (ClSiGeH$_x^+$), 103 (Cl$_2$SiH$_x^+$), 100 (SiGeH$_x^+$), 75 (GeH$_x^+$), 65 ClSiH$_x^+$, 36 (Cl$^+$), 29 (SiH$_x^+$).

Example 6

Synthesis of ClSi(GeH$_3$)$_3$

A 25 mL round bottom flask was charged with (GeH$_3$)$_3$SiH (0.46 g, 1.8 mmol) and BCl$_3$ (0.21 g, 1.8 mmol) was subsequently condensed into the flask. The flask and its contents were maintained at 0° C. for 10 mins, after which time the volatiles were passed through traps at temperatures of −78, and −196° C. The −196° C. trap contained B$_2$H$_6$ (0.9 mmol, 100% yield) as evidenced by IR spectroscopy. The −78° C. trap contained pure 3 as a clear, colorless liquid (0.36 mmol, 19% yield). ClSi(GeH$_3$)$_3$: Vapor pressure 2 torr (23° C.). IR (gas, cm$^{-1}$): 2082 (s), 2071 (s), 2065 (s), 787 (w), 770 (vs), 680 (vw), 551 (vw), 466 (w). $^1$H NMR (500 MHz, C$_6$D$_6$): δ 3.49 (s, 6H, Ge—H$_3$). $^{29}$Si(500 MHz, C$_6$D$_6$): δ −8.13.

Example 7

Reaction of 2:3 BCl$_3$:(SiH$_2$)$_2$(GeH$_3$)$_2$

A 25 mL round bottom flask was charged with (GeH$_3$)$_2$(SiH$_2$)$_2$ (0.20 g, 0.95 mmol) and BCl$_3$ (0.07 g, 0.63 mmol) was subsequently condensed into the flask. The flask and its contents were held at 0° C. for 1 h after which time, the volatiles were distilled through traps at −20, −50, and −196° C. The −196 trap contained B$_2$H$_6$ as evidenced by gas IR spectroscopy. The −50° C. trap contained ClHSiSiH$_2$(GeH$_3$)$_2$ and unreacted starting material, while the −20° C. retained pure H$_3$GeSiHClSiH$_2$GeH$_3$ as a clear, colorless liquid. ClHSiSiH$_2$(GeH$_3$)$_2$: Vapor pressure 1.5 torr (23° C.). IR (gas, cm$^{-1}$): 2152 (s), 2137 (s), 2076 (vs), 2072 (vs), 2065 (m), 916 (m), 880 (w), 801-(s), 744 (w), 686 (s), 654 (m), 539 (vw), 471 (vw), 439 (vw). $^1$H NMR (500 MHz, C$_6$D$_6$): δ 3.05 (t, 3H, Ge—H$_3$), δ 3.26 (d, 3H, Ge—H$_3$), δ 3.33 (pentet, 2H, Si—H$_2$), δ 5.02 (sextet, H, Si—H). $^{29}$Si(500 MHz, C$_6$D$_6$): δ −97.0 (Si—H$_2$), −15.0 (Si—HCl).

Example 8

Reaction of 1:1 BCl$_3$:(SiH$_2$)$_2$(GeH$_3$)$_2$

A 25 mL round bottom flask was charged with (SiH$_2$)$_2$(GeH$_3$)$_2$ (0.26 g, 1.3 mmol) and BCl$_3$ (0.15 g, 1.3 mmol) was subsequently condensed into the flask. The flask and its contents were held at 0° C. for 20 minutes after which time, the volatiles were distilled through traps at −15 and −196° C. The −196 trap contained B$_2$H$_6$ as evidenced by gas IR spectroscopy. The −15° C. trap contained a clear colorless liquid, with a vapor pressure of 0.5 torr which was characterized by IR and NMR to be a mixture between (ClHSi)$_2$(H$_3$Ge)$_2$ and Cl$_2$SiSiH$_2$(GeH$_3$)$_2$. (ClHSi)$_2$(H$_3$Ge)$_2$: $^1$H NMR (500 MHz, C$_6$D$_6$): δ 3.26 (d, 6H, Ge—H$_3$), δ 4.98 (pentet, H, Si—H). $^{29}$Si(500 MHz, C$_6$D$_6$): δ −17.0. Cl$_2$SiSiH$_2$(GeH$_3$)$_2$: $^1$H NMR (500 MHz, C$_6$D$_6$): δ 3.43 (s, 3H, Ge—H$_3$), δ 3.42 (q, 2H, Si—H$_2$), δ 3.07 (t, 3H, Ge—H$_3$). $^{29}$Si(500 MHz, C$_6$D$_6$): δ −88.7 (Si—H$_2$), 24.4 (Si—Cl$_2$).

Example 9

The compounds of Table 6 were prepared according to the methods of Example 2 using the noted ratio of BCl$_3$ to H$_3$SiGeH$_3$. All reactions carried out at 0° C. for 2 hours.

TABLE 6

| BCl$_3$:SiH$_3$GeH$_3$ | Observed products | Observed byproducts |
|---|---|---|
| 1:3 | ClSiH$_2$—GeH$_3$ | Cl$_2$SiH—GeH$_3$ |
| 2:3 | ClSiH$_2$—GeH$_3$, Cl$_2$SiH—GeH$_3$ | |
| 1:1 | Cl$_2$SiH—GeH$_3$ | ClSiH$_2$—GeClH$_2$, Cl$_2$SiH—GeClH$_2$ ClSiH$_2$—GeCl$_2$H, Cl$_2$SiH—GeCl$_2$H |

TABLE 6-continued

| BCl$_3$:SiH$_3$GeH$_3$ | Observed products | Observed byproducts |
|---|---|---|
| 2:1 | Cl$_2$SiH—GeClH$_2$, Cl$_2$SiH—GeCl$_2$H, ClSiH$_2$—GeCl$_2$H | ClSiH$_2$—GeClH$_2$, Cl$_2$SiH—GeH$_3$ |

$^1$H and $^{29}$Si NMR data (Table 7) for the chlorinated silyl germanes produced in Table 6 were determined by using $^{29}$Si HMQC (Heteronuclear Multiple-Quantum Coherence) and $^1$H COSY (Homonuclear Correlation Spectroscopy) according to methods know to those skilled in the art (see Feibolin, Basic One- and Two-Dimensional NMR Spectroscopy, 3$^{rd}$ Ed. Wiley-VCH: Weinheim, Germany, 1998).
The $^1$H NMR spectra showed the expected multiplicity in various SiH$_x$ and GeH$_x$ peaks and $^{29}$Si satellite peaks which exhibit $^1J_{Si-H}$ and $^2J_{Si-H}$ coupling constants with nominal values of 200-300 Hz and 20-50 Hz, respectively. These techniques in combination with the coupling constants are particularly useful because they unambiguously establish the connectivities of the various H and Cl atoms to the Si—Ge molecular core for each compound in the various product mixtures.

Table 7 lists the $^1$H and $^{29}$Si chemical shifts derived from our measurements for all chlorinated the products including the previously discussed (1) and (2) as well as the SiH$_3$GeH$_3$ reactant. We note the following trends in these data: (a) For a fixed number of Cl atoms on the Si site, increasing the number of Cl atoms on Ge site enhances the shielding of the SiH$_x$ protons resulting in a systematic upheld shift of the latter. For example in the sequence Cl$_2$SiHGeH$_3$, Cl$_2$SiHGeH$_2$Cl and Cl$_2$SiHGeHCl$_2$, the Si—H shifts are 5.57, 5.35 and 5.15 ppm, respectively (steps of ~0.2 ppm). Similarly for ClSiH$_2$GeH$_3$, ClSiH$_2$GeH$_2$Cl and ClSiH$_2$GeHCl$_2$ the SiH$_2$ shifts are 4.68, 4.54 and 4.38 ppm respectively (steps of ~0.1 ppm). (b) By contrast, the GeH$_x$ shifts are independent of the number of Cl on the Si site and simply scale down field in proportion to the number of Cl atoms on Ge site (δGeH$_x$: ~3.2 ppm for "—GeH$_3$", 4.8 ppm for "—GeH$_2$Cl" and 6.0 ppm for "—GeHCl$_2$" roughly independent of the number of Cl attached to Si). (c) The trends in the $^{29}$Si shifts are more subtle, and our study finds that for a fixed number of Cl on the Si site slight down field shifts are associated with increasing Cl on the Ge site (for "ClH$_2$Si-" molecules, δSi are −24.6, −24.3, −22.9 for 0, 1 and 2 Cl on the Ge site, respectively). (d) Furthermore this effect becomes more pronounced as the number of Cl on the Si site is increased (for "Cl$_2$HSi-" molecules, δSi are 9.8, 3.4, −1.1 for 0, 1 and 2 Cl on the Ge site, respectively). This suggests that chlorines bonded to Ge systematically shield the Si nuclei as the number of Cl atoms is increased.

TABLE 7

| Compound | $^1$H, δ | | $^{29}$Si, δ |
|---|---|---|---|
| H$_3$SiGeH$_3$[b] | 3.52 (q, SiH$_3$) | 3.18 (q, GeH$_3$) | −91.60 |
| ClGeH$_2$SiH$_3$ | 3.25 (t, SiH$_3$) | 4.86 (q, GeH$_2$) | |
| ClSiH$_2$GeH$_3$ | 4.68 (q, SiH$_2$) | 3.12 (t, GeH$_3$) | −24.61 |
| ClSiH$_2$GeH$_2$Cl | 4.47 (t, SiH$_2$) | 4.80 (t, GeH$_2$) | |
| ClSiH$_2$GeHCl$_2$ | 4.38 (t, SiH$_2$) | 6.12 (t, GeH$_2$) | −22.87 |
| Cl$_2$SiHGeH$_3$ | 5.57 (q, SiH) | 3.25 (d, GeH$_3$) | 9.77 |
| Cl$_2$SiHGeH$_2$Cl | 5.35 (t, SiH) | 4.82 (d, GeH$_2$) | 3.36 |
| Cl$_2$SiHGeHCl$_2$ | 5.15 (d, SiH) | 5.97 (d, GeH) | −1.12 |

[b]C$_7$D$_8$ solution
C$_6$D$_6$ used as a solvent, and all values referenced to TMS Example 10

Deposition of Si—Ge Films on Silicon Substrates

Figure 6:
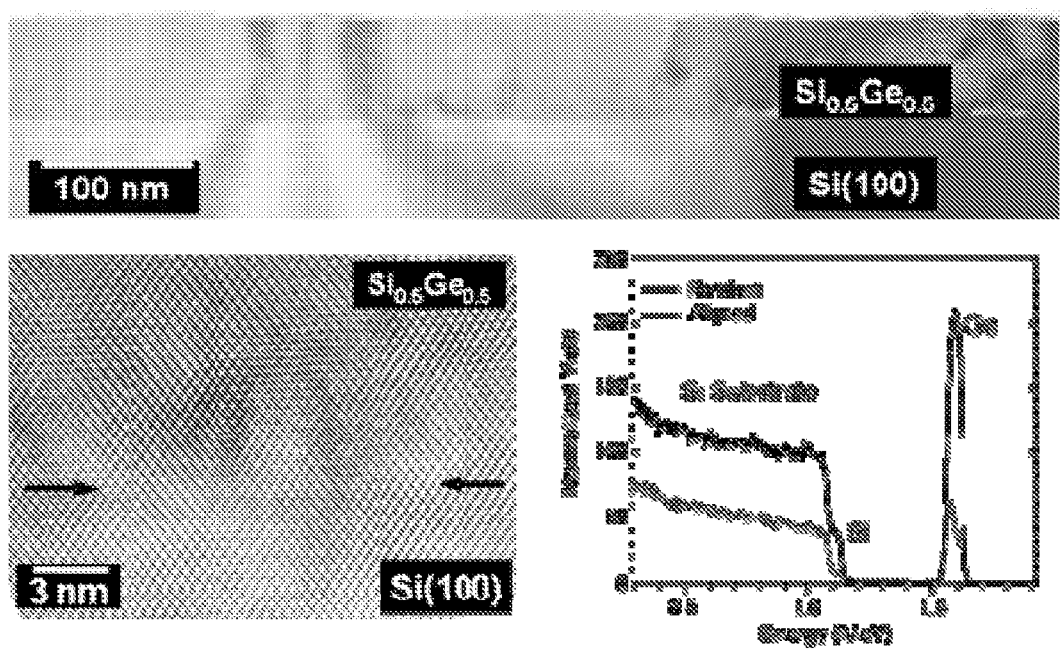
FIG. 6 shows (top) a bright field micrograph of a $Si_{0.50}Ge_{0.50}$ film grown via decomposition of $ClH_2SiGeH_3$ at 400° C.; (bottom left) a high resolution image of the Si/SiGe interface in <110> projection, showing a commensurate, defect-free interface; and (bottom right) a RBS random and channeled spectra indicate a $Si_{0.50}Ge_{0.50}$ composition and high degree epitaxial alignment, respectively.

Growth experiments were conducted to investigate the applicability of ClH$_2$SiGeH$_3$ to form semiconductor alloys at low temperatures. The chemical vapor (1) was reacted on the clean Si surface to form films via desorption of HCl and H$_2$ byproducts. The precursor partial pressure and reaction temperature were typically in the range of 10$^{-5}$-10$^{-6}$ Torr and 350° C.-450° C., respectively. The film composition was determined by Rutherford backscattering (RBS) to be $Si_{0.50}Ge_{0.50}$ reflecting precisely the Si/Ge ratio of the $ClH_2Si$—$GeH_3$ precursor. The heteroepitaxial character of the synthesized films was initially investigated by random and channeling RBS, which indicates that the material is perfectly aligned with the substrate. FIG. 6 shows that the ratio of the aligned versus the random peak heights ($\chi_{min}$), which measures the degree of crystallinity, decreases from 25% at the interface to 10% at the surface. This indicates a typical defect "pile up" near the interface while the upper portion of the film is relatively defect free. The film crystallinity was thoroughly investigated by high resolution cross sectional electron microscopy (XTEM) which revealed commensurate SiGe/Si interfaces and perfectly monocrystalline epilayer microstructure (see FIG. 6). The TEM samples showed very few defects penetrating through the layer which is consistent with the RBS channeling observation. X-ray diffraction (XRD) revealed highly aligned layers with mosaics spreads as low as degrees strained. The layers were slightly strained as grown, and a nominal XRD relaxation of 75% was observed for a film thickness ~80 nm. Atomic force microscopy (AFM) studies show that films with thickness of 80-100 nm display RMS values of 0.7 and 1.1 nm, respectively, for $10 \times 10$ $\mu m^2$ areas, indicating highly planar surfaces. No "cross hatched" surface patterns caused by misfit dislocations produced during strain relaxation were observed even for films annealed up to 700° C. In fact, the surface roughness either remained the same or improved slightly with annealing indicating that the sample planarity is thermally robust.

Example 11

Deposition of Si—Ge Films on Silicon Substrates

The deposition of $Cl_2HSiGeH_3$ was conducted at 450° C. ($10^{-5}$ Torr) and produced films with thickness ranging from 10-80 nm at growth rates approaching 1 nm which is slightly higher than that obtained from the deposition of $ClH_2SiGeH_3$. For films exceeding 10-20 nm in thickness a quantitative analysis based on RBS showed that the Si content can be as low as 43%. For thinner samples (<10 nm) the film composition was derived from high-resolution XRD data because the Si content was difficult to extract from the substrate background using RBS. For thicker samples we observed a systematic reduction from the expected (ideal) 50% stoichiometry when the deposition pressure is reduced from $5 \times 10^5$ to from $1 \times 10^5$ Torr. Silicon depletion is likely enhanced under the lower pressure conditions due to facile surface desorption of multi-chlorinated Si species, such as stable $SiH_2Cl_2$ decomposition byproducts. The crystallographic alignment and surface morphology of these films were found to be of comparable quality to those obtained from depositions of $ClH_2SiGeH_3$. Nevertheless, their XTEM characterizations showed lower threading dislocation densities of the layers, and superior microstructural quality of the interface regions. This includes flawless epitaxial registry and atomically abrupt transitions between the film and the substrate, consistent with the absence of elemental intermixing between the two materials at the low growth temperatures.

The strain state properties of the films were extensively characterized using HR-XRD. Two representative samples with layer thicknesses of ~10 nm and 60 nm are discussed further. Precise in-plane and perpendicular lattice constants were determined by high resolution (224) and (004) on and off axis reciprocal space maps of the entire structure.

Figure 7:
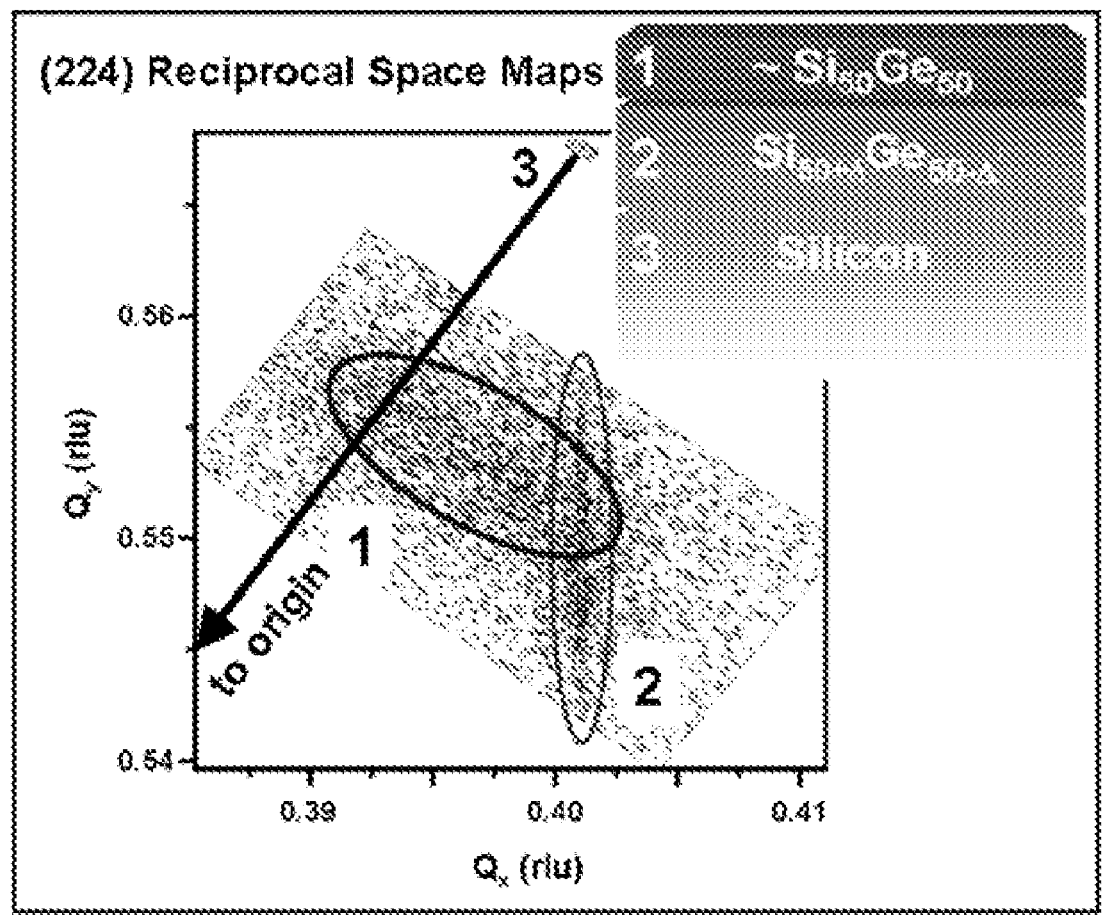
FIG. 7 is a (224) reciprocal space maps of the 10 nm thick sample and the Si substrate, showing peaks [1] and [2] for the two layer structure.

In the case of the thinner sample the XRD data revealed that the growth produces two discernible layers in which the initial layer adjacent to the interface is fully strained to the Si substrate ($a_\parallel = a_{Si} = 5.4309$ and $a_\perp = 5.5991$ Å) and has a thickness of is 5-7 nm (see FIG. 7). Note that in FIG. 7, [2] (corresponding to the layer adjacent to the interface as shown in the schematic inset) falls directly below the Si (224) peak indicating perfect lattice matching within the interface plane. Its elongation is due to the small thickness of the layer. A more diffuse peak [1] is also clearly visible and corresponds to the upper portion of the film. Note that peak [1] lies below the relaxation line connecting the Si peak to the origin, indicating partial relaxation (~50%).

Using elementary elastic strain relations ($\in_\perp = -2C_{12}/C_{11}\in_\parallel$ where $C_{11}$ and $C_{12}$ are bulk SiGe elastic constants, and $\in_\perp$ and $\in_\parallel$ are the perpendicular and parallel strains), the known bowing behavior of bulk Si—Ge alloys, and the structural data above, the composition of the initial alloy layer was determine to be 45%±2 Ge and 55%±2 Si. The XRD data also showed a diffuse, high mosaicity peak (peak [1] in FIG. 7) indicating that the upper portion of the film (grown following the initial layer) is 50% relaxed and has lattice constants $a_\parallel = 5.4845$ Å and $a_\perp = 5.5654$ Å corresponding to a composition of ~47±2% Ge and 53±2% Si. This indicates that this upper layer possesses stoichiometries closer to the expected 50/50 value in accordance with precursor Si—Ge content. In this diffusion limited low temperature growth process the tendency to strain-match with Si can only be achieved by incorporation of excess Si at the interface layer. Beyond a certain critical thickness, (~50-60 Å under these conditions) the strain is gradually relieved without any measurable defect formation, enabling the full stoichiometry of the precursors to be incorporated.

Figure 8:
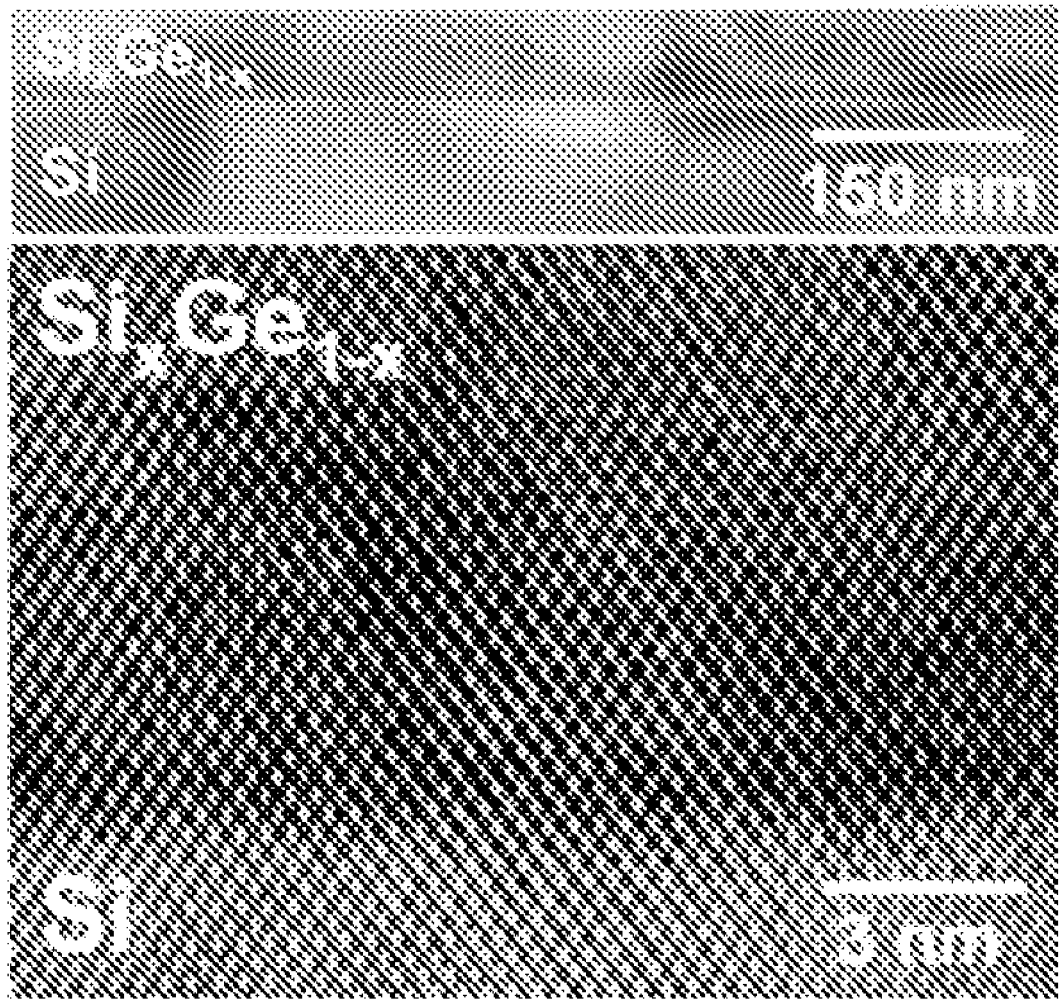
FIG. 8 shows an (Top) XTEM micrograph of the entire film thickness showing flat surface and bulk region devoid of defects; and (Bottom) a high resolution micrograph of the interface region showing perfect pseudomorphic growth.

In the case of the 60 nm thick film we observe that the growth also produces the same initial fully strained layer (~10 nm thick) adjacent to the interface, followed by a transition to a partially strained bulk film whose Si content approaches nominal target values. FIG. 8 shows an XTEM micrograph of the entire film thickness in (100) projection. Note that the film surface is atomically flat and the bulk material is devoid of threading defects within a wide field of view (typically 2 μm). The high resolution image of the interface region shows perfect commensuration and no indication of misfit dislocations in spite of the large mismatch. This observation is consistent with full pseudomorphic growth as determined by XRD. The lack of defects can be explained by our observation of an inherent compositional gradient which accommodates the strain throughout the film. These mechanisms are unique to the low temperature growth protocol afforded by the specifically designed precursor chemistry employed in this study.

Example 12

Selective Growth of $Si_dGe_{1-d}$ Films

Next we pursued preliminary growth studies of $Si_dGe_{1-d}$ alloys using the newly prepared chlorinated compounds to evaluate their selective-area growth potential in prototype microelectronic devices. The experiments utilized test wafers containing an array of device structures including simple transistors and various patterns masked by amorphous nitride and oxide thin layers. The depositions were conducted using gas source molecular beam epitaxy (GSMBE) at ~$5 \times 10^{-5}$ Torr and 400-450° C., via direct insertion of the compound vapor pressure into the chamber at base pressure of $10^{-10}$ Torr. The film growth targeted the formation of Ge-rich compositions in the range of ~65-75% which have applications in IR optolectronics such as photodetectors and modulators. The "as deposited" samples were examined by optical microscopy which indicated that the color of the nitride/oxide masked regions on the surface of the wafer had remained unchanged while the color of the pure Si regions had turned from metallic grey to light brown. The latter is characteristic of high Ge content $Si_dGe_{1-d}$ suggesting that selective deposition had potentially occurred. Additional characterizations of the wafers were performed by cross sectional electron microscopy (XTEM), Raman scattering, Rutherford backscattering (RBS) and atomic force microscopy (AFM) and the data collectively revealed the presence of atomically flat Si—Ge films with single crystalline microstructures throughout the samples. The film nominal thickness was estimated by the random RBS and confirmed by XTEM to be in the 50 nm range spanning the full height of the drain/source (S/D) recess region. Average growth rates up to ~7 nm per minute were obtained in these experiments. XTEM micrographs of all samples clearly demonstrated that the Si—Ge films deposited selectively and conformably on typical device structures filling the drain/source recess regions (S/D).

Figure 9:
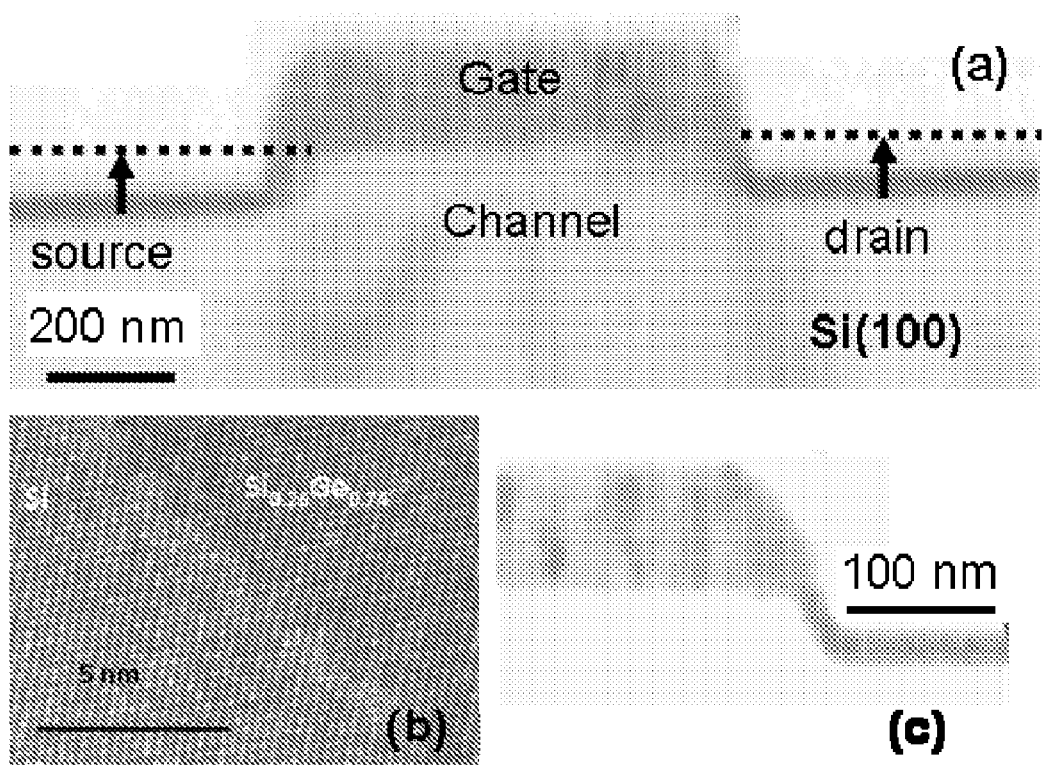
FIG. 9 shows (a) an XTEM micrograph of SiGe film (dark narrow band) grown selectively in the recessed "source" and "drain" areas of a device via deposition of $Cl_2Si(GeH_3)_2$ at 420° C. The arrow indicates the height of the recess extending from the bottom of the trench up to the gate/channel interface (dotted line); (b) a high resolution image of the Si channel/$Si_{0.26}Ge_{0.74}$ interface indicating commensurate growth between the two materials; and (c) an enlarged view of the latter heterojunction showing that the SiGe film thickness is essentially uniform in both the sidewall and the horizontal regions.

FIG. 9 shows a diffraction contrast image of a single transistor in which a 20 nm thick $Si_{0.26}Ge_{0.74}$ layer is grown selectively in the S/D regions via decomposition of $Cl_2Si(GeH_3)_2$ at 420° C. The film thickness in this case is uniform throughout, however, note that it is significantly less than the 50 nm height of the entire recess. The latter is indicated by the length of the arrow extending from the trench bottom up to the gate/channel interface (dotted line) in FIG. 7. Here the deposition process was intentionally interrupted to determine the relative growth rate of the material on the horizontal Si(100) trench bottom versus the slanted Si(111) sidewall surface. As can be seen from bottom right hand micrograph shown in FIG. 9 the thickness is uniform indicating that the growth likely occurred simultaneously, at the same rate, throughout the entire surface (sidewall and bottom) of the trench. Note in particular, that no discernible growth occurred on the nitride spacers or on the masked polysilicon gate hardmask features of the structure, as expected in the case of highly selective growth behavior. The diffraction data in general reveal fully conformal and continuous layers regardless of the crystallographic orientation at the growth surface on the device platform. Furthermore atomic resolution XTEM images revealed that the film is pseudomorphic to the Si substrate and atomically flat. AFM scans show a typical roughness of 0.5 nm which is consistent with a layer-by-layer growth mode.

Micro Raman spectroscopy was used to study the selectivity of growth and determine the Si—Ge composition throughout the wafer surface at a spatial resolution of ~1 µm. The spectra of all samples obtained from the nitride/oxide covered features showed only a single peak corresponding to the Si—Si vibrations of the underlying substrate, indicating that no discernable Si—Ge growth had occurred in these areas in agreement with the XTEM observations. The Raman spectra obtained from the unprotected Si regions, however, showed three additional peaks corresponding to the characteristic Si—Si, Si—Ge and Ge—Ge alloy vibrations, indicating significant growth of crystalline $Si_dGe_{1-d}$ films with composition of $Si_{0.26}Ge_{0.74}$. It is important to note that the Raman composition was obtained as an average from a large number of measurements of individual device features throughout the entire wafer, and closely matched the bulk film composition obtained from RBS. The RBS/Raman results collectively suggest that precise compositional control can be achieved by selective area deposition of our compounds. These afford low temperature depositions that produce controllable and fairly homogeneous alloys within and among individual device architectures. This level of uniformity is critically important for achieving reliable, reproducible and cost effective device fabrication and performance. In addition the use of single sources simplifies significantly the integration scheme by circumventing complex multi-component reactions and corrosive $Cl_2$ etchants which are necessary to promote selective deposition in conventional processes.

Figure 10:
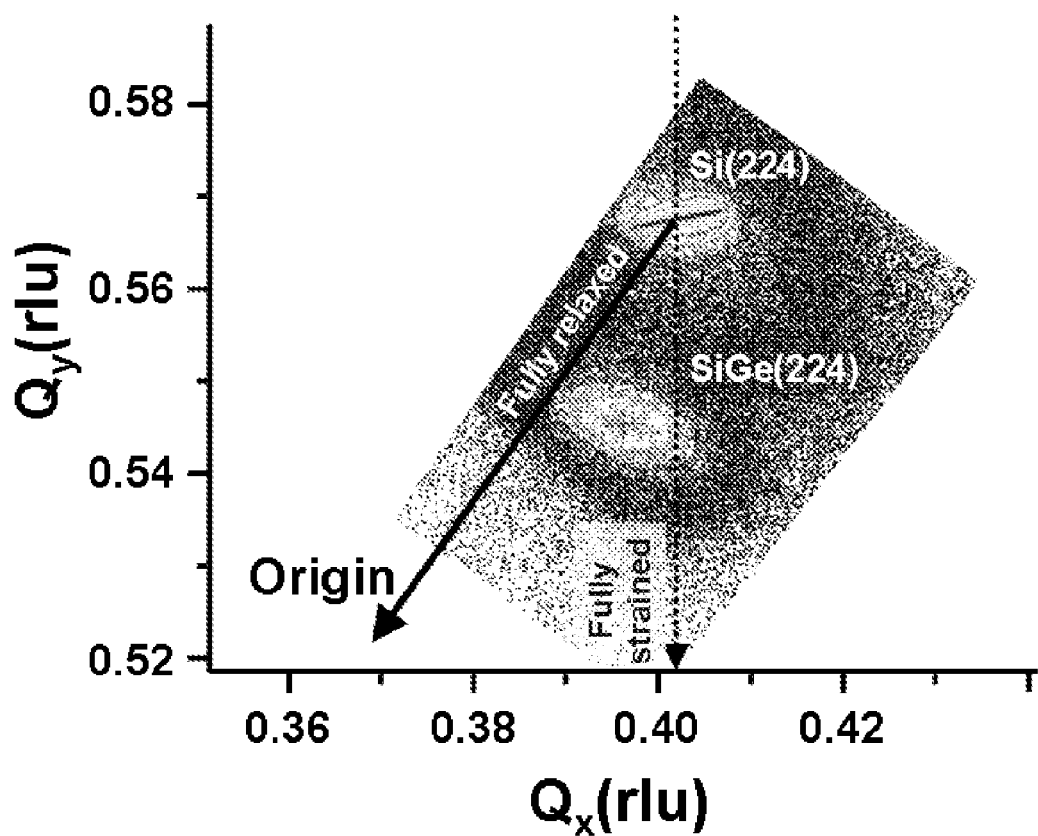
FIG. 10 is a high-resolution XRD 2-D reciprocal space map of the (224) reflection of $Si_{0.33}Ge_{0.67}$ in reciprocal lattice units (rlu) relative to the Si peak.

In addition to selective deposition experiments we also explore the possibility of achieving highly strained states in our deposited films. FIG. 10 show a reciprocal space map (RSM) of a ~40 nm thick $Si_{0.33}Ge_{0.67}$ layer grown by deposition of $ClHSi(GeH_3)_2$. The composition of the film as measured by RBS closely matches that of the corresponding precursor indicating that the entire $SiGe_2$ core is being incorporated into the material. The in plane and vertical lattice parameters were determine to be 5.4986 Å and 5.6530 Å, respectively. Using these values and standard elasticity theory we obtain an unprecedented compressive strain of 1.6%. Note that this value is significantly higher than the 1.2% strains that are possible from state of the art film containing 30% Ge. The RSM plot in FIG. 10 reveals that our film is ~40% relaxed suggesting that it may be possible to realize fully strained films beyond the current proof of principle state reported here by optimizing deposition conditions such as the growth rate and temperature.

All of the U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims. This invention also encompasses all combinations of alternative aspects of the invention noted herein. It is understood that any and all embodiments of the present invention may be taken in conjunction with any other embodiment to describe additional embodiments of the present invention. Furthermore, any elements of an embodiment may be combined with any and all other elements from any of the embodiments to describe additional embodiments.

We claim:

1. A method for the preparation of compounds of the formula (I),

$$Si_xGe_yH_{z-a}X_a \qquad (I)$$

wherein x is 1, 2, 3, or 4; y is 1, 2, 3, or 4; z is 2(x+y+1); a is 1 to z; and X is halogen, provided that the sum of x and y is less than or equal to 5, comprising the step of, (i) treating a compound of the molecular formula, $Si_xGe_yH_z$, with a compound of the formula $BX_3$, $AlX_3$, or a metal chlorinating agent, at a temperature of about −80° C. to about 25° C.

2. The method of claim 1, wherein a is 1 to 2(x+y).

3. The method of claim 2, wherein a is 1.

4. The method of claim 2, for the preparation of compounds of the formula, $SiGe_yH_{z-a}X_a$.

5. The method of claim 4, for the preparation of compounds of the formula, $SiGe_yH_{z-a}Cl_a$.

6. The method of claim 5, for the preparation of compounds of the formula, $SiGeH_{6-a}Cl_a$.

7. The method of claim 1, wherein the compound of formula (I) is chloro(germyl)silane;
dichloro(germyl)silane;
chloro(digermyl)silane;
dichloro(digermyl)silane;
chloro(trigermyl)silane;
1,2-digermyl-1-chlorodisilane;
1,2-digermyl-1,2-dichlorodisilane;
1,2-digermyl-1,1-dichlorodisilane;
chloro(chlorogermyl)silane;
dichloro(chlorogermyl)silane;
chloro(dichlorogermyl)silane; or
dichloro(dichlorogermyl)silane.

8. The method of claim 1, further comprising the step of (ii) fractionally distilling the product of step (i).

9. A substantially pure compound prepared according to the method of claim 8.

10. The substantially pure compound of claim 9 which is chloro(germyl)silane or dichloro(germyl)silane.

11. The method of claim 1, wherein the reaction temperature is about −25° C. to about 5° C.

12. The method of claim 1, wherein compound of the formula $BX_3$ is $BCl_3$.

13. A method for the preparation of compounds of the formula, $$Si_xGe_yH_{z-1}X$$

wherein x is 1, 2, 3, or 4; y is 1, 2, 3, or 4; z is 2(x+y+1); a is 1 to 3×; and X is halogen, provided that (i) X is bonded only to Si; and (ii) the sum of x and y is less than or equal to 5, comprising the steps of,
(i) contacting a compound of the formula, $$Si_xGe_yH_{z-1}Y$$

wherein Y is —$OSO_2R^1$, wherein $R^1$ is $C_1$-$C_6$ haloalkyl, $C_1$-$C_6$ alkyl, or phenyl, wherein the alkyl and phenyl are optionally substituted with 1 to 4 groups which are each independently halogen, $C_1$-$C_2$ haloalkyl, $C_1$-$C_3$ alkyl, cyano, nitro, $C_1$-$C_3$ alkoxy, —C(O)$C_1$-$C_3$ alkoxy, —C(O)$C_1$-$C_3$ alkyl, —S(O)$C_1$-$C_3$ alkyl, or —S(O)$_2C_1$-$C_3$ alkyl; provided that Y is bonded only to Si; with a compound of the formula CsX at a temperature of about −50° C. to about 40° C.

14. The method according to claim 13, for the preparation of compounds of the formula, $SiGe_yH_{z-1}X$.

15. The method according to claim 14, for the preparation of compounds of the formula, $SiGe_yH_{z-1}Cl$.

16. The method according to claim 15, for the preparation of the compound of the formula, $ClH_2SiGeH_3$.

17. The method according to claim 13, wherein $R^1$ is $C_1$-$C_4$ haloalkyl, $C_1$-$C_4$ alkyl, or phenyl, wherein phenyl are optionally substituted with halogen, $C_1$-$C_2$ haloalkyl, or $C_1$-$C_3$ alkyl.

18. The method of claim 13, wherein the reaction temperature is about −25° C. to about 25° C.

19. The method of claim 13, further comprising the step of (ii) fractionally distilling the product of step (i).

20. A method for preparing a layer of the formula, $Si_dGe_{1-d}$, on a substrate, comprising
contacting the substrate with a chemical vapor comprising a compound of the formula, $$Si_xGe_yH_{z-a}X_a$$

wherein x is 1, 2, 3, or 4; y is 1, 2, 3, or 4; z is 2(x+y+1); a is 1 to z; and X is halogen, provided that the sum of x and y is less than or equal to 5, at a temperature and a pressure sufficient for depositing a $Si_dGe_{1-d}$ layer over the substrate, wherein d is greater than 0 and less than 1.

21. The method according to claim 20, wherein the chemical vapor comprises a compound of the formula, $SiGe_yH_{z-a}X_a$.

22. The method according to claim 21, wherein the chemical vapor comprises a compound of the formula $SiGe_yH_{z-a}Cl_a$.

23. The method according to claim 22, wherein the chemical vapor comprises a compound of the formula $SiGeH_{6-a}Cl_a$.

24. The method according to claim 20, wherein the chemical vapor comprises a compound which is chloro(germyl)silane;
dichloro(germyl)silane;
chloro(digermyl)silane;
dichloro(digermyl)silane;
chloro(trigermyl)silane;
1,2-digermyl-1-chlorodisilane;
1,2-digermyl-1,2-dichlorodisilane;
1,2-digermyl-1,1-dichlorodisilane;
chloro(chlorogermyl)silane;
dichloro(chlorogermyl)silane;
chloro(dichlorogermyl)silane;
dichloro(dichlorogermyl)silane;
or mixtures thereof.

25. The method of claim 20, wherein the temperature is about, 200° C. to about 600° C.

26. The method claim 25, wherein the temperature is about, 350° C. to about 450° C.

27. The method of claim 20, wherein the layer is substantially crystalline.

28. The method of claim 27, wherein the temperature is about 200° C. to about 600° C.

29. The method claim 28, wherein the temperature is about 350° C. to about 450° C.

30. The method of claim 28, wherein the pressure is about $10^{-3}$ Torr and 760 Torr.

31. The method of claim 20, wherein the substrate comprises silicon.

32. The method of claim 20, wherein the deposited layer has an empirical formula of $Si_xGe_y$.

33. The method of claim 20, wherein the pressure is about $10^{-8}$ Torr and 760 Torr.

34. The method of claim 20, wherein the $Si_dGe_{1-d}$ layer is fully strained.

35. The method of claim 20, wherein the layer is formed by plasma-enhanced chemical vapor deposition.

36. A method for the selective deposition of a $Si_dGe_{1-d}$ layer comprising contacting a substrate having a surface layer comprising at least two portions, wherein a first portion of the surface layer comprises a semiconductor surface layer and a second portion of the surface layer comprises an oxide, nitride, or oxynitride surface layer, with a chemical vapor comprising a compound of the molecular formula, $$Si_xGe_yH_{z-a}X_a$$

wherein x is 1, 2, 3, or 4; y is 1, 2, 3, or 4; z is 2(x+y+1); a is 1 to z; and X is halogen, provided that the sum of x and y is less than or equal to 5, under conditions sufficient to selectively deposit a $Si_dGe_{1-d}$ layer, having a predetermined thickness and at a predetermined rate, over only the first portion of the surface, wherein d is greater than 0 and less than 1.

37. The method of claim 36, wherein the $Si_dGe_{1-d}$ layer is deposited by gas source molecular beam epitaxy or chemical vapor deposition.

38. The method of claim 36, wherein the chemical vapor is introduced in substantially pure form.

39. The method of claim 36, wherein the chemical vapor is introduced as a single gas source.

40. The method of claim 36, wherein the chemical vapor is introduced intermixed with an inert carrier gas.

41. The method of claim 40, wherein the inert carrier gas comprises $H_2$.

42. The method of claim 40, wherein the inert carrier gas comprises $N_2$.

43. The method of claim 36, wherein the contacting takes place at about 300-500° C.

44. The method of claim 36, wherein the contacting takes place at about $1\times10^{-8}$-1000 torr.

45. The method of claim 36, wherein the predetermined rate is greater than about 2.0 nm/min.

46. The method of claim 45, wherein the predetermined rate is about 2.0-10.0 nm/min.

47. The method of claim 36, wherein the predetermined thickness is about 25-300 nm.

48. The method of claim 36, wherein the compound is of the formula, $SiGe_yH_{z-a}X_a$.

49. The method of claim 48, wherein the compound is of the formula, $SiGe_yH_{z-a}X_a$.

50. The method of claim 49, wherein the compound is $SiGe_yH_{z-a}X_a$.

51. The method of claim 49, wherein the compound is $SiGe_yH_{z-a}Cl_a$.

52. The method of claim 36, wherein the compound is chloro(germyl)silane;
dichloro(germyl)silane;
chloro(digermyl)silane;
dichloro(digermyl)silane;
chloro(trigermyl)silane;
1,2-digermyl-1-chlorodisilane;
1,2-digermyl-1,2-dichlorodisilane;
1,2-digermyl-1,1-dichlorodisilane;
chloro(chlorogermyl)silane;
dichloro(chlorogermyl)silane;
chloro(dichlorogermyl)silane;
dichloro(dichlorogermyl)silane;
or mixtures thereof.

53. The method of claim 36, wherein y is 2 and z is 2 or 3.

54. The method of claim 36, wherein the $Si_dGe_{1-d}$ layer is compressively strained.

55. The method of claim 54, wherein the $Si_dGe_{1-d}$ layer is fully strained.

56. The method of claim 36, wherein the first portion comprises Si(100) or Si(111).

57. The method of claim 36, wherein the second portion comprises silicon oxide, silicon nitride, silicon oxynitride, or mixtures thereof.

58. The method of claim 36, wherein d is about 0.05-0.55.

59. The method of claim 36, wherein d is about 0.45-0.55.

60. The method of claim 36, wherein d is about 0.20-0.30.

61. The method of claim 36, wherein the surface of the $Si_dGe_{1-d}$ layer is atomically flat.

62. The method of claim 36, wherein the surface layer comprises one or a plurality of transistor architectures, each comprising a gate region, a source region, and a drain region, wherein the first portion of the surface layer comprises the source regions and the drain regions and the second portion of the surface layer comprises the gate region.

63. The method of claim 62, wherein the gate regions comprise a polysilicon gate having an oxide, nitride, or oxynitride hardmask.

64. A compound according to the formula, $Si_xGe_yH_{z-a}X_a$ wherein x is 1, 2, 3, or 4; y is 1, 2, 3, or 4; z is 2(x+y+1); a is 1 to 2(x+y), and X is halogen, provided that (i) the sum of x and y is less than or equal to 5; (ii) each Si and Ge atom has no more than two X groups bonded thereto; and (iii) the compound is not bromo(germyl)silane;
difluoro(germyl)silane;
1,1,2,2,3,3-hexafluoro-(1-germyl)trisilane;
(difluorogermyl)difluorosilane;
dichloro(germyl)silane;
1,1,2,2-tetrafluoro-(1-germyl)disilane;
fluoro(fluorogermyl)silane;
fluoro(germyl)silane;
1,1-dichloro-(3-germyl)trisilane;
1,1-dichloro-(4-germyl)tetrasilane; and
1,1-dichloro-(2-germyl)disilane.

65. The compound of claim 64, of the formula $SiGe_yH_{z-a}X_a$.

66. The compound of claim 65, of the formula $SiGe_yH_{z-a}Cl_a$.

67. The compound of claim 66, of the formula $SiGeH_{6-a}Cl_a$.

68. The compound of claim 64, of the formula $Si_xGeH_{z-a}X_a$.

69. The compound of claim 68, of the formula $Si_xGeH_{z-a}Cl_a$.

70. The compound of claim 64, wherein a is 1.

71. The compound of claim 64, wherein a is 2(x+y).

72. The compound of claim 64, which is, chloro(germyl)silane;
chloro(digermyl)silane;
dichloro(digermyl)silane;
chloro(trigermyl)silane;
1,2-digermyl-1-chlorodisilane;
1,2-digermyl-1,2-dichlorodisilane;
1,2-digermyl-1,1-dichlorodisilane;
chloro(chlorogermyl)silane;
dichloro(chlorogermyl)silane;
chloro(dichlorogermyl)silane; or
dichloro(dichlorogermyl)silane.

73. A substantially pure compound according to the formula, $SiGe_yH_{z-a}Cl_a$ wherein y is 1, 2, 3, or 4; z is 2(y+2); and a is 1 to 3, provided that each Cl is bonded only to Si.

74. The substantially pure compound of claim 73, wherein a is 1.

75. The substantially pure compound of claim 73, wherein a is 2.

76. The substantially mire compound of claim 73 which is chloro(germyl)silane;
dichloro(germyl)silane;
chloro(digermyl)silane;
dichloro(digermyl)silane; or
chloro(trigermyl)silane.

* * * * *